United States Patent
Shimanuki

(10) Patent No.: US 7,518,250 B2
(45) Date of Patent: Apr. 14, 2009

(54) SEMICONDUCTOR DEVICE AND A METHOD FOR MANUFACTURING OF THE SAME

(75) Inventor: Yoshihiko Shimanuki, Nanyo (JP)

(73) Assignee: Renesas Technology Corp., Tokyo (JP)

( * ) Notice: Subject to any disclaimer, the term of this patent is extended or adjusted under 35 U.S.C. 154(b) by 0 days.

(21) Appl. No.: 11/260,084

(22) Filed: Oct. 28, 2005

(65) Prior Publication Data

US 2006/0091523 A1    May 4, 2006

(30) Foreign Application Priority Data

Oct. 29, 2004    (JP)    ............... 2004-315998

(51) Int. Cl.
*H01L 23/48*    (2006.01)

(52) U.S. Cl. .............. 257/784; 257/E23.022; 257/E23.037

(58) Field of Classification Search ........ 257/689, 257/784, E23.003, E23.022, E23.037, 701, 257/787

See application file for complete search history.

(56) References Cited

U.S. PATENT DOCUMENTS

| | | | | |
|---|---|---|---|---|
| 4,401,775 A | * | 8/1983 | Pampalone et al. | 523/403 |
| 5,497,031 A | * | 3/1996 | Kozono | 257/700 |
| 2002/0137327 A1 | * | 9/2002 | Arakawa | 438/617 |
| 2002/0140112 A1 | * | 10/2002 | Pon | 257/786 |
| 2002/0149102 A1 | * | 10/2002 | Hashemi et al. | 257/706 |
| 2002/0190377 A1 | * | 12/2002 | Igarashi et al. | 257/738 |
| 2003/0107138 A1 | * | 6/2003 | Tian et al. | 257/787 |
| 2003/0157334 A1 | * | 8/2003 | Woods et al. | 428/413 |
| 2004/0080054 A1 | * | 4/2004 | Chindra et al. | 257/781 |
| 2004/0164410 A1 | * | 8/2004 | Tian et al. | 257/734 |
| 2005/0194698 A1 | * | 9/2005 | Shim et al. | 257/784 |
| 2006/0040417 A1 | * | 2/2006 | Eldridge et al. | 438/14 |

FOREIGN PATENT DOCUMENTS

JP    2003-92374    3/2003

* cited by examiner

*Primary Examiner*—Sue A Purvis
*Assistant Examiner*—Krista Soderholm
(74) *Attorney, Agent, or Firm*—Antonelli, Terry, Stout & Kraus, LLP.

(57) ABSTRACT

A first solder resist section and a second solder resist section are formed over an upper surface of a wiring board. A semiconductor chip is bonded onto the first solder resist section via an adhesive interposed therebetween. Electrodes of the semiconductor chip are respectively electrically connected to connecting terminals exposed through openings of the second solder resist section via bonding wires. An encapsulating resin is formed over the upper surface of the wiring board so as to cover the semiconductor chip and the bonding wires. A plane dimension of the first solder resist section is smaller than that of the semiconductor chip, and the encapsulating resin is filled even below an outer peripheral portion of a back surface of the semiconductor chip.

9 Claims, 37 Drawing Sheets

SEMICONDUCTOR DEVICE AND A METHOD FOR MANUFACTURING OF THE SAME

CROSS-REFERENCE TO RELATED APPLICATION

The present application claims priority from Japanese patent application No. 2004-315998 filed on Oct. 29, 2004, the content of which is hereby incorporated by reference into this application.

BACKGROUND OF THE INVENTION

The present invention relates to a semiconductor device and a manufacturing technique thereof, and particularly to a semiconductor device wherein at least one semiconductor chip is mounted over a wiring board, and a technique effective if applied to a manufacturing technique thereof.

A semiconductor chip is mounted over a wiring board, electrodes of the semiconductor chip and connecting terminals of the wiring board are electrically connected to one another by bonding wires respectively, the semiconductor chip and the bonding wires are sealed with a resin, and solder balls are respectively connected to the back surface of the wiring board, whereby a semiconductor device of a semiconductor package form is manufactured. Such a semiconductor device of a CSP (Chip Size Package) form, which is a small-sized semiconductor package of the order of being slightly larger than a chip size or the semiconductor chip.

Japanese Unexamined Patent Publication No. 2003-92374 (Patent Document 1) has described a technique wherein in a semiconductor device having a wiring board including a main surface, an insulating film formed over the main surface and electrodes exposed from the insulating film and formed over the main surface; a semiconductor chip fixed onto the insulating film provided over the main surface of the wiring board via an adhesive interposed therebetween; conductive wires which respectively connect the electrodes formed over the main surface of the wiring board and electrodes of the semiconductor chip; and an encapsulator or sealing body which covers the semiconductor chip, the main surface of the wiring board and the electrodes, trenches are formed between the semiconductor chip and the electrodes by removing the insulating film over the whole region of its depth, and an outflowing portion of the adhesive (insulative resin) is allowed so as not to stay within each trench, flow beyond each trench and reach the electrodes.

SUMMARY OF THE INVENTION

According to the study of the present inventors, the following have been found newly.

When a semiconductor package is made small-sized as in a semiconductor device of a CSP form, the distance between the end of a semiconductor chip and each of electrodes of a wiring board becomes short so as to approach therebetween. When an adhesive flows out onto the electrodes of the wiring board where the semiconductor chip is fixed to the wiring board by the adhesive, failures in the connection of bonding wires to the electrodes apt to occur, thereby causing a possibility that the reliability of electrical connection between the electrodes of the wiring board and the bonding wires will be degraded.

The technique of removing the insulating film formed over the main surface of the wiring board over the whole region of its depth to thereby form the grooves or trenches between the semiconductor chip and the electrodes is capable of setting the outflowing portion of the adhesive (insulative resin) so as not to stay within each trench, flow beyond each trench and reach the electrodes. Thus, the occurrence of a failure due to the flowing-out of the adhesive can be restrained.

However, in the technique of fixing the semiconductor chip onto the insulating film formed over the main surface of the wiring board through the adhesive interposed therebetween, the whole surface at the back surface of the semiconductor chip is bonded onto the insulating film formed on the main surface of the wiring board via the adhesive interposed therebetween. The adhesion between the adhesive and its corresponding encapsulating resin is degraded as compared with the adhesion between the semiconductor chip and the encapsulating resin. Therefore, when the applied adhesive protrudes from the outer peripheral portion of the semiconductor chip or gets wet with respect to the side surface thereof, the area of junction between the adhesive and the encapsulating resin increases, thus degrading adhesion of the encapsulating resin. There is a possibility that the degradation of adhesion of the encapsulating resin will reduce reliability and production yields of the semiconductor device (semiconductor package).

When the adhesive used to fix the semiconductor chip reaches its protruded position than the outer peripheral portion of the semiconductor chip, it is difficult to dispose the electrodes of the wiring board closer to the outer peripheral portion of the semiconductor chip, thus making it impossible to realize further miniaturization of the semiconductor device.

An object of the present invention is to provide a technique capable of enhancing reliability of a semiconductor device.

Another object of the present invention is to provide a technique capable of realizing miniaturization of a semiconductor package.

The above, other objects and novel features of the present invention will become apparent from the description of the present specification and the accompanying drawings.

Summaries of representative ones of the inventions disclosed in the present application will be explained in brief as follows:

The present invention provides a semiconductor device wherein a first insulating film section and a second insulating film section provided on its outer periphery are formed in a first main surface of a wiring board, a back surface of a semiconductor chip is bonded over the first insulating film section, an encapsulating resin is formed over the first main surface of the wiring board so as to cover the semiconductor chip and bonding wires, and the encapsulating resin is charged even below an outer peripheral portion of the back surface of the semiconductor chip.

Further, the present invention provides a method for manufacturing a semiconductor device, wherein when electrodes of a semiconductor chip and electrodes of a wiring board are connected to one another by wire bonding, one ends of bonding wires are connected to their corresponding electrodes of the wiring board and thereafter the other ends thereof are connected to their corresponding electrodes of the semiconductor chip.

Advantageous effects obtained by the representative ones of the inventions disclosed in the present application will be explained in brief as follows:

Since the encapsulating resin is charged even below the outer peripheral portion of the back surface of the semiconductor chip, the reliability of the semiconductor device can be enhanced.

Since the area of junction between the semiconductor chip and the encapsulating resin increases, the adhesion of the encapsulating resin can be improved and the production yield of the semiconductor device can be enhanced.

DETAILED DESCRIPTION OF THE PREFFERED EMBODIMENTS

Figure 1:
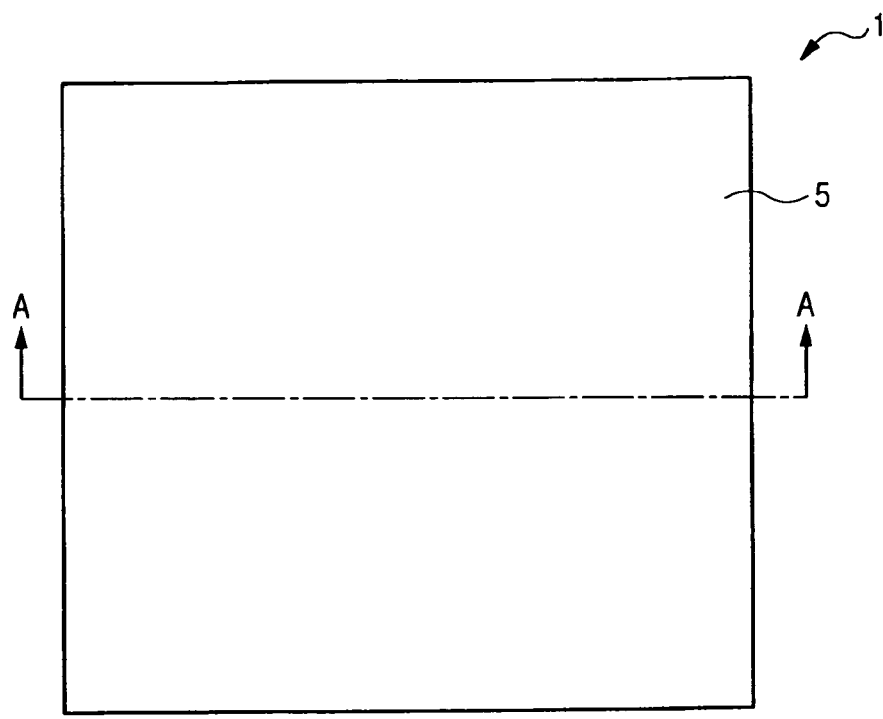
FIG. 1 is a top view of a semiconductor device showing a first embodiment of the present invention.

The following embodiments will be described by being divided into a plurality of sections whenever circumstances require it for convenience in the following embodiments. However, unless otherwise specified in particular, they are not irrelevant to one another. One thereof has to do with modifications, details and supplementary explanations of some or all of the other. When reference is made to the number of elements or the like (including the number of pieces, numerical values, quantity, range, etc.) in the following embodiments, the number thereof is not limited to a specific number and may be greater than or less than or equal to the specific number unless otherwise specified in particular and definitely limited to the specific number in principle. It is also needless to say that components (including element or factor steps, etc.) employed in the following embodiments are not always essential unless otherwise specified in particular and considered to be definitely essential in principle. Similarly, when reference is made to the shapes, positional relations and the like of the components or the like in the following embodiments, they will include ones substantially analogous or similar to their shapes or the like unless otherwise specified in particular and considered not to be definitely so in principle, etc. This is similarly applied even to the above-described numerical values and range.

Preferred embodiments of the present invention will hereinafter be described in detail with reference to the accompanying drawings. Incidentally, constituent elements each having the same function in all the drawings for describing the embodiments are respectively given the same reference numerals and their repetitive explanations are omitted. In the following embodiments, the description of the same or similar elements will not be repeated in principle unless otherwise required.

In the drawings used in the embodiments, some hatching might be omitted to make it easy to read the drawings even in the case of sectional views. Some hatching might be provided to make it easy to read the drawings even in the case of plan views.

First Preferred Embodiment

A semiconductor device according to the present embodiment and its manufacturing process will be explained with reference to the accompanying drawings.

Figure 2:
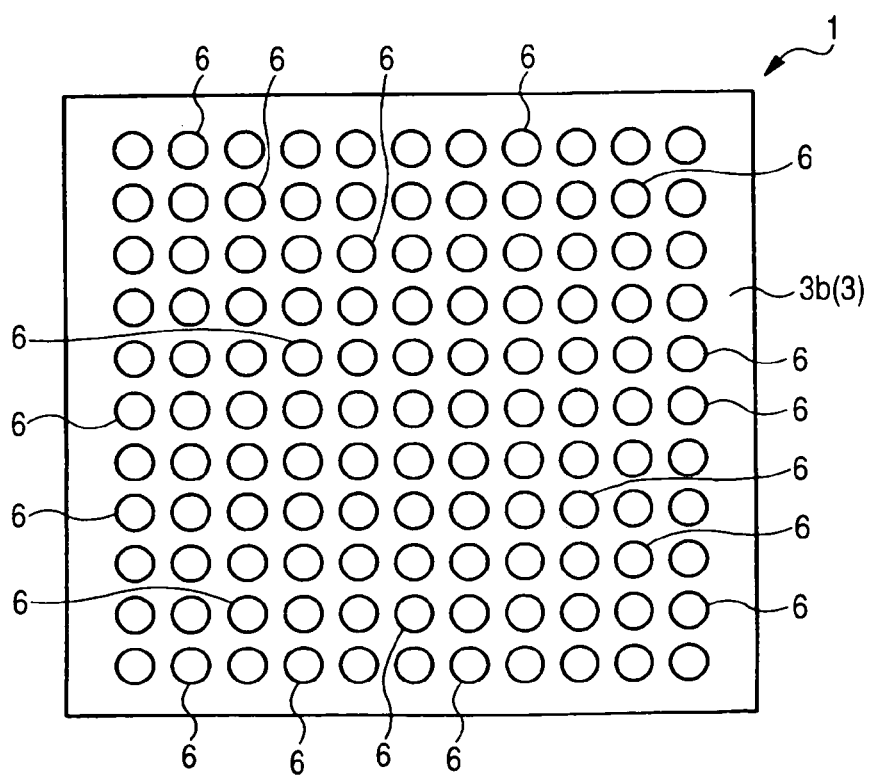
FIG. 2 is a bottom view of the semiconductor device shown in FIG. 1.
Figure 3:
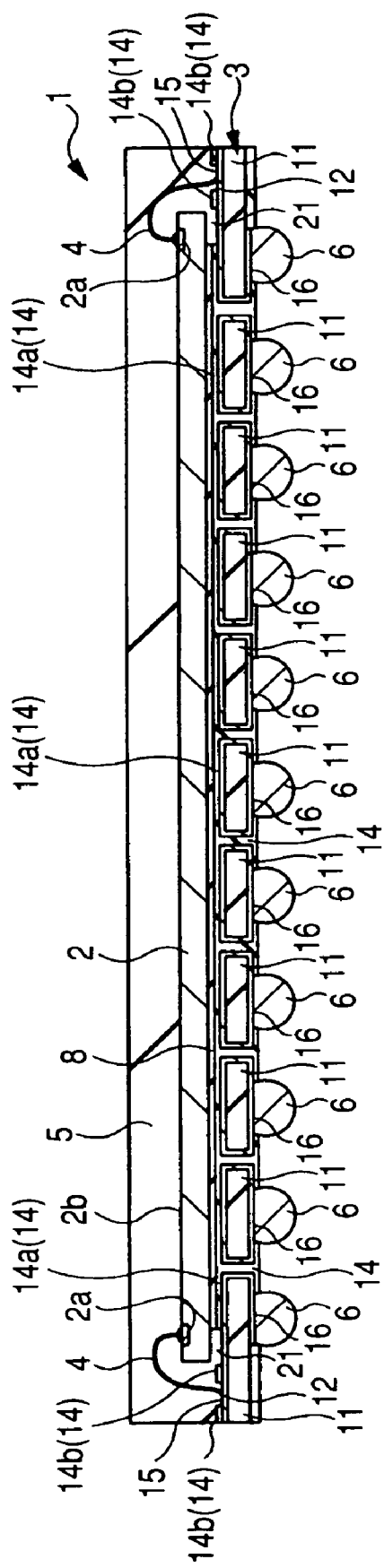
FIG. 3 is a sectional view of the semiconductor device shown in FIG. 1.
Figure 4:
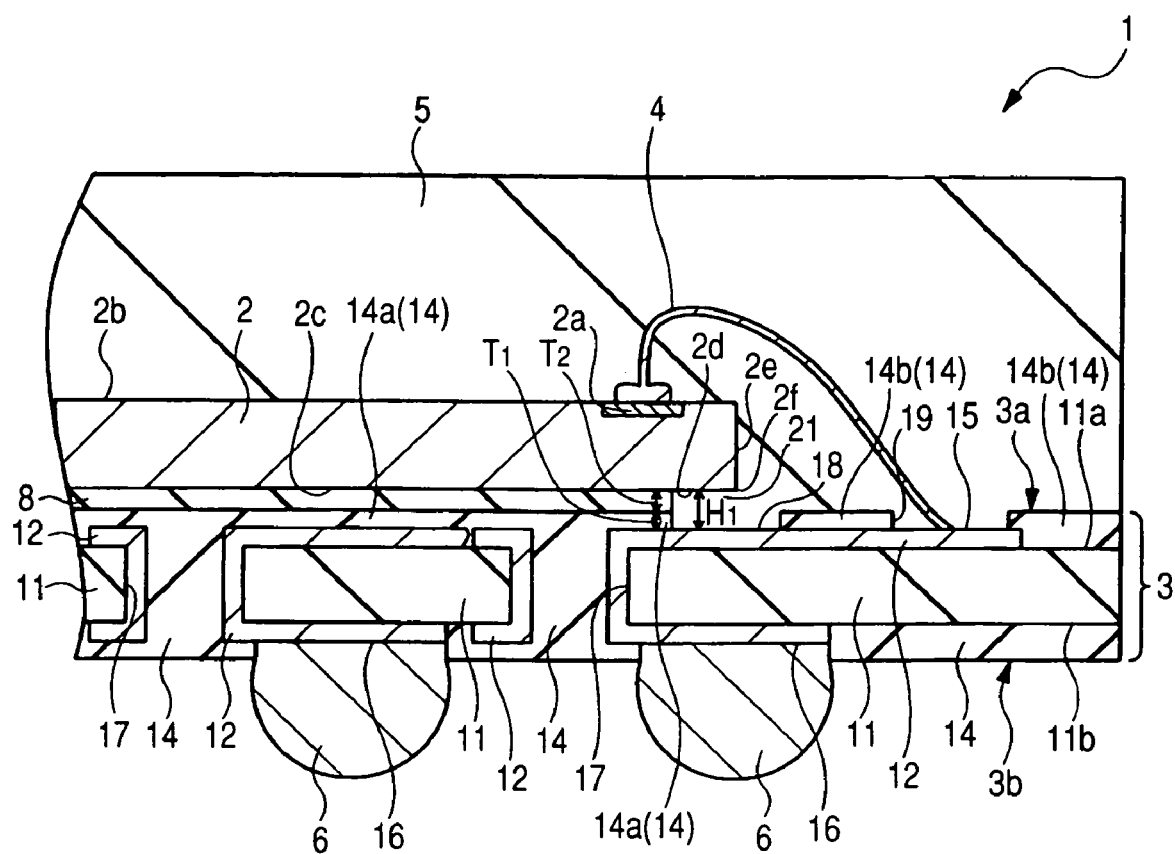
FIG. 4 is a fragmentary sectional view of the semiconductor device shown in FIG. 1.
Figure 5:
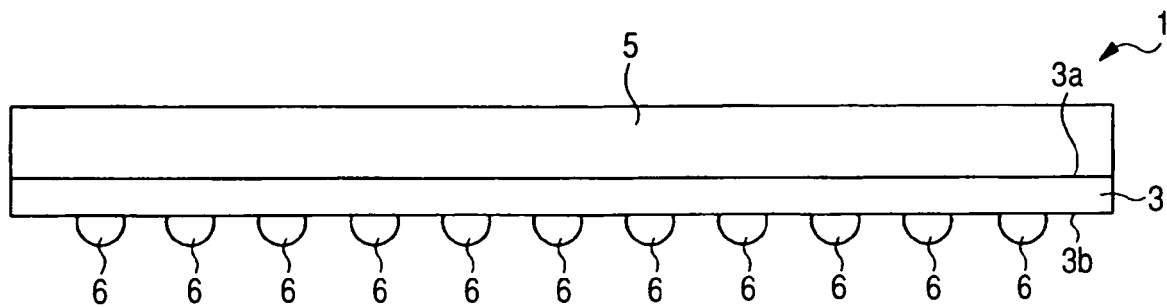
FIG. 5 is a side view of the semiconductor device shown in FIG. 1.
Figure 6:
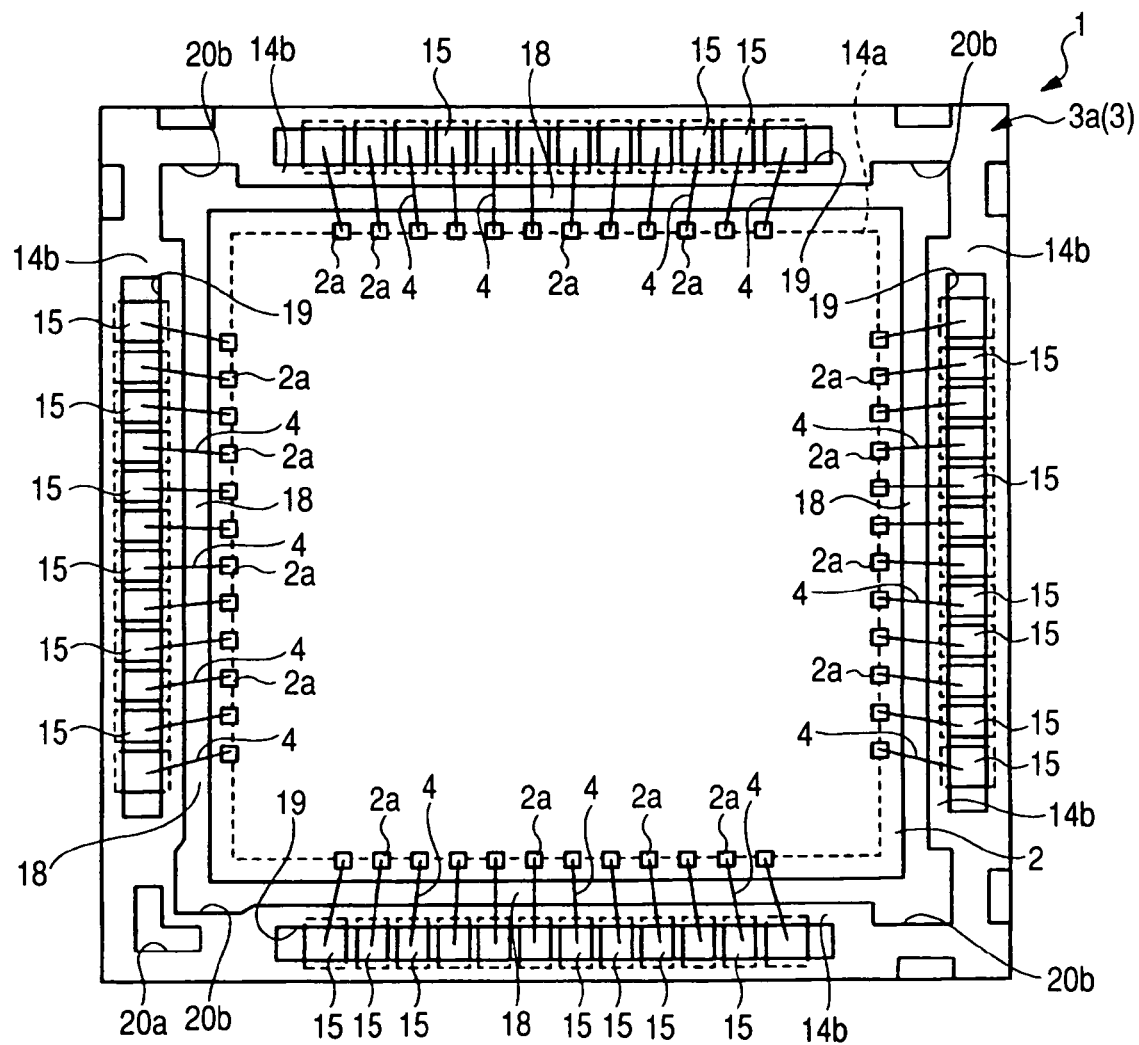
FIG. 6 is a plan perspective view of the semiconductor device of FIG. 1 as seen through an encapsulating resin.
Figure 7:
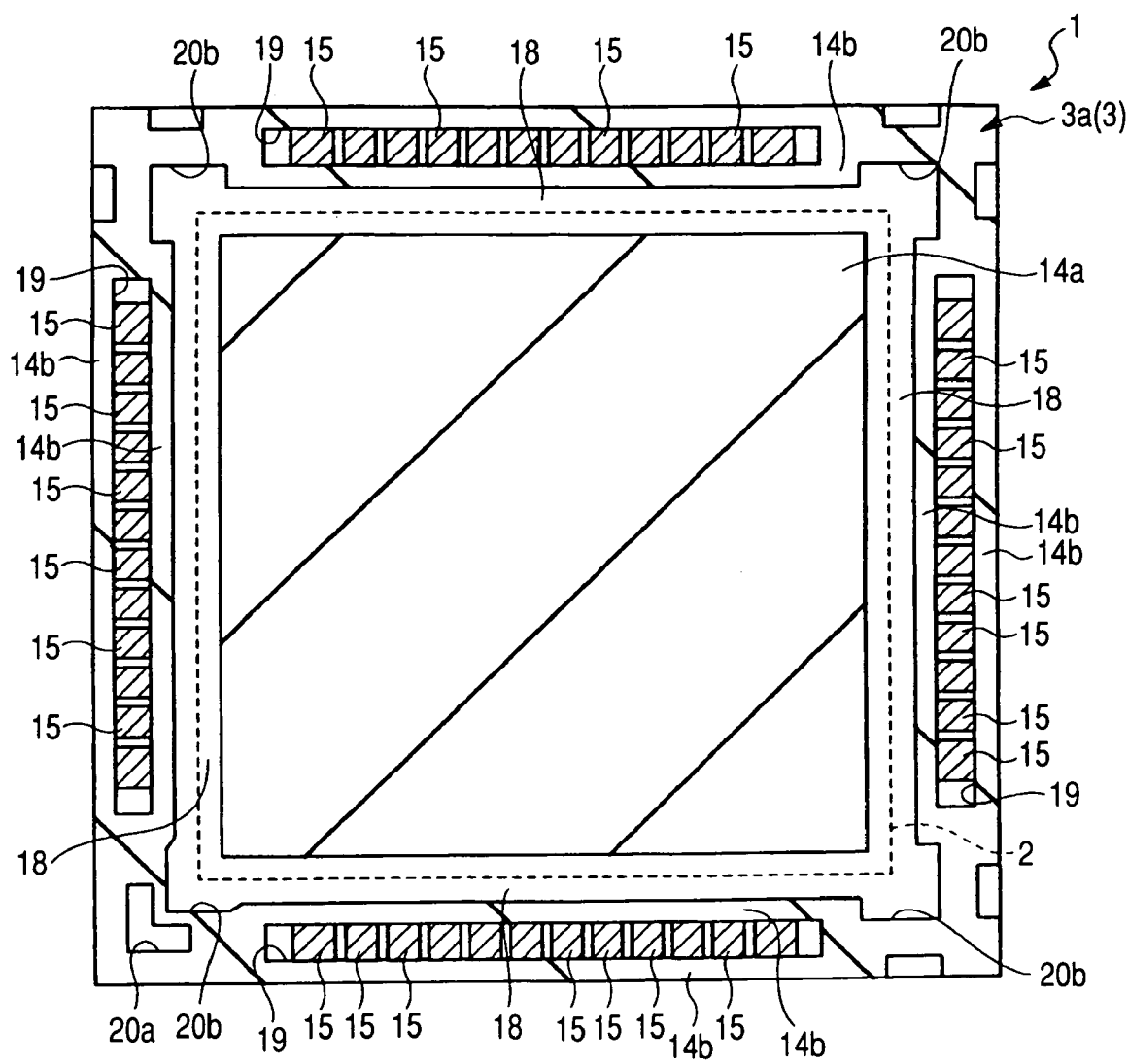
FIG. 7 is a plan perspective view of the semiconductor device of FIG. 1 as seen through the encapsulating resin, a semiconductor chip and bonding wires.

FIG. 1 is a top view of the semiconductor device 1 showing the first embodiment of the present invention, FIG. 2 is a bottom view thereof, FIG. 3 is a sectional view (overall sectional view) thereof, FIG. 4 is a fragmentary sectional view (partly enlarged sectional view) thereof, and FIG. 5 is a side view thereof, respectively. A section taken along line A-A of FIG. 1 substantially corresponds to FIG. 3, and an enlarged view of an end nearby area of FIG. 3 substantially corresponds to FIG. 4. FIG. 6 is a plan perspective view (top view) of the semiconductor device 1 as seen through an encapsulating resin 5, and FIG. 7 is a plan perspective view (top view) of the semiconductor device 1 as seen through the encapsulating resin 5, a semiconductor chip 2 and bonding wires 4, that is, a top view of a wiring board 3 employed in the semiconductor device 1. Incidentally, the outer shape of the semiconductor chip 2 is indicated by a dotted line in FIG. 7. While FIG. 7 is a plan view, hatching is applied to each of a first solder resist section 14a, a second solder resist section 14b and connecting terminals 15 exposed from aperture parts or openings 19 of the second solder resist section 14b in order to provide easy understanding.

The semiconductor device 1 according to the present embodiment shown in FIGS. 1 through 7 is equivalent to a semiconductor device (semiconductor package) in which the semiconductor chip 2 is mounted (bonded, connected and packaged) onto the wiring board 3. For instance, there is known, for example, a semiconductor device of a CSP (Chip Size Package) form, which is a small-sized semiconductor package of the order of being slightly larger than a chip size or the semiconductor chip 2.

The semiconductor device 1 according to the present embodiment includes the semiconductor chip 2, the wiring board 3 that supports the semiconductor chip 2 or mounts it thereon, a plurality of bonding wires 4 which electrically connect a plurality of electrodes (second electrodes, bonding pads and pad electrodes) placed in the front surface of the semiconductor chip 2, and a plurality of connecting terminals (first electrodes, bonding pads and pad electrodes) 15 of the wiring board 3, which are respectively associated with the plurality of electrodes, the encapsulating resin (encapsulating resin section, encapsulating section and encapsulator or sealing body) 5 which covers the semiconductor chip 2 and an upper surface 3a of the wiring board 3 including the bonding wires 4, and a plurality of solder balls (ball electrodes, protruded electrodes, electrodes and external terminals) 6 provided at a lower surface 3b of the wiring board 3 as external terminals in an area array layout.

In the semiconductor chip 2, its planar shape that intersects with its thickness is square. For instance, the semiconductor chip 2 corresponds to each of semiconductor chips 2 obtained by separating a semiconductor substrate (semiconductor wafer) constituted of monocrystalline silicon by dicing or the like after various semiconductor elements or semiconductor integrated circuits are formed over a main surface of the semiconductor substrate and the back surface of the semiconductor substrate is ground as needed. The semiconductor chip 2 has a front surface (main surface and upper surface over the semiconductor element forming side) 2b and a back surface (main surface and lower surface over the side opposite to the main surface of the semiconductor element forming side) 2c opposite to each other. The semiconductor chip 2 is disposed over the upper surface (chip support surface) 3a of the wiring board 3 in such a manner that the front surface 2b thereof faces upward. The back surface 2c of the semiconductor chip 2 is bonded and fixed onto the upper surface 3a of the wiring board 3 via an adhesive (die bond material, bonding agent and glue) 8 interposed therebetween. For example, an insulative or conductive paste material or the like can be used as the adhesive 8. The thickness of the adhesive 8 can be set to approximately 20 to 30 µm, for example. A plurality of electrodes 2a are formed in the front surface 2b of the semiconductor chip 2. The electrodes 2a are electrically connected to their corresponding semiconductor elements or semiconductor integrated circuits formed inside the semiconductor chip 2 or at its surface layer portion.

The wiring board 3 has an insulative base material layer (insulated board and core material) 11, a conductor layer (conductor patterns, conductor film patterns and wiring layers) 12 formed at each of an upper surface 11a of the base material layer 11 and a lower surface 11b thereof, and a solder resist layer (insulating film and solder resist layer) 14 used as an insulating layer (insulator layer and insulating film) formed over the upper surface 11a and lower surface 11b of the base material layer 11 so as to cover the conductor layer 12. As another form, the wiring board 3 can also be formed by a multilayer wiring board in which a plurality of insulating layers and a plurality of wiring layers are laminated over one another.

The conductor layer 12 is patterned and is a conductor pattern which serves as each wiring or wiring layer of the wiring board 3. The conductor layer 12 is formed of a conductive material and can be formed of a copper thin film formed by a plating method, for example. A plurality of connecting terminals (electrodes, bonding pads and pad electrodes) 15 for connecting the bonding wires 4 are formed by the conductor layer 12 placed over the upper surface 11a of the base material layer 11. A plurality of conductive lands (electrodes, pads and terminals) 16 for connecting the solder balls 6 are formed by the conductor layer 12 placed over the lower surface 11b of the base material 11. A plurality of aperture parts or openings (through holes, vias and via or perforated holes) 17 are defined in the base material layer 11. The conductor layer 12 is formed even over the sidewalls of each opening 17. Each of the connecting terminals 15 placed over the upper surface 11a of the base material layer 11 is electrically connected to its corresponding land 16 placed over the lower surface 11b of the base material layer 11 via the conductor layer 12 (each lead-out wire formed of same)

placed over the upper surface 11a of the base material layer 11, the conductor layer 12 placed over the sidewalls of the opening 17, and the conductor layer 12 placed over the lower surface 11b of the base material layer 11. Thus, the plural electrodes 2a of the semiconductor chip 2 are electrically connected to the plural connecting terminals 15 of the wiring board 3 via the plural bonding wires 4 respectively. Further, the plural electrodes 2a are electrically connected to the plural lands 16 of the wiring board 3 respectively via the conductor layer 12 of the wiring board 3. Each of the bonding wires 4 is made up of a metal thin wire such as a gold wire.

The solder resist layer 14 has a function which serves as an insulating layer (insulating film) for protecting the conductor layer 12, and is made up of an insulator material such as an organic resin material. Also the solder resist layer 14 is formed over the upper surface 11a and lower surface 11b of the base material layer 11 so as to cover the conductor layer 12. The solder resist layer 14 buries the interior of each opening 17 defined in the base material layer 11. Since the solder resist layer 14 buries the openings 17 of the base material layer 11, it can prevent the adhesive 8 from leaking from the openings 17 to the lower surface 3b side of the wiring board 3. Also the solder resist layer 14 can prevent the back surface 2c of the semiconductor chip 2 from being exposed through each opening 17. The connecting terminals 15 and the lands 16 in the conductor layer 12 of the wiring board 3 are exposed from the solder resist layer (openings thereof) 14. The thickness of the solder resist layer 14 placed over each of the upper and lower surfaces 11a and 11b of the base material layer 11 can be set to approximately 20 to 30 μm, for example.

The plurality of lands 16 are disposed in the lower surface 3b of the wiring board 3 in array form. The openings 17 are formed next to the lands 16 respectively. The solder balls 6 are connected to their corresponding lands 16. Therefore, the plurality of solder balls 6 are disposed in the lower surface 3b of the wiring board 3 in array form. The solder balls 6 can function as external terminals of the semiconductor device 1. Thus, the plurality of electrodes 2a of the semiconductor chip 2 are electrically connected to the plurality of connecting terminals 15 of the wiring board 3 via the plural bonding wires 4 respectively. Further, the plural electrodes 2a are connected to the plural lands 16 of the wiring board 3 and the plural solder balls 6 connected to the plural lands 16 via the conductor layer 12 of the wiring board 3, respectively. Incidentally, although the number of the solder balls 6 shown in FIG. 2 and the number of the connecting terminals 15 shown in FIGS. 6 and 7 do not coincide with each other, FIGS. 1 through 7 typically show the structure of the semiconductor device 1, and the number of the solder balls 6 and the number of the connecting terminals 15 in the semiconductor device 1 can be changed in various ways as needed. The number of the solder balls 6 and the number of the connecting terminals 15 in the semiconductor device 1 can also be rendered identical to each other or different from each other. The solder balls 6 electrically unconnected to the electrodes 2a of the semiconductor chip 2 can also be used for radiation.

Although the solder resist layer 14 is formed in the upper surface 3a of the wiring board 3, the solder resist layer 14 formed in the upper surface 3a of the wiring board 3 has a first solder resist section (first insulating film section) 14a located below the semiconductor chip 2 (i.e., the central portion of the upper surface 3a of the wiring board 3), and a second solder resist section (second insulating film section) 14b located in the outer periphery of the first solder resist section 14a (therearound) (i.e., it is located in the outer peripheral portion of the upper surface 3a of the wiring board 3). An area (dam area) 18 from which the base material layer 11 is exposed, exists between the first solder resist section 14a and the second solder resist section 14b without the solder resist layer 14 being formed therebetween. Thus, the first solder resist section 14a and the second solder resist section 14b are spaced away from each other with the area 18 interposed therebetween. In the area 18, lead-out wires (not shown in the plan views of FIGS. 6 and 7 although they are also formed of the conductor layer 12) for connecting between the connecting terminals 15 and the conductor layer 12 placed over the sidewalls of the openings 17 are also exposed.

The semiconductor chip 2 is bonded (mounted, connected, fixed and placed) onto the first solder resist section 14a through the adhesive 8 interposed therebetween. The second solder resist section 14b has aperture parts or openings 19 for exposing the connecting terminals 15. As shown in FIG. 6, each of the connecting terminals 15 has a pattern (conductor pattern) substantially rectangular in form. Each opening 19 defined in the second solder resist section 14b is formed so as to overlap with the conductor pattern for the connecting terminal 15. Therefore, the second solder resist section 14b is superimposed over some (both ends) of the connecting terminal 15. Thus, it is possible to more reliably prevent peeling of each connecting terminal 15 and further enhance the reliability of the semiconductor device.

The bonding wires 4 are connected to their corresponding connecting terminals 15 exposed from the openings 19 of the second solder resist section 14b. In order to facilitate or ascertain the connection of the bonding wires 4 to the connecting terminals 15, a gold-plated layer (or a laminated film of a nickel-plated layer (on the underlayer side) or the like is formed in the upper surface (connecting surface of bonding wire 4) of each connecting terminal 15 exposed from the opening 19 of the second solder resist section 14b. An aperture part or opening 20a used as a package index is also defined in the second solder resist section 14b. The opening 20a used as the package index formed in the second solder resist section 14b can be used for positioning and recognition in the manufacturing process of the semiconductor device 1.

While the semiconductor chip 2 is bonded (mounted, connected, fixed and placed) onto the first solder resist section 14a on the upper surface 3a of the wiring board 3 via the adhesive 8 interposed therebetween, a plane dimension (area) of the first solder resist section 14a is smaller than the plane dimension (area) of the semiconductor chip 2. Therefore, when the semiconductor chip 2 is mounted, the first solder resist section 14a does not extend (exist) below the outer peripheral portion (peripheral portion and end nearby area) 2d of the back surface 2c of the semiconductor chip 2. Thus, the outer peripheral portion 2d of the back surface 2c of the semiconductor chip 2 and each end 2f of the back surface 2c thereof are placed over the area 18 where no solder resist layer 14 is formed. When the semiconductor chip 2 is die-bonded (joined) onto the wiring board 3, the adhesive 8 is placed over the first solder resist section 14a smaller in size than the semiconductor chip 2, and the semiconductor chip 2 is bonded thereto. Therefore, the adhesive 8 does not extend (exist) over the outer peripheral portion 2d of the back surface 2c of the semiconductor chip 2. Thus, when the semiconductor chip 2 is die-bonded onto the wiring board 3, the adhesive 8 and the solder resist layer 14 do not exist below the outer peripheral portion 2d of the back surface 2c of the semiconductor chip 2. That is, since the adhesive 8 and the solder resist layer 14 (first solder resist section 14a) exist inside than the side surface 2e (end 2f) of the semiconductor chip 2 of the back surface 2c of the semiconductor chip 2, the outer peripheral portion 2d of the back surface 2c of the semiconductor chip 2 is brought into an exposed state. Therefore, space (gap)

21 is defined between the outer peripheral portion 2d of the back surface 2c of the semiconductor chip 2 and the upper surface 3a of the wiring board 3. The vertical size $H_1$ (corresponding to the distance between the outer peripheral portion 2d of the back surface 2c of the semiconductor chip 2 and the upper surface 3a of the wiring board 3) of the space 21 is substantially equivalent to the sum of a thickness $T_1$ of the first solder resist section 14a and a thickness $T_2$ of the adhesive 8 ($H_1=T_1+T_2$). When the encapsulating resin 5 is formed (mold process), a material for forming the encapsulating resin 5 is charged even into the space 21 below the outer peripheral portion 2d of the back surface 2c of the semiconductor chip 2. Thus, the cured (solidified) encapsulating resin 5 is charged below the outer peripheral portion 2d of the back surface 2c of the semiconductor chip 2. Since the cured encapsulating resin covers the front surface 2b of the semiconductor chip 2, the side surface 2e thereof and the outer peripheral portion 2d of the back surface 2c thereof, adhesion (adhesive strength) between the semiconductor chip 2 and the encapsulating resin 5 can be enhanced and hence the reliability of the semiconductor device 1 can be improved.

The encapsulating resin 5 is formed of a resin material or the like such as a thermosetting resin material and can contain a filler or the like. The encapsulating resin 5 can be formed using an epoxy resin containing a filler, for example. The encapsulating resin 5 is formed over the upper surface 3a of the wiring board 3 so as to cover the semiconductor chip 2 and the bonding wires 4. The encapsulating resin 5 seals and protects the semiconductor chip 2 and the bonding wires 4.

Figure 8:
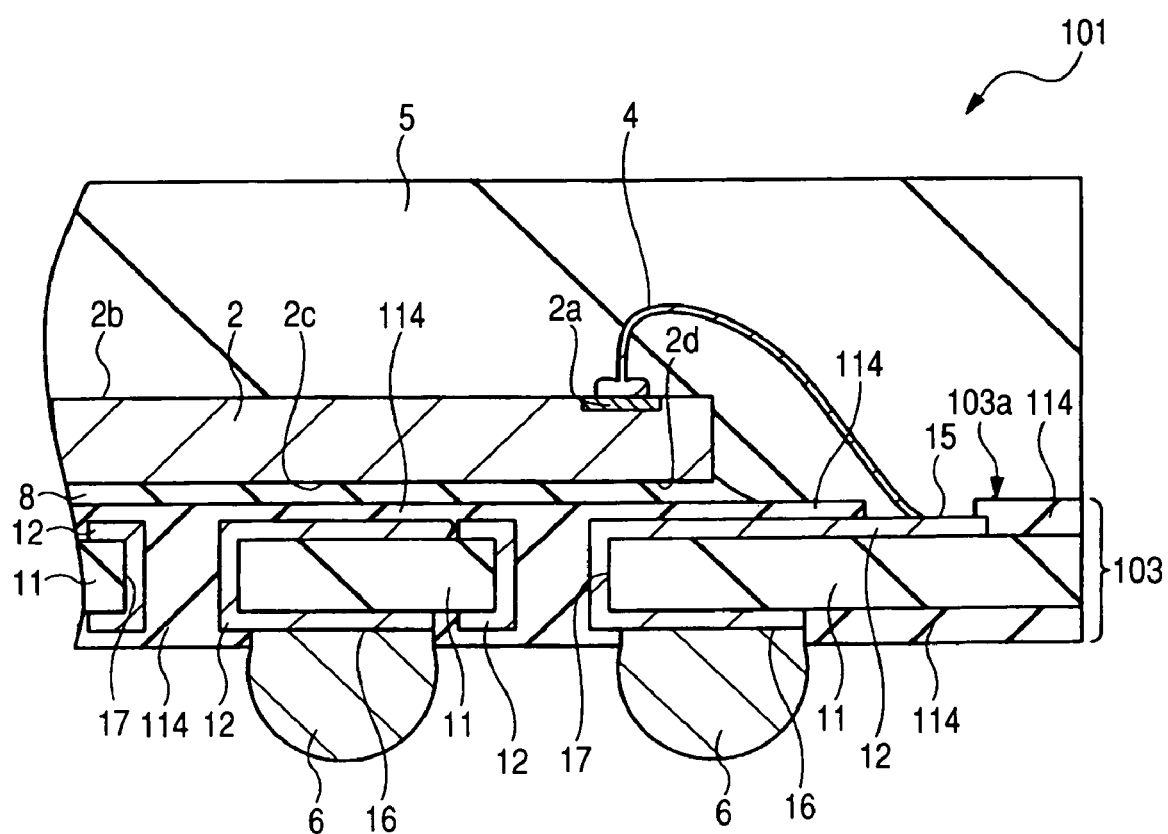
FIG. 8 is a fragmentary sectional view of a semiconductor device showing a first comparative example.
Figure 9:
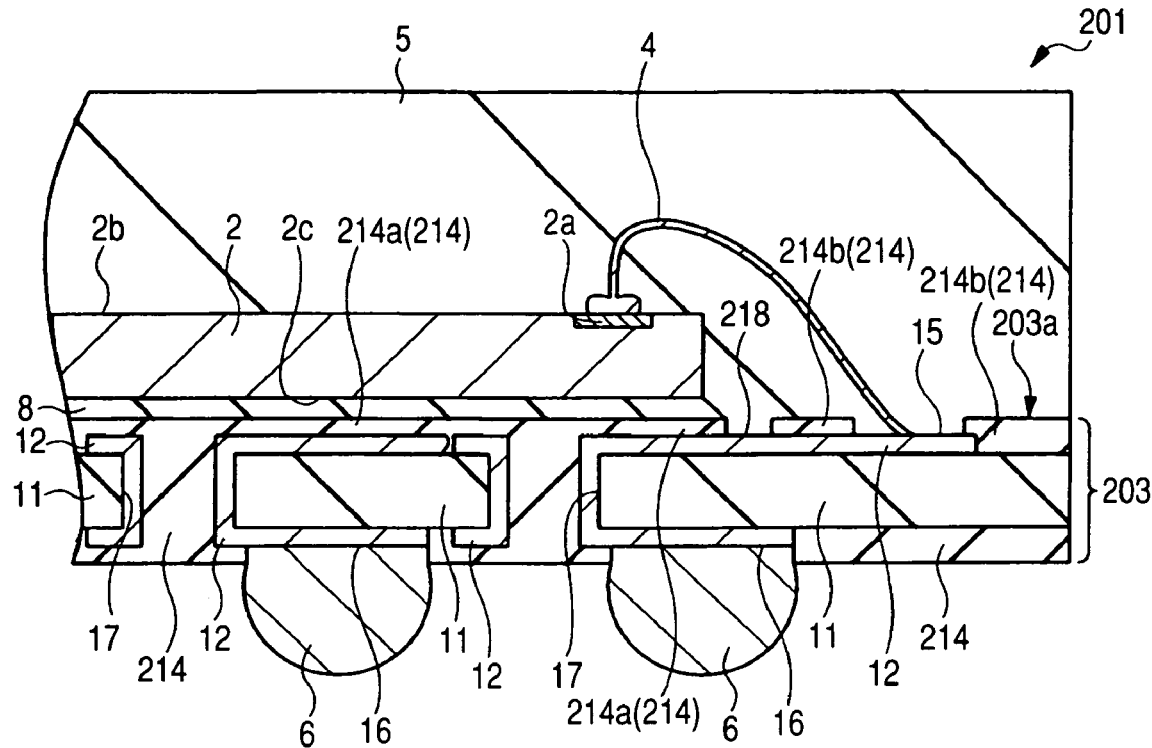
FIG. 9 is a fragmentary sectional view of a semiconductor device showing a second comparative example.
Figure 10:
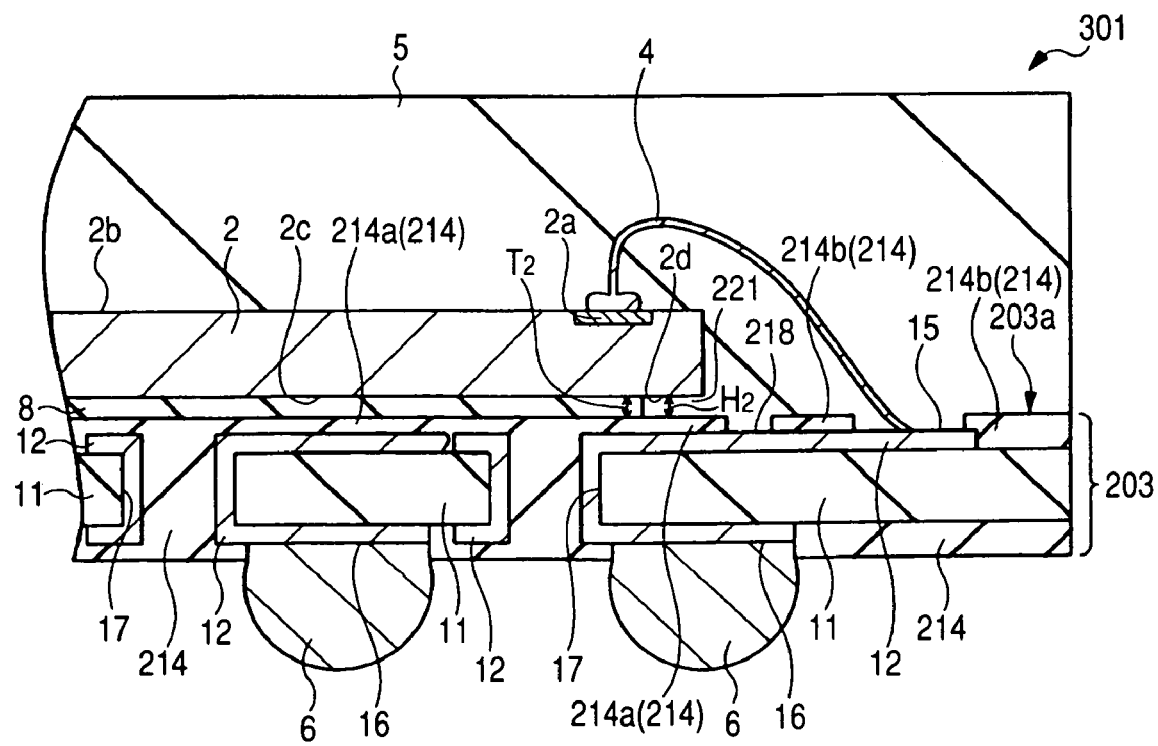
FIG. 10 is a fragmentary sectional view of a semiconductor device showing a third comparative example.

FIG. 8 is a fragmentary sectional view (partly enlarged sectional view) of a semiconductor device 101 according to a first comparative example, FIG. 9 is a fragmentary sectional view (partly enlarged sectional view) of a semiconductor device 201 according to a second comparative example, and FIG. 10 is a fragmentary sectional view (partly enlarged sectional view) of a semiconductor device 301 according to a third comparative example, respectively. Areas corresponding to FIG. 4 of the present embodiment are respectively shown in the figures.

The semiconductor device 101 according to the first comparative example shown in FIG. 8 is different from the present embodiment. A solder resist layer 114 is formed over the entire upper surface 103a of a wiring board 103 except for above connecting terminals 15. The solder resist layer 114 extends even below an outer peripheral portion 2d of a back surface 2c of a semiconductor chip 2. Therefore, the semiconductor device 101 according to the first comparative example has a possibility that when the semiconductor chip 2 is die-bonded onto the wiring board 103, an adhesive 8 constituted of a paste material or the like will spread beyond the end of the back surface 2c of the semiconductor chip 2 and the adhesive 8 will flow over the upper surface of the solder resist layer 114 so as to spread up to over the connecting terminals 15. There is a possibility that when the adhesive 8 spreads (flows out) up to over the connecting terminals 15, a failure in the connection of each bonding wire 4 to its corresponding connecting terminal 15 becomes easy to occur, so that the reliability of electrical connection between the bonding wires 4 and the connecting terminals 15 will be degraded. Although it is also considered that the distance between the end of the semiconductor chip 2 and each of the connecting terminals 15 of the wiring board 103 is made long to prevent the outflowing of the adhesive 8 to the connecting terminals 15, this will result in upsizing of the semiconductor device (increase in its area).

In the semiconductor device 201 according to the comparative example shown in FIG. 9, a solder resist layer 214 comprising a first solder resist section 214a and a second solder resist section 214b is formed in an upper surface 203a of a wiring board 203. An area (dam area) 218 from which a base material layer 11 of the wiring board 203 is exposed, exists between the first solder resist section 214a and the second solder resist section 214b without the solder resist layer 214 being formed therein. However, the second comparative example is different from the present embodiment in that the plane dimension (area) of the first solder resist section 214a is larger than the plane dimension (area) of a semiconductor chip 2, and the first solder resist section 214a extends (exists) below the entire back surface 2c of the semiconductor chip 2. In the semiconductor device 201 according to the second comparative example, the solder resist layer 214 does not exist between the first solder resist section 214a and the second solder resist section 214b when the semiconductor chip 2 is die-bonded onto the wiring board 203, and the area (dam area) 218 from which the base material layer 11 is exposed is provided therebetween. Consequently, an adhesive 8 constituted of a paste material can be prevented from being spread up to over the second solder resist section 214b beyond the area 218. It is thus possible to prevent the adhesive 8 from being spread up to over the connecting terminals 15 and enhance the reliability of electrical connection between bonding wires 4 and the connecting terminals 15.

In the semiconductor device 201 according to the second comparative example shown in FIG. 9, however, the plane dimension (area) of the first solder resist section 214a is larger than the plane dimension (area) of the semiconductor chip 2, and the entire back surface 2c of the semiconductor chip 2 is adhered to the first solder resist section 214a via the adhesive 8 interposed therebetween. The adhesion (adhesive strength) between the encapsulating resin 5 and the adhesive 8 is lower than that (adhesive strength) between the semiconductor chip 2 and the encapsulating resin 5. Therefore, the semiconductor device 201 according to the second comparative example has a possibility that since the encapsulating resin 5 will cover the front surface 2b and side surface 2e of the semiconductor chip 2 but will not cover the back surface 2c of the semiconductor chip 2, and the area of junction between semiconductor chip 2 and the encapsulating resin 5 is smaller than (the semiconductor device 1 of) the first embodiment, the adhesion (adhesive strength) between the semiconductor chip 2 and the encapsulating resin 5 will relatively become lower than (the semiconductor device 1 of) the first embodiment. Further, when the adhesive 8 used for fixing the semiconductor chip 2 reaches a position where it protrudes from the outer peripheral portion of the semiconductor chip 2, it is difficult to dispose the connecting terminals 15 placed over the wiring board 203 closer to the outer peripheral portion of the semiconductor chip 2. Therefore, a reduction in the size of the semiconductor device 201 cannot be realized as compared with (the semiconductor device 1) of the first embodiment.

In the semiconductor device 301 according to the third comparative example shown in FIG. 10, the applied area of an adhesive 8 and the amount of application thereof are reduced as compared with the semiconductor device 201 according to the second comparative example. Thus, when a semiconductor chip 2 is bonded onto a first solder resist section 214a of an upper surface 203a of a wiring board 203 via the adhesive 8 interposed therebetween, the adhesive 8 does not extend (exist) below an outer peripheral portion 2d of a back surface 2c of the semiconductor chip 2, and space (gap) 221 can be defined between the outer peripheral portion 2d of the back surface 2c of the semiconductor chip 2 and the upper surface 203a of the wiring board 203. Thus, when an encapsulating resin 5 is formed, a material for forming the encapsulating resin 5 can be charged even into the space 221. Hence the cured encapsulating resin 5 covers a front surface 2b of the semiconductor chip 2, each side surface 2e thereof and the outer peripheral portion 2d of the back surface 2c thereof to thereby make it possible to enhance adhesion (adhesive strength) between the semiconductor chip 2 and the encapsulating resin 5.

In the semiconductor device 301 according to the third comparative example shown in FIG. 10, however, the space 221 is defined between the outer peripheral portion 2d of the back surface 2c of the semiconductor chip 2 and the upper surface 203a of the wiring board 203 by adjusting the applied area of the adhesive 8 and the amount of application thereof. Therefore, there is a possibility that the applied amount of the adhesive 8 is too low to reduce the strength of junction between the semiconductor chip 2 and the wiring board 203 or the applied amount of the adhesive 8 is too much to form the space 221 between the outer peripheral portion 2d of the back surface 2c of the semiconductor chip 2 and the upper surface 203a of the wiring board 203. Therefore, the management of a die bonding process is not easy and variations increase every products. It is also considered that the space 221 is formed between the outer peripheral portion 2d of the back surface 2c of the semiconductor chip 2 and the upper surface 203a of the wiring board 203 by using a die bond film smaller in plane dimension than the semiconductor chip 2 as the adhesive 8. However, there is a possibility that the die bond film is more expensive than the paste adhesive and hence the manufacturing cost of the semiconductor device will increase.

In the semiconductor device 301 according to the third comparative example shown in FIG. 10 as distinct from the first embodiment, the first solder resist section 214a extends below the outer peripheral portion 2d of the back surface 2c of the semiconductor chip 2. Therefore, when the semiconductor chip 2 is die-bonded onto the wiring board 203, a vertical size or dimension $H_2$ of the space 221 defined between the outer peripheral portion 2d of the back surface 2c of the semiconductor chip 2 and the upper surface 203a of the wiring board 203 becomes low (small). The vertical size $H_2$ of the space 221 is substantially equivalent to a thickness $T_2$ of the adhesive 8 ($H_2=T_2$). When the thickness of the adhesive 8 ranges from approximately 20 μm to 30 μm, for example, the vertical size $H_2$ of the space 221 also reaches approximately 20 to 30 μm. Since the vertical size $H_2$ of the space 221 below the outer peripheral portion 2d of the back surface 2c of the semiconductor chip 2 is small, a filler or the like contained in the material for forming the encapsulating resin 5 is hard to enter into the space 221 below the outer peripheral portion 2d of the back surface 2c of the semiconductor chip 2 upon formation of the encapsulating resin 5, and the ratio of components of the encapsulating resin 5 charged into the space 221 and the ratio of components of the encapsulating resin 5 in other area are un-uniformized, thereby causing a possibility that the adhesion (adhesive strength) between the cured encapsulating resin 5 and the semiconductor chip 2 will be degraded.

In contrast, in the present embodiment, the first solder resist section (first insulating film section) 14a that bonds the semiconductor chip 2 onto the upper surface 3a via the adhesive 8 interposed therebetween, and the second solder resist section (second insulating film section) 14b which is provided around the first solder resist section 14a (on the outer periphery thereof) and exposes the connecting terminals 15 from the openings 19, are formed over the upper surface 3a of the wiring board 3. The area (dam area) 18 from which the base material layer 11 is exposed, exists between the first solder resist section 14a and the second solder resist section 14b without the solder resist layer 14 being formed therebetween. Therefore, since the solder resist layer 14 does not exist between the first solder resist section 14a and the second solder resist section 14b when the semiconductor chip 2 is die-bonded onto the wiring board 3, and the area (dam area) 18 from which the base material layer 11 is exposed is provided therebetween, the adhesive 8 can be prevented from being spread up to over the second solder resist section 14b beyond the area 18. It is thus possible to prevent the adhesive 8 from being spread up to over the connecting terminals 15 and enhance the reliability of electrical connection between the bonding wires 4 and the connecting terminals 15. Even though a paste adhesive (bonding material) relatively high in flowability is used as the adhesive 8, the provision of the area (dam area) 18 free of the solder resist layer 14 between the first solder resist section 14a and the second solder resist section 14b makes it possible to prevent the adhesive 8 made up of the paste material from being spread up to over the connecting terminals 15. Therefore, the paste adhesive relatively lower in cost than the die bond film can be used as the adhesive 8, and it is hence advantageous to a reduction in the manufacturing cost of the semiconductor device. Since the connecting terminals 15 of the wiring board 3 can be disposed closer to the outer peripheral portion of the semiconductor chip 2, a further reduction in the size of the semiconductor device is enabled.

Further, while the semiconductor chip 2 is mounted and fixed onto the first solder resist section 14a via the adhesive 8 interposed therebetween in the present embodiment, the plane dimension or size (area) of the first solder resist section 14a is smaller than that (area) of the semiconductor chip 2. Therefore, when the semiconductor chip 2 is bonded onto the first solder resist section 14a of the upper surface 3a of the wiring board 3 via the adhesive 8 interposed therebetween, the first solder resist section 14a and the adhesive 8 do not extend (exist) below the outer peripheral portion 2d of the back surface 2c of the semiconductor chip 2, and the space 21 is defined between the outer peripheral portion 2d of the back surface 2c of the semiconductor chip 2 and the upper surface 3a of the wiring board 3. Therefore, when the encapsulating resin 5 is formed, the material for forming the encapsulating resin 5 is charged even into the space 21, and the cured encapsulating resin 5 covers the front surface 2b of the semiconductor chip 2, each side surface 2e thereof and the outer peripheral portion 2d of the back surface 2c of the semiconductor chip 2. Therefore, since the area of junction between the semiconductor chip 2 and the encapsulating resin 5 increases, the adhesion (adhesive strength) between the semiconductor chip 2 and the encapsulating resin 5 can be made high and hence the reliability of the semiconductor device 1 can be enhanced. As in the present embodiment, the encapsulating resin 5 is round-intruded even into the back surface 2c side of the semiconductor chip 2, and the encapsulating resin 5 is filled (charged) between the outer peripheral portion 2d of the back surface 2c of the semiconductor chip 2 and the upper surface 3a of the wiring board 3. Consequently, the semiconductor chip 2 can firmly be sealed by means of the encapsulating resin 5 by using both surfaces of the front surface 2b and back surface 2c of the semiconductor chip 2 (and the side surfaces 2e thereof). Further, the adhesion between the semiconductor chip 2 and the encapsulating resin 5 can be enhanced, and the occurrence of peeling or the like between the semiconductor chip 2 and the encapsulating resin 5 can be prevented more accurately.

Furthermore, in the present embodiment, the vertical size $H_1$ of the space 21 defined between the outer peripheral portion 2d of the back surface 2c of the semiconductor chip 2 and the upper surface 3a of the wiring board 3 can be made larger than the vertical size $H_2$ of the space 221 of the semiconductor device 301 according to the third comparative example by the thickness $T_1$ of the first solder resist section 14a ($H_1 > H_2$). If, for example, the thickness $T_2$ of the adhesive 8 ranges from approximately 20 to 30 μm, and the thickness $T_1$ of the first solder resist section 14a ranges from approximately 20 to 30 μm, then the vertical size $H_1$ of the space 21 can be set to approximately 40 to 60 μm. Thus, since the vertical size $H_1$ of the space 21 below the outer peripheral portion 2d of the back surface 2c of the semiconductor chip 2 can be made relatively high in the present embodiment, a filler or the like contained in the material for forming the encapsulating resin 5 is easy to enter into the space 21 below the outer peripheral portion 2d of the back surface 2c of the semiconductor chip 2, and the ratio of components of the encapsulating resin 5 charged into the space 21 and the ratio of components of the encapsulating resin 5 in other area are uniformized. Thus, the adhesion (adhesive strength) between the cured encapsulating resin 5 and the semiconductor chip 2 can be further improved and the reliability of the semiconductor device 1 can be enhanced.

In the present embodiment, the pattern of the second solder resist section 14b is withdrawn or retracted in the outer-peripheral direction (i.e., in the direction away from the semiconductor chip 2) of the semiconductor device 1 at the corners (four corners and corner portions) of an inner peripheral portion (inner peripheral portion of the second solder resist section 14b which is opposite to the first solder resist section 14a, and an inner peripheral portion of the second solder resist section 14b, which is opposite to the four sides of the semiconductor chip 2) of the second solder resist section 14b. That is, solder resist retraction portions 20b from which the base material layer 11 is exposed without forming a solder resist, are provided at the corners (four corners) of the inner peripheral portion of the second solder resist section 14b.

With the retraction of the pattern of the second solder resist section 14b at the corners (four corners) of the inner peripheral portion of the second solder resist section 14b (i.e., the provision of the solder resist retraction portions 20b), air is easy to escape from the space 21 between the outer peripheral portion 2d of the back surface 2c of the semiconductor chip 2 and the upper surface 3a of the wiring board 3 upon forming the encapsulating resin 5 in a transfer mold process or the like. Hence the flowability of the material for forming the encapsulating resin 5 can be enhanced and the charging property of the encapsulating resin into the space 21 can be further improved. It is therefore possible to further improve the adhesion (adhesive strength) between the semiconductor chip 2 and the encapsulating resin 5 and further enhance the reliability of the semiconductor device 1.

Figure 11:
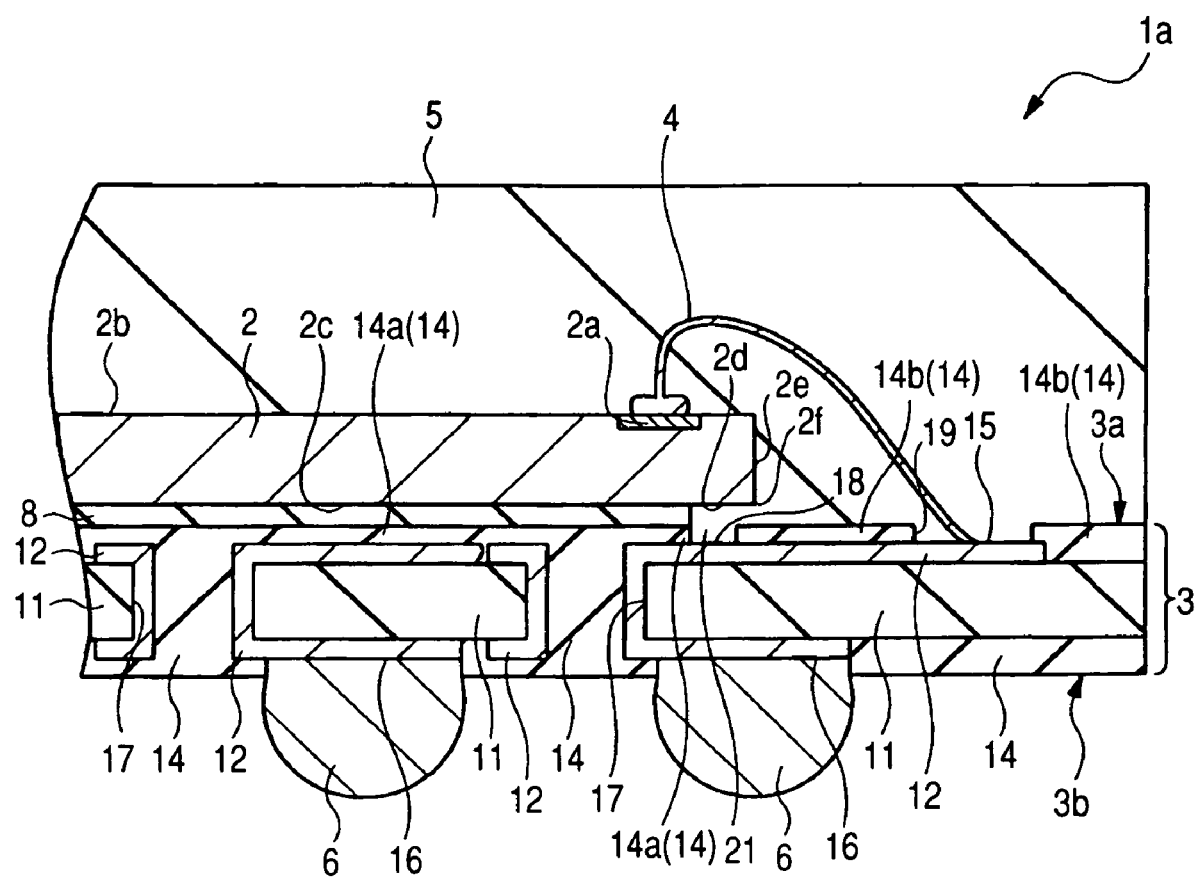
FIG. 11 is a fragmentary sectional view of a semiconductor device showing another embodiment of the present invention.
Figure 12:
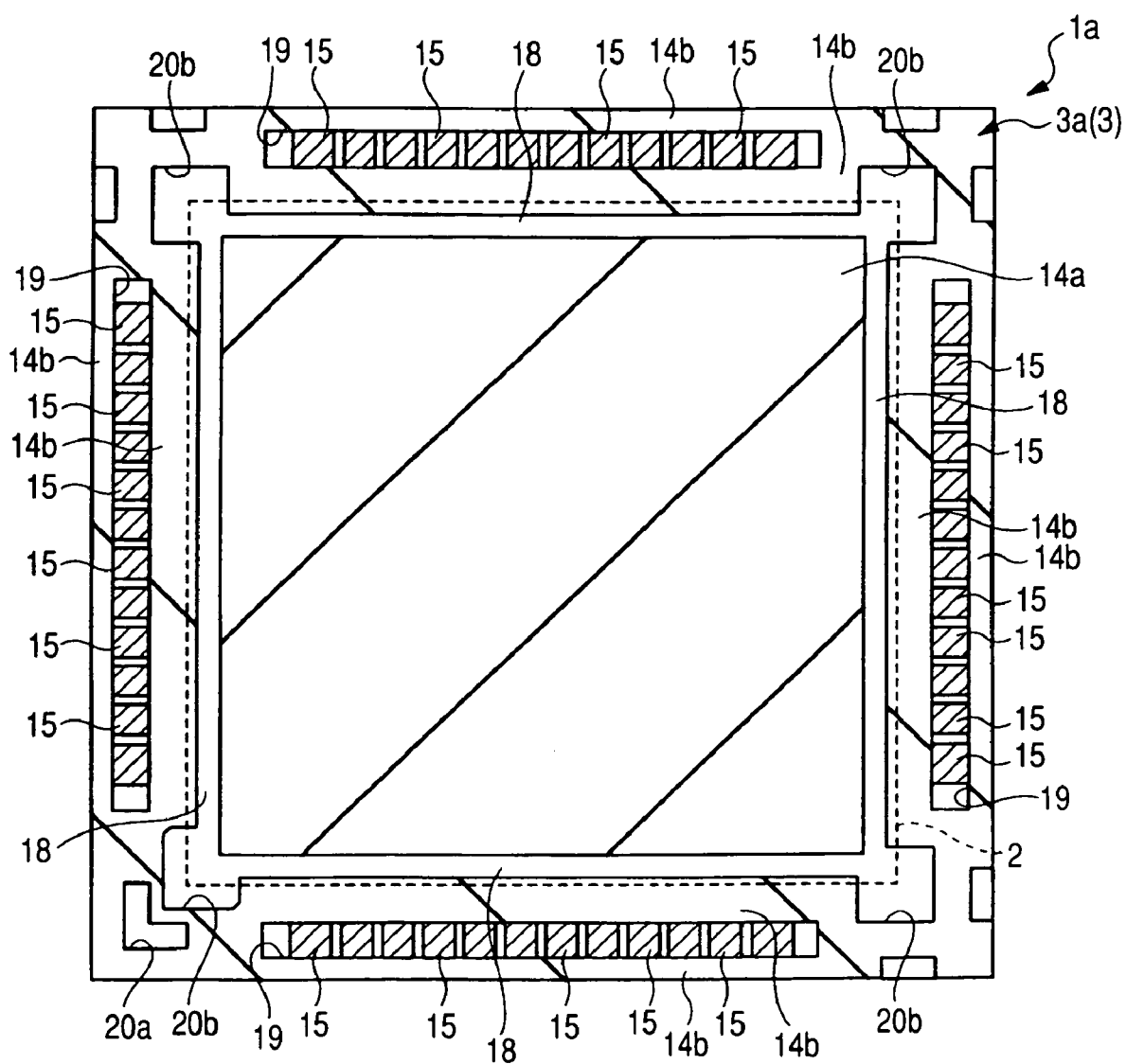
FIG. 12 is a plan perspective view of the semiconductor device shown in FIG. 11.
Figure 13:
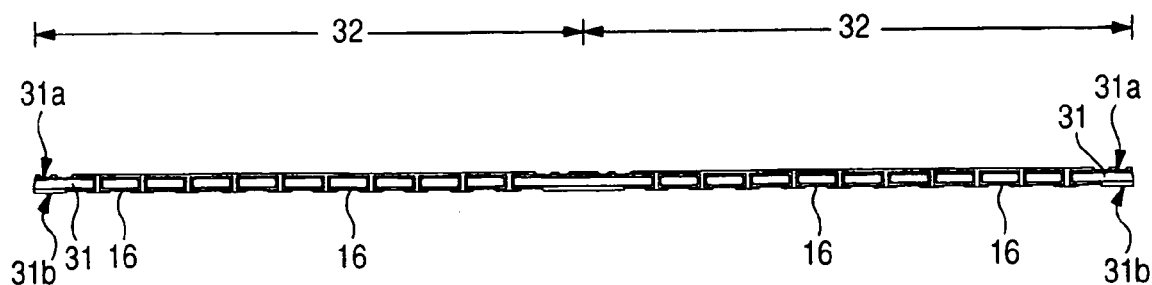
FIG. 13 is a sectional view in the process of manufacturing the semiconductor device showing the first embodiment of the present invention.

FIG. 11 is a fragmentary sectional view of a semiconductor device 1a according to another embodiment, and FIG. 12 is a plan perspective view (top view) thereof, respectively. FIG. 11 corresponds to FIG. 4. FIG. 12 is associated with FIG. 7 and shows a plan perspective view (top view) of the semiconductor device 1a as seen through an encapsulating resin 5, a semiconductor chip 2 and bonding wires 4, i.e., a top view of a wiring board 3 employed in the semiconductor device 1a. Incidentally, the outer shape of the semiconductor chip 2 is indicated by a dotted line in FIG. 12. Although FIG. 12 is a plan view, hatching is applied to each of a first solder resist section 14a, a second solder resist section 14b and connecting terminals 15 exposed from aperture parts or openings 19 of the second solder resist section 14b in order to provide easy understanding.

While each end 2f (each side surface 2e of the semiconductor chip 2) of the back surface 2c of the semiconductor chip 2 is placed over the area (dam area) 18 from which the base material layer 11 is exposed without the solder resist layer 14 being formed therein, in the semiconductor device 1, each end 2f (each side surface 2e of a semiconductor chip 2) of a back surface 2c of the semiconductor chip 2 is placed over the second solder resist section 14b in the semiconductor device 1a shown in FIGS. 11 and 12. The semiconductor device 1a is substantially similar in other configuration to the semiconductor device 1 referred to above.

The semiconductor device 1a is also capable of obtaining an advantageous effect substantially similar to the semiconductor device 1 and will be included in the semiconductor device of the present invention. However, where the end 2f (the side surface 2e of the semiconductor chip 2) of the back surface 2c of the semiconductor chip 2 is placed over the area (dam area) 18 as in the semiconductor device 1, the space 21 defined between the outer peripheral portion 2d of the back surface 2c of the semiconductor chip 2 and the upper surface 3a of the wiring board 3 can be made wider upon die-bonding the semiconductor chip 2 onto the upper surface 3a of the wiring board 3 as compared with the case in which the end 2f (the side surface 2e of the semiconductor chip 2) of the back surface 2c of the semiconductor chip 2 is placed over the second solder resist section 14b as in the semiconductor device 1a. Further, since the filler or the like becomes easy to enter into the space 21 below the outer peripheral portion 2d of the back surface 2c of the semiconductor chip 2 when the encapsulating resin 5 is formed, the ratio of components of the encapsulating resin 5 with which the space 21 is filled, and the ratio of components of the encapsulating resin 5 in other area can be uniformized. Therefore, the semiconductor device 1 is more advantageous to an improvement in the adhesion (adhesive strength) between the encapsulating resin 5 and the semiconductor chip 2 and an improvement in its reliability. On the other hand, the connecting terminals 15 can be made closer to the semiconductor chip 2 side by extending the second solder resist section 14b below the end 2f (the side surface 2e of the semiconductor chip 2) of the back surface 2c of the semiconductor chip 2 as in the semiconductor device 1a. Therefore, the semiconductor device 1a is more advantageous to its size reduction (reduction in its area).

Figure 21:
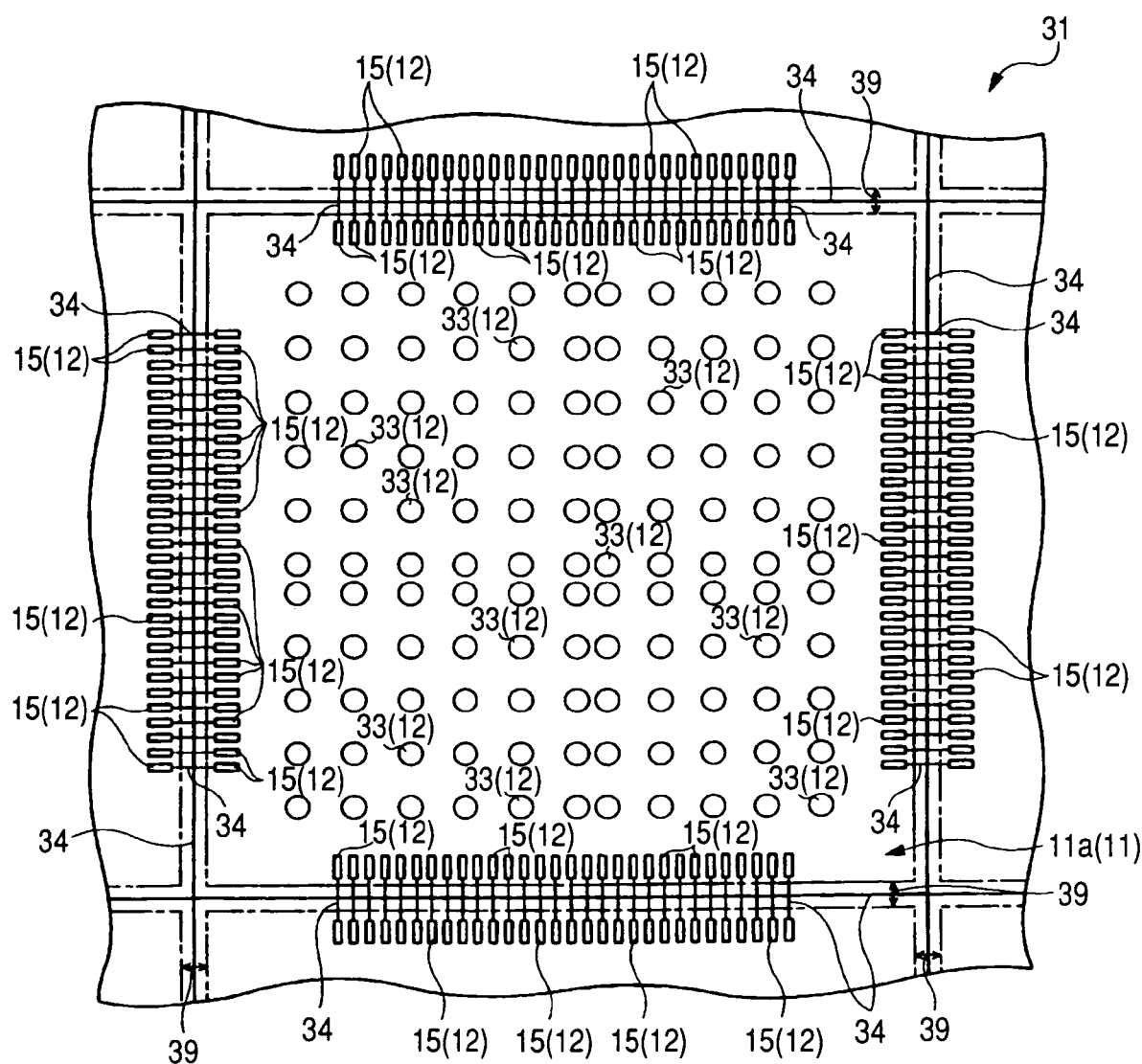
FIG. 21 is a plan view illustrating a process for manufacturing a wiring board.
Figure 22:
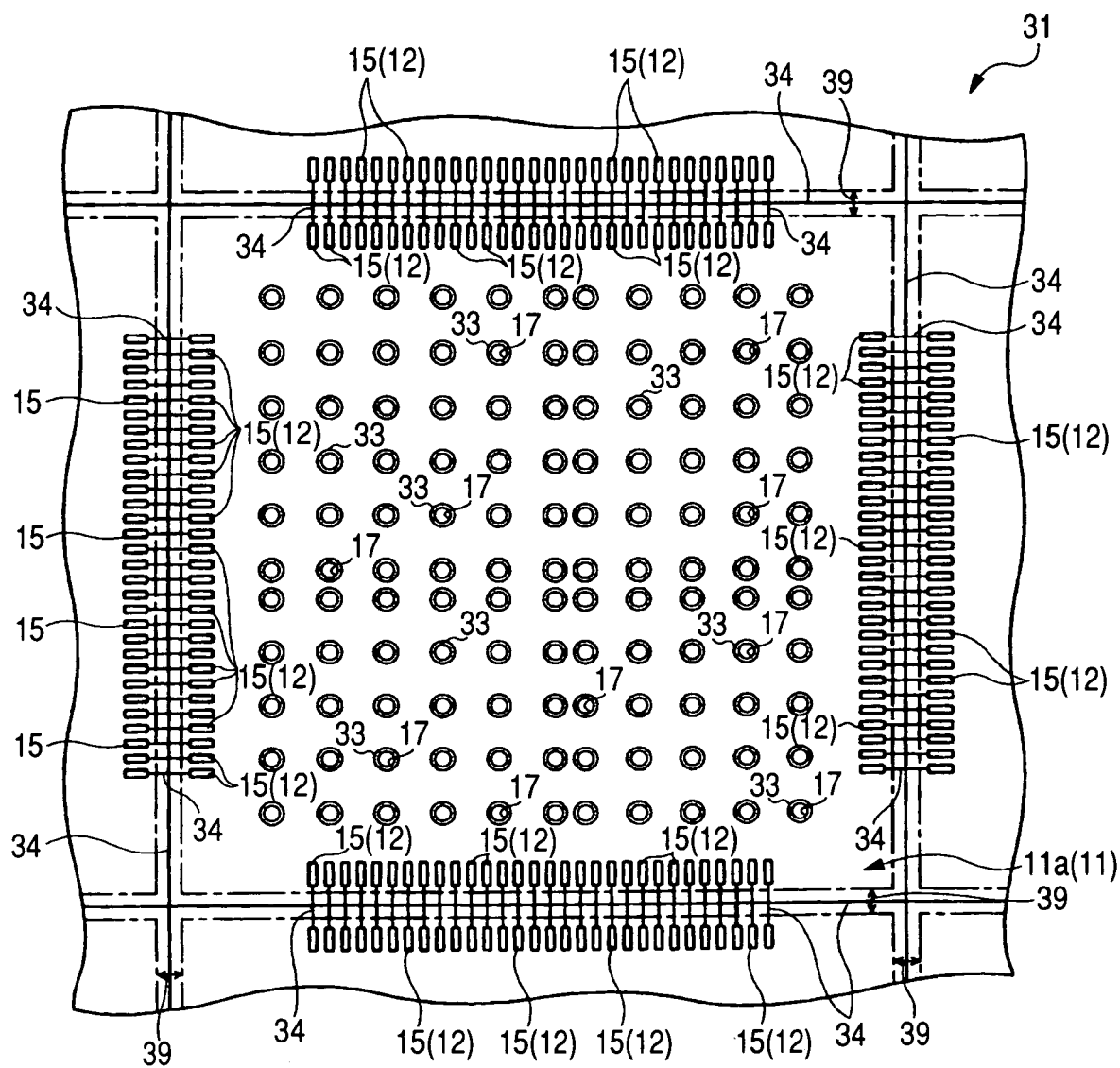
FIG. 22 is a plan view following FIG. 21 in the process of manufacturing the wiring board.
Figure 23:
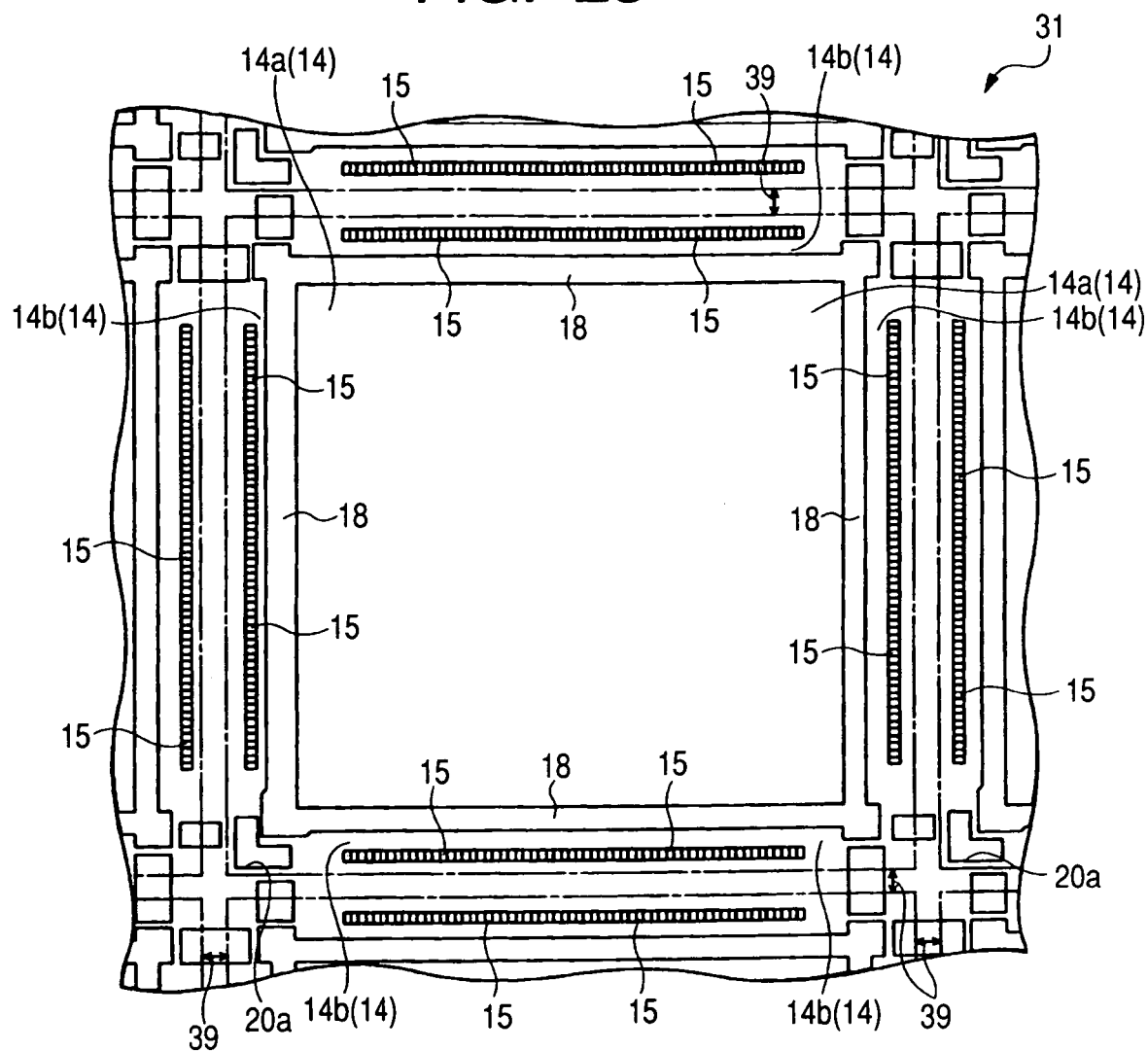
FIG. 23 is a plan view following FIG. 22 in the process of manufacturing the wiring board.
Figure 24:
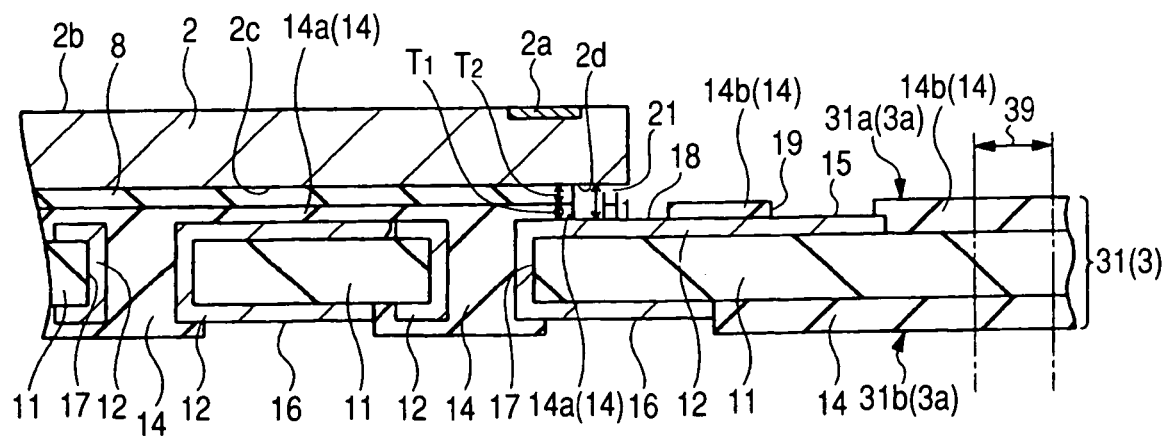
FIG. 24 is a fragmentary sectional view in the process of manufacturing the semiconductor device showing the first embodiment of the present invention.
Figure 25:
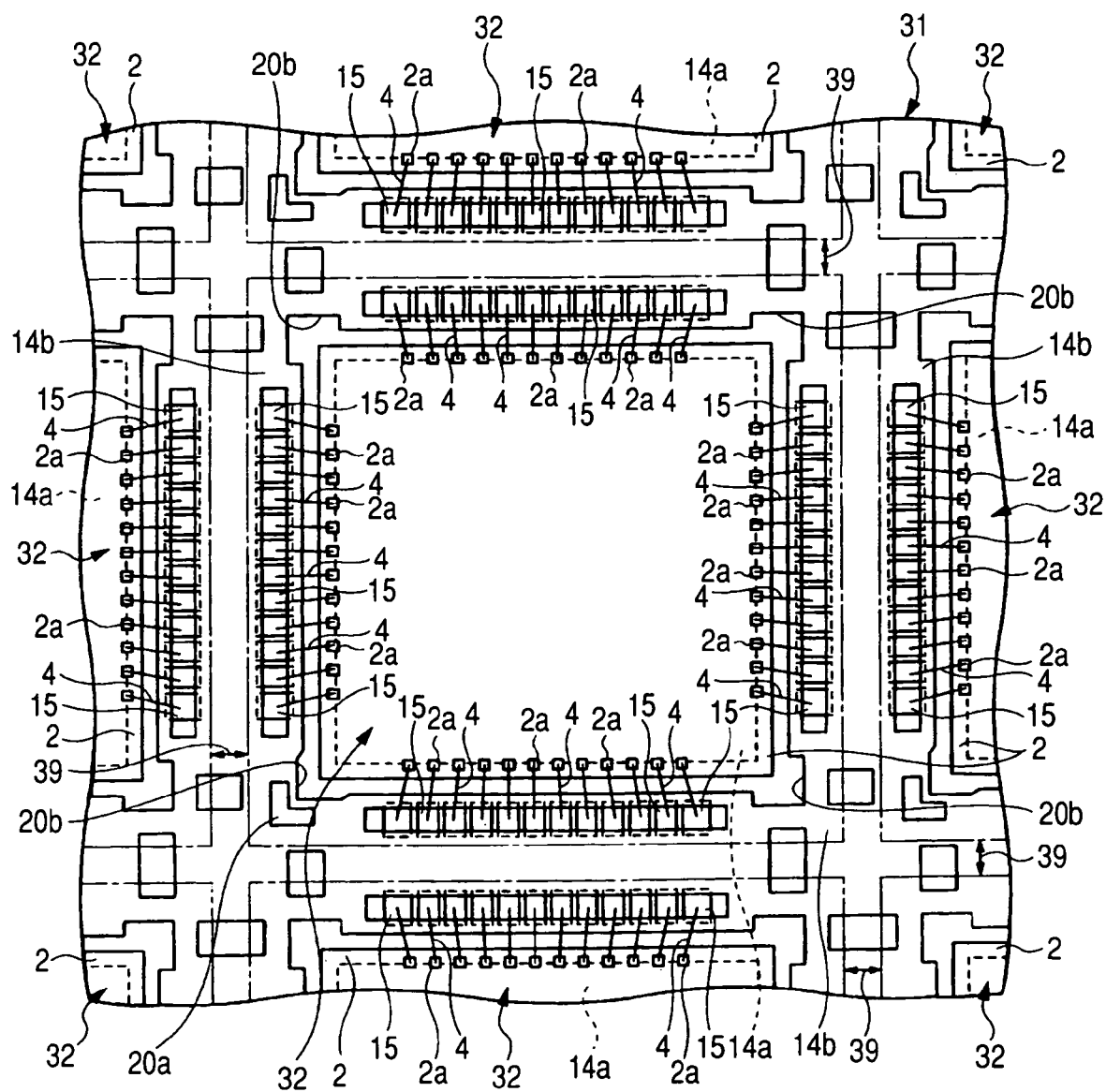
FIG. 25 is a plan view in the process of manufacturing the semiconductor device showing the first embodiment of the present invention.
Figure 26:
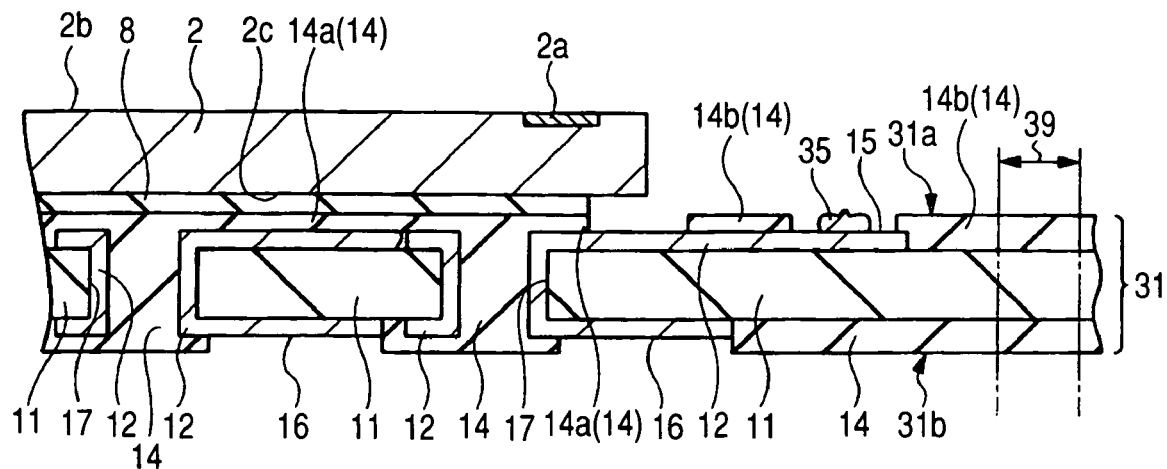
FIG. 26 is an explanatory view of a wire bonding process.
Figure 27:
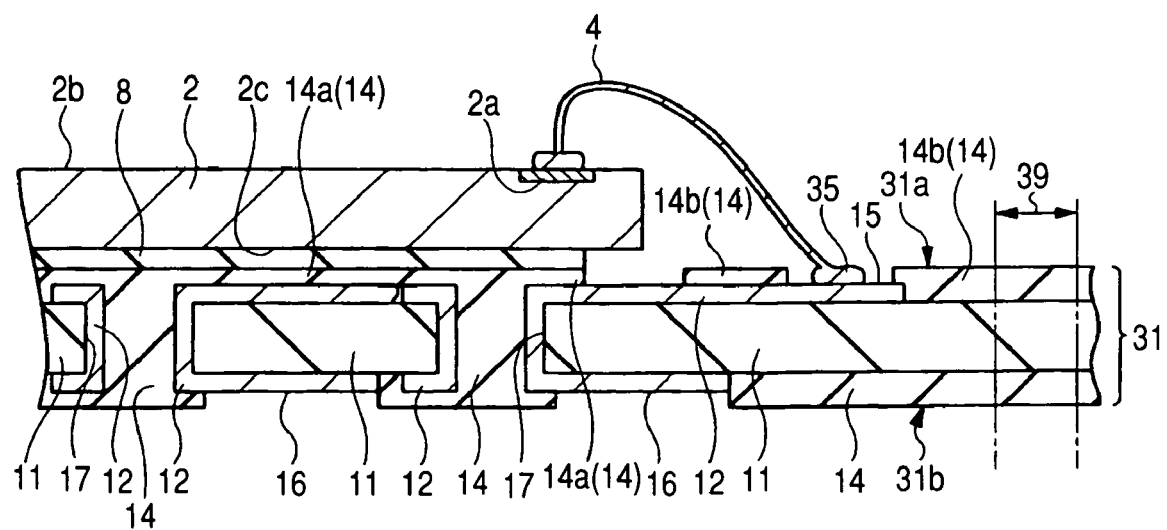
FIG. 27 is an explanatory view of the wire bonding process.
Figure 28:
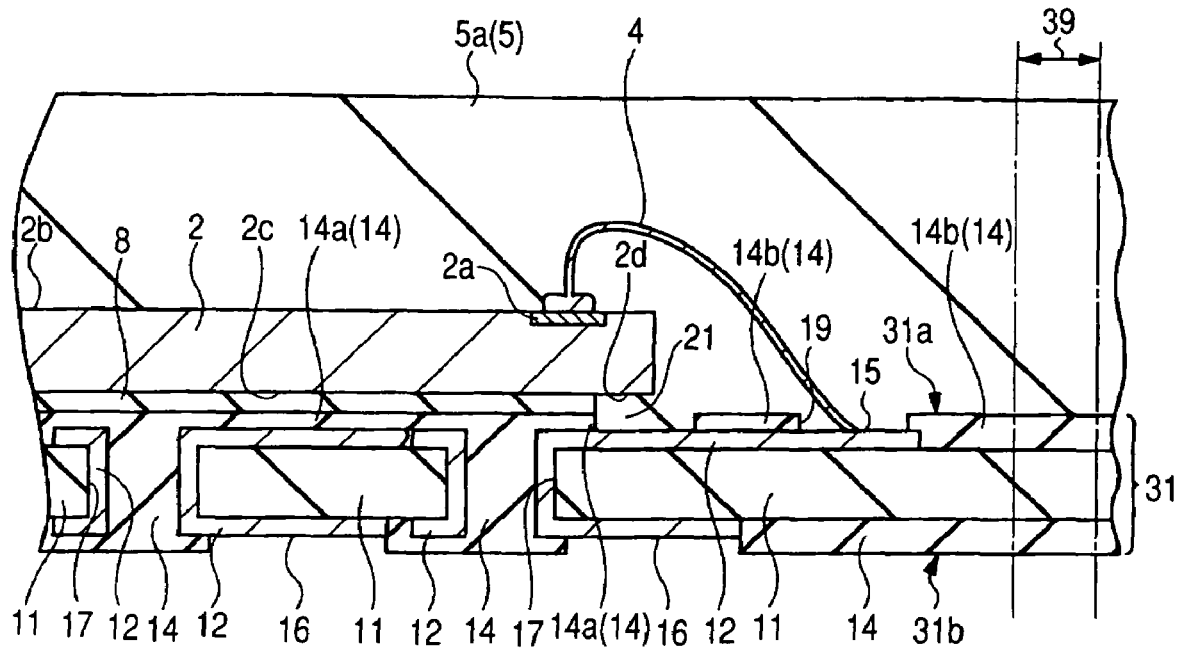
FIG. 28 is a fragmentary sectional view in the process of manufacturing the semiconductor device showing the first embodiment of the present invention.

A method for manufacturing the semiconductor device according to the present embodiment will next be explained with reference to the accompanying drawings. FIGS. 13 through 20 are respectively sectional views in the process of manufacturing the semiconductor device according to the present embodiment. FIGS. 21 through 23 are respectively plan views (top views) typically showing one example of a process for manufacturing a wiring board 31, which is used in the manufacture of the semiconductor device 1 according to the present embodiment. FIG. 24 is a fragmentary sectional view in the process of manufacturing the semiconductor device according to the present embodiment and corresponds to the same process step (die bonding process) as FIG. 14. FIG. 25 is a plan view (top view) in the process of manufacturing the semiconductor device according to the present embodiment and corresponds to the same process step as FIG. 15. FIGS. 26 and 27 are respectively explanatory views (fragmentary sectional views) of a wire bonding process. FIG. 28 is a fragmentary sectional view in the process of manufacturing the semiconductor device according to the present embodiment and corresponds to the same process step (mold process) as FIG. 16. Dicing areas (dicing lines) 39 for cutting the wiring board 31 in a cutting process to be described later are also shown in FIGS. 21 through 28.

Incidentally, the present embodiment will explain a case in which individual semiconductor devices 1 are manufactured using a multicavity wiring board (wiring board mother body) 31 wherein a plurality of wiring boards 3 are formed so as to be connected in array form. The wiring board 31 is a mother body of the wiring boards 3. The wiring board 31 is cut in the cutting process to be described later so as to be separated into semiconductor device areas (substrate areas and unit substrate areas) 32. The so-cut ones correspond to the wiring boards 3 of the semiconductor devices 1 respectively. The wiring board 31 has a configuration wherein the semiconductor device areas (substrate areas and unit substrate areas) 32 each corresponding to an area in which one semiconductor device 1 is formed therefrom, are arranged plural pieces in matrix form.

A wiring board 31 is first prepared. The wiring board 31 can be manufactured in the following manner, for example.

An electroless copper-plated layer is formed over an upper surface 11a and a lower surface of an insulative base material layer 11 used as a core material by an electroless plating method. The electroless copper-plated layer is patterned by etching or the like. Then, an electrolytic copper-plated layer is formed over the electroless copper-plated layer by an electrolytic plating method to thicken the thickness of a copper layer. The conductor layer 12 can be formed by a laminated film (copper layer) of the electroless copper-plated layer and the electrolytic copper-plated layer. FIG. 21 shows a state in which conductor patterns 33 for through holes and (conductor patterns for) connecting terminals 15 are being formed over the upper surface of the base material layer 11 by the laminated film (conductor layer 12) of the electroless copper-plated layer and the electrolytic copper-plated layer. The connecting terminals 15 and the conductor patterns 33 are respectively electrically connected by lead-out wires (not shown) each constituted of the laminated film (conductor layer 12) of the electroless copper-plated layer and the electrolytic copper-plated layer formed over the upper surface 11a of the base material layer 11. Although not shown in the figures, lands 16 are also formed at the lower surface of the base material layer 11 by the laminated film of the electroless copper-plated layer and the electrolytic copper-plated layer. Since the electrolytic plating method is used, plated wires (power-feeding wires) 34 are also formed in the upper surface 11a of the base material layer 11. A predetermined potential (power) is supplied via the plated wires 34 and thereby the electrolytic copper-plated layer can be formed over the electroless copper-plated layer.

Next, as shown in FIG. 22, aperture parts or openings (through holes, vias and via or perforated holes) 17 are defined in the base material layer 11. The openings are formed inside the conductor patterns 33 for the through holes.

Next, an electroless copper-plated layer is formed over each of sidewalls of the openings 17 by the electroless plating method. The electroless copper-plated layer formed over each of the sidewalls of the openings 17 of the base material layer 11 results in the conductor layer 12. Then, as shown in FIG. 23, a solder resist layer 14 is formed over the upper surface 11a and lower surface of the base material layer 11 so as to bury the interiors of the openings 17 by using a printing method or the like. Thus, a first solder resist section 14a and a second solder resist section 14b are formed in the upper surface 11a of the base material layer 11. At the upper surface 11a of the base material layer 11, the connecting terminals 15 are exposed from their corresponding openings of the solder resist layer 14 (second solder resist section 14b). At the lower surface of the base material layer 11, the lands 16 are exposed from their corresponding openings of the solder resist layer 14. Next, a nickel plated layer and a gold plated layer are formed over the exposed portions (i.e., connecting terminals 15 and lands 16) of the copper plated layer placed over the upper surface 11a and lower surface of the base material layer 11 in sequence by the electrolytic plating method. Thereafter, the base material layer 11 is outer-processed (cut) as needed to enable the formation of a wiring board 31. The wiring board 31 prepared in this way is divided in the process of cutting the wiring board 31 to be described later to provide a plurality of semiconductor device areas (substrate areas and unit substrate areas) 32 used as wiring boards 3. The wiring board 31 includes first solder resist sections 14a formed in the respective semiconductor device areas 32 of an upper surface 31a of the wiring board 31, and second solder resist sections 14b formed at the outer peripheries of the first solder resist sections 14a.

Figure 14:
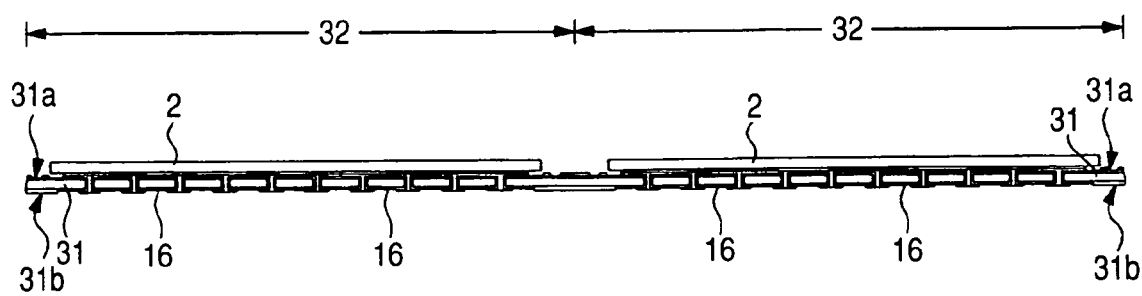
FIG. 14 is a sectional view following FIG. 13 in the process of manufacturing the semiconductor device.

As shown in FIGS. 14 and 24, semiconductor chips 2 are bonded (die-bonded and chip-mounted) onto the respective semiconductor device areas 32 of the upper surface 31a of the wiring board 31 prepared in the above described manner via adhesives 8. In this die bonding process, for example, thermosetting adhesives 8 are applied onto the first solder resist sections 14a of the respective semiconductor device areas 32 of the upper surface 31a of the wiring board 31 to form chip-fixing adhesive layers over the first solder resist sections 14a. Then the semiconductor chips 2 are respectively placed over the adhesives 8, and the adhesives 8 are cured by heating or the like to bond back surfaces 2c of the semiconductor chips 2 and their corresponding first solder resist sections 14a via the adhesives 8 interposed therebetween. Since each of the semiconductor chips 2 is bonded onto the first solder resist section 14a smaller in plane dimension (area) than the semiconductor chip 2 via the adhesive 8 interposed therebetween in the die bonding process of each semiconductor chip 2 as described above, the solder resist layer 14 (first solder resist section 14a and second solder resist section 14b) and the adhesive 8 do not extend (exist) below an outer peripheral portion 2d of the back surface 2c of the semiconductor chip 2. Therefore, when the semiconductor chip 2 is bonded onto each of the respective semiconductor device areas 32 of the wiring board 31, space 21 is defined between the outer peripheral portion 2d of the back surface 2c of the semiconductor chip 2 and its corresponding upper surface 3a of each wiring board 3. A vertical size $H_1$ of the space 21 is substantially equivalent to the sum of a thickness $T_1$ of the first solder resist section 14a and a thickness $T_2$ of the adhesive 8 ($H_1 = T_1 + T_2$). The vertical size $H_1$ of the space 21 can be rendered large relatively. Assuming that, for example, the thickness $T_2$ of the adhesive 8 ranges from approximately 20 to 30 μm, and the thickness $T_1$ of the first solder resist section 14a ranges from approximately 20 to 30 μm, the vertical size $H_1$ of the space 21 can be set to approximately 40 to 60 μm.

Figure 15:
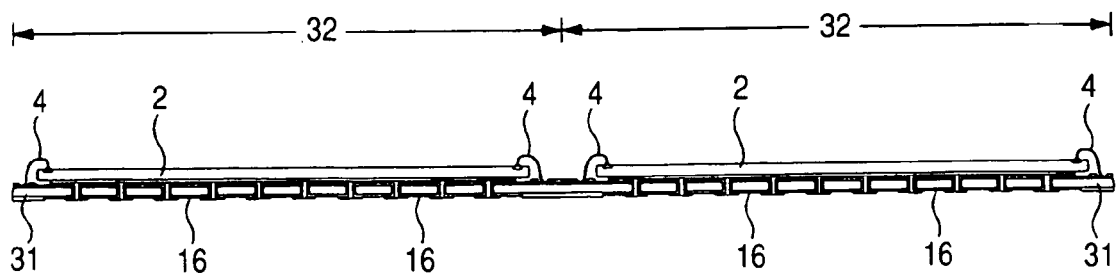
FIG. 15 is a sectional view following FIG. 14 in the process of manufacturing the semiconductor device.

Next, as shown in FIGS. 15 and 25, a wire bonding process is performed to electrically connect respective electrodes 2a of the semiconductor chips 2 and their corresponding connecting terminals 15 formed in the wiring board 31 via bonding wires 4. That is, the plurality of connecting terminals 15 placed over the respective semiconductor device areas 32 of the back surface 31a of the wiring board 31, and the plurality of electrodes 2a of the semiconductor chips 2 bonded onto the semiconductor device areas 32 are respectively electrically connected via the plural bonding wires 4. Using a wire bonding apparatus, for example, one ends of the bonding wires 4 are connected to their corresponding electrodes 2a of the semiconductor chips 2 (first bonding), and thereafter the other ends of the bonding wires 4 are connected to their corresponding connecting terminals 15 of the wiring board 31 (second bonding).

In the present wire bonding process, stud bumps (bump electrodes and bumps) 35 each made up of gold (Au) are formed at their corresponding connecting terminals 15 of the wiring board 31 as shown in a fragmentary sectional view of FIG. 26 as another form or embodiment. Thereafter, as shown in FIG. 27, one ends of bonding wires 4 are connected to their corresponding electrodes 2a of the semiconductor chips 2 and thereafter the other ends of the bonding wires 4 can also be connected to their corresponding stud bumps 35 formed over the connecting terminals 15 of the wiring board 31. Even though the angles which the bonding wires 4 form with the connecting terminals 15 become sharp (close to the vertical angle, for example) and folding stress with respect to the bonding wires 4 becomes large by, for example, forming the connecting terminals 15 at positions relatively close to the semiconductor chips 2 or using semiconductor chips 2 relatively thick in thickness, the stud bumps 35 are formed over their corresponding connecting terminals 15 and the bonding wires 4 are respectively connected to the stud bumps 35, whereby the strength of connection between the bonding wires 4 and the connecting terminals 15 (stud bumps 35) can be enhanced, and peeling of the bonding wires 4 from the connecting terminals 15 (stud bumps 35) can be suppressed or prevented. Therefore, the distance between each of the connecting terminals 15 and the semiconductor chip 2 can be rendered small, and the plane dimension of the semiconductor device 1 can be reduced. The use of each semiconductor chip 2 relatively thick in thickness is also enabled and hence the scope of selection of each semiconductor chip 2 can be expanded.

Figure 16:
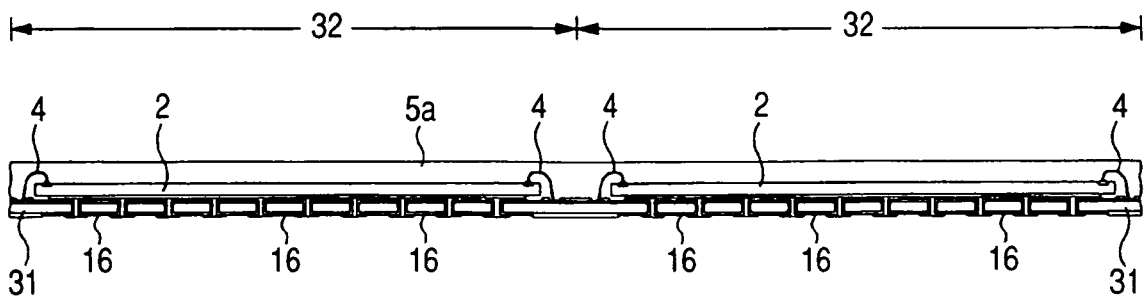
FIG. 16 is a sectional view following FIG. 15 in the process of manufacturing the semiconductor device.

As shown in FIGS. 16 and 28, resin encapsulation based on a mold process (e.g., transfer mold process) is carried out after the wire bonding process to form an encapsulating resin 5a (sealing or encapsulating section) The semiconductor chip 2 and the bonding wires 4 are sealed with the encapsulating resin 5a. In the mold process, batch encapsulation for collectively sealing the plural semiconductor device areas 32 of the upper surface 31a of the wiring board 31 with the encapsulating resin 5a is performed. That is, the encapsulating resin 5a is formed over the plural semiconductor device areas 32 of the upper surface 31a of the wiring board 31 so as to cover the semiconductor chips 2 and the bonding wires 4. Therefore, the encapsulating resin 5a is formed so as to cover the plurality of semiconductor device areas 32 of the upper surface 31a of the wiring board 31. The encapsulating resin 5a comprises a resin material such as a thermosetting resin material and can also contain a filler or the like. The encapsulating resin 5a can be formed using an epoxy resin or the like containing a filler, for example.

In the mold process, the material for forming the encapsulating resin 5a is charged even into the space 21 below the outer peripheral portion 2d of the back surface 2c of each semiconductor chip 2. Since the vertical size $H_1$ of the space 21 below the outer peripheral portion 2d of the back surface 2c of each semiconductor chip 2 is relatively large in the present embodiment, the filler or the like contained in the material for forming the encapsulating resin 5a is easy to intrude into the space 21 below the outer peripheral portion 2d of the back surface 2c of the semiconductor chip 2, and the ratio of components of the encapsulating resin 5a with which the space 21 is filled (charged) and the ratio of components of the encapsulating resin 5a in other area are uniformized in the mold process. Therefore, the adhesion (adhesive strength) between the cured encapsulating resin 5a and each semiconductor chip 2 can be enhanced.

Figure 17:
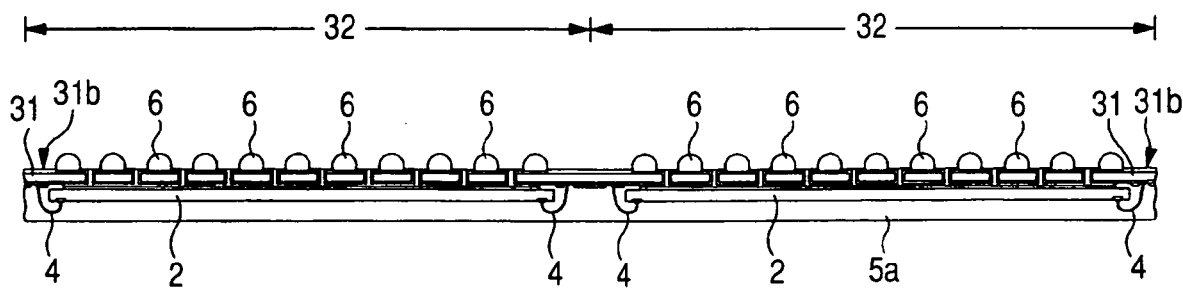
FIG. 17 is a sectional view following FIG. 16 in the process of manufacturing the semiconductor device.

Next, as shown in FIG. 17, solder balls 6 are connected (bonded) onto their corresponding lands 16 at the lower surface 31b of the wiring board 31. For example, the lower surface 31b of the wiring board 31 is turned upward, and the plurality of solder balls 6 are respectively disposed over the plurality of lands 16 at the lower surface 31b of the wiring board 31 and temporarily fixed by means of flux or the like. Then, reflow processing (solder reflow processing and thermal processing) is effected thereon to melt solder, whereby the solder balls 6 and the lands 16 at the lower surface 31b of the wiring board 31 can be bonded to one another. Thereafter, a cleaning process step is carried out as needed so that the flux or the like adhered to the surfaces of the solder balls 6 can also be removed. Thus, the solder balls 6 used as the external terminals of the semiconductor device 1 are bonded onto the lands 16 in this way. Incidentally, although the present embodiment has explained the case where the solder balls 6 are bonded as the external terminals of the semiconductor device 1, the present invention is not limited thereto. For example, solder is supplied onto the lands, so that external terminals (bump electrodes) of the semiconductor device 1 can also be formed in place of the solder balls 6 by a printing method or the like. Although the semiconductor device 1 has been described as the semiconductor device of the BGA (Ball Grid Array) configuration, the present invention is not limited to it. The formation of the solder balls 6 is omitted and the semiconductor device 1 can also be formed as a semiconductor device of an LGA (Land Grid Array) configuration. As the material for the external terminals (solder balls 6 here) of the semiconductor device 1, lead-free solder uncontaining lead-containing solder and lead can be used. The external terminals (bump electrodes) of the semiconductor device 1 can also be formed by plating (e.g., gold plating or Pd plating or the like).

Figure 18:
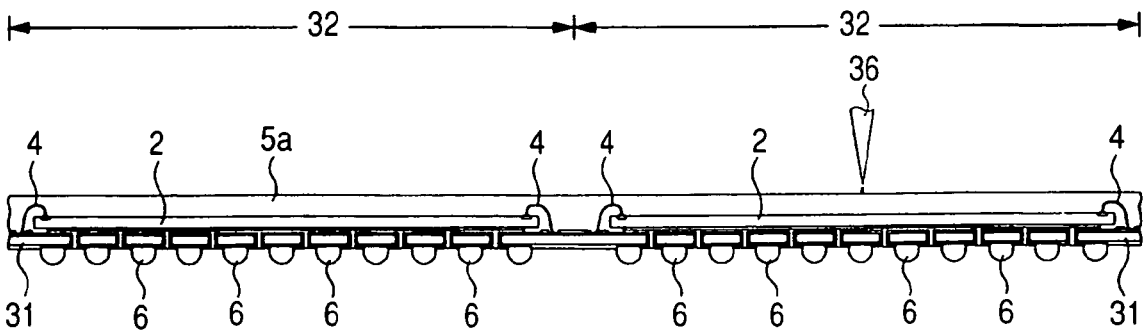
FIG. 18 is a sectional view following FIG. 17 in the process of manufacturing the semiconductor device.

Next, as shown in FIG. 18, marking is made to apply a mark such as a product number or the like to the surface of the encapsulating resin 5a. While, for example, laser marks for performing marking by means of laser 36 can be made, ink marks for performing marking by means of ink can also be made. The order of the connecting process of the solder balls 6 shown in FIG. 17 and the marking process of FIG. 18 is interchanged, and the connecting process of the solder balls 6 shown in FIG. 17 can also be done after the execution of the marking process of FIG. 18.

Figure 19:
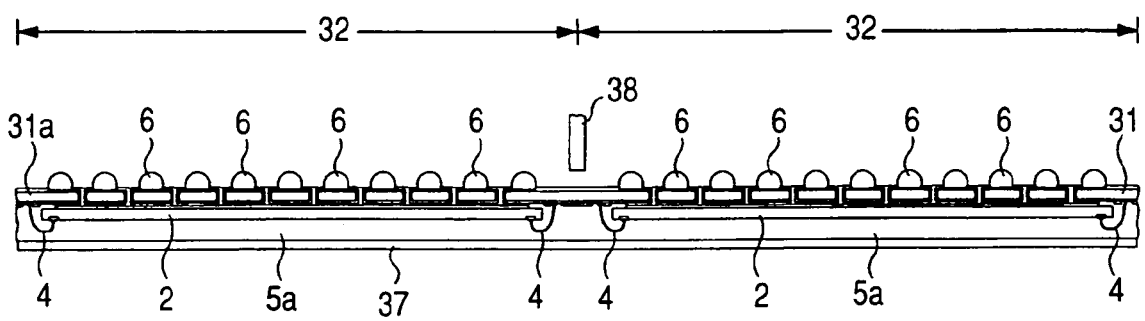
FIG. 19 is a sectional view following FIG. 18 in the process of manufacturing the semiconductor device.
Figure 20:
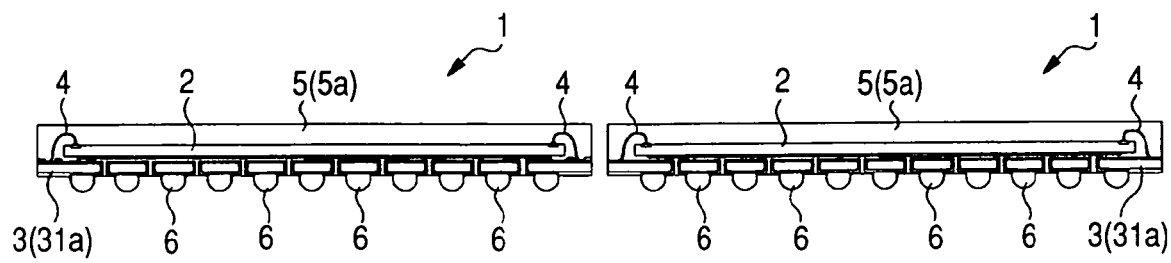
FIG. 20 is a sectional view following FIG. 19 in the process of manufacturing the semiconductor device.

Next, as shown in FIG. 19, the upper surface of the encapsulating resin 5a is applied onto a package fixing tape 37. The wiring board 31 and the encapsulating resin 5a formed thereon are cut (diced) by a dicing blade 38 or the like along the dicing areas (dicing lines) 39 to cut separate the respective semiconductor device areas (CSP areas) into individual (fractionalized) semiconductor devices 1 (CSPs). That is, the wiring board 31 and the encapsulating resin 5a are cut and separated into the respective semiconductor device areas 32. By performing cutting/fractionalization in this way, such a semiconductor device 1 as shown in FIGS. 1 through 7 can be fabricated. The wiring board 31 cut and separated (divided) into the respective semiconductor device areas 32 correspond to the wiring board 3, and the encapsulating resin 5a cut and separated (divided) into the respective semiconductor device areas 32 corresponds to the encapsulating resin 5.

Figure 29:
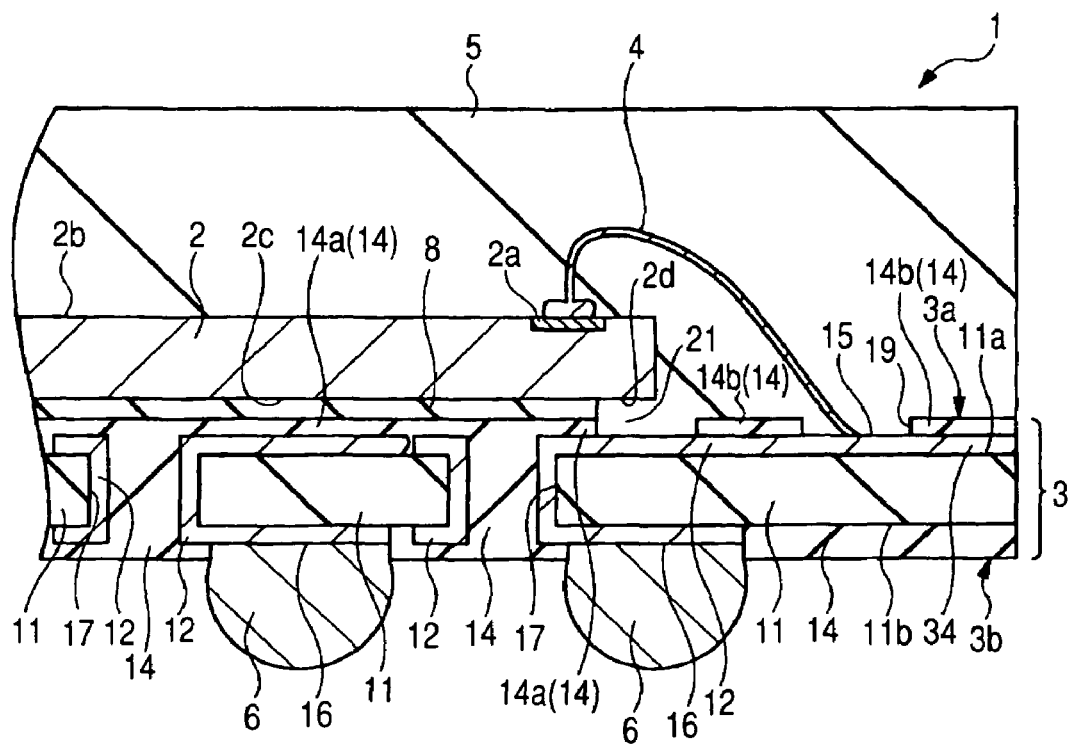
FIG. 29 is another fragmentary sectional view of the semiconductor device showing the first embodiment of the present invention.

FIG. 29 is another fragmentary sectional view (partly enlarged sectional view) of an end nearby area of the semiconductor device 1 manufactured in the above-described manner. A cross section of an area different from FIG. 4 is shown. Since the conductor layer 12 of the wiring board 3 (wiring board 31) is formed using the electrolytic plating method as described above, each of the plated wires 34 exists at the peripheral portion (between the end of the upper surface 11a of the base material layer 11 and the connecting terminals 15) of the upper surface 11a of the base material layer 11 constituting the wiring board 3. In the present embodiment, the plated wire 34 is covered with the solder resist layer 14 (second solder resist section 14b) from thereabove so as to avoid contact between the plated wire 34 and the encapsulating resin 5.

When a gold plated layer is formed over the connecting terminals 15 where the solder resist layer 14 is not formed over the plated wire 34 as distinct from the present embodiment, the gold plated layer is formed even over the plated wire 34. When the encapsulating resin 5 (encapsulating resin 5a) is formed, each plated wire 34 formed with the gold plated layer at its upper surface, and the encapsulating resin 5 are brought into direct contact with each other. Since the adhesion between the encapsulating resin 5 and the electrolytic gold plated layer is lower than that between the solder resist layer 14 and the encapsulating resin 5 in this case, the adhesion between the plated wire 34 and the encapsulating resin 5 is degraded. Since a boundary face (boundary face between the plated wire 34 and the encapsulating resin 5) low in adhesion is exposed at the side surface of each semiconductor device after fractionalization, a failure in moisture absorption such as intrusion of dampness (moisture) from the boundary face is brought about. Peeling of the encapsulating resin 5 due to degradation of the adhesion, and rust and oxidation of the bonding wires 4 due to moisture occur due to the failure in moisture absorption, thereby causing a possibility that the reliability of the semiconductor device will be degraded.

In the present embodiment, when the conductor layer 12 of the wiring board 3 (wiring board 31) is formed using the electrolytic plating method, the plated wires 34 are covered from above with the solder resist layer 14 (second solder resist section 14b) so as to avoid contact between the plated wires 34 and the encapsulating resin 5. Further, the boundary face low in adhesion is prevented from being formed at the side surface of the semiconductor device. It is therefore possible to suppress the failure in moisture absorption from the side surface of the semiconductor device and enhance the reliability of the semiconductor device.

Second Preferred Embodiment

Figure 30:
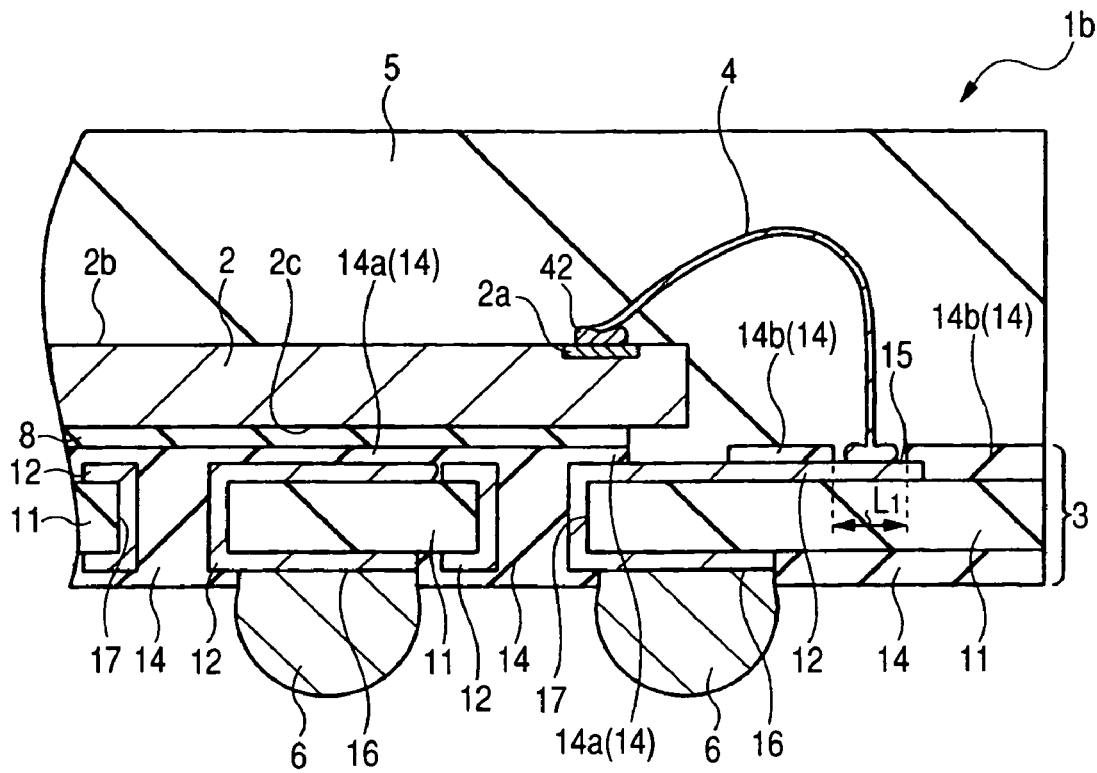
FIG. 30 is a fragmentary sectional view of a semiconductor device illustrating a second embodiment of the present invention.
Figure 31:
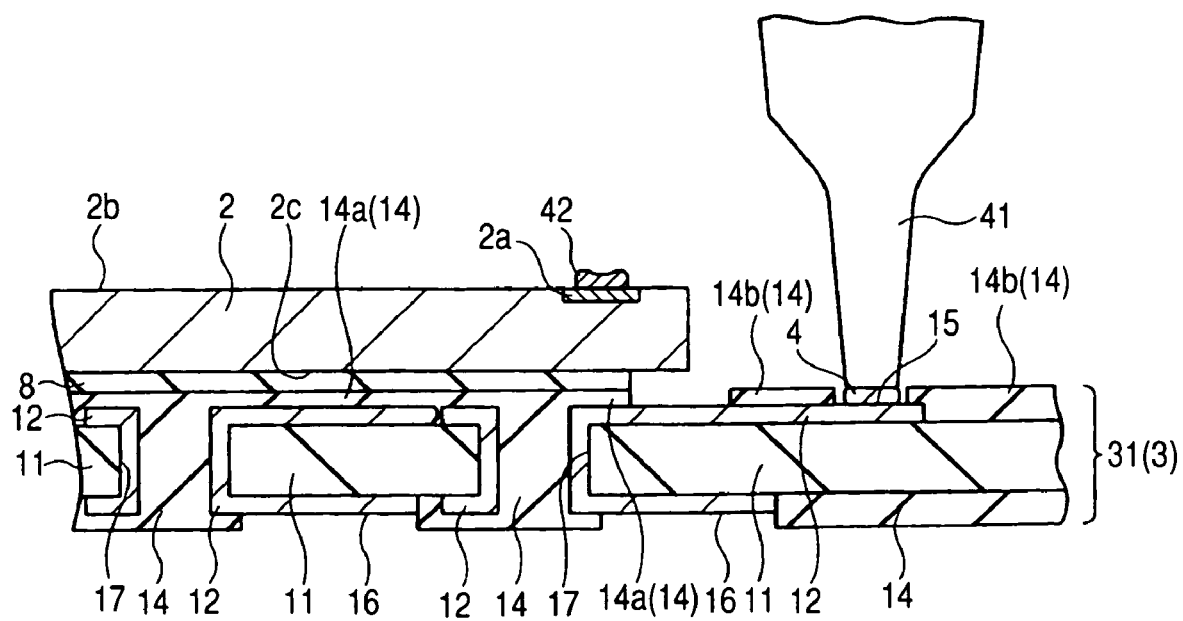
FIG. 31 is an explanatory view of a wire bonding process.
Figure 32:
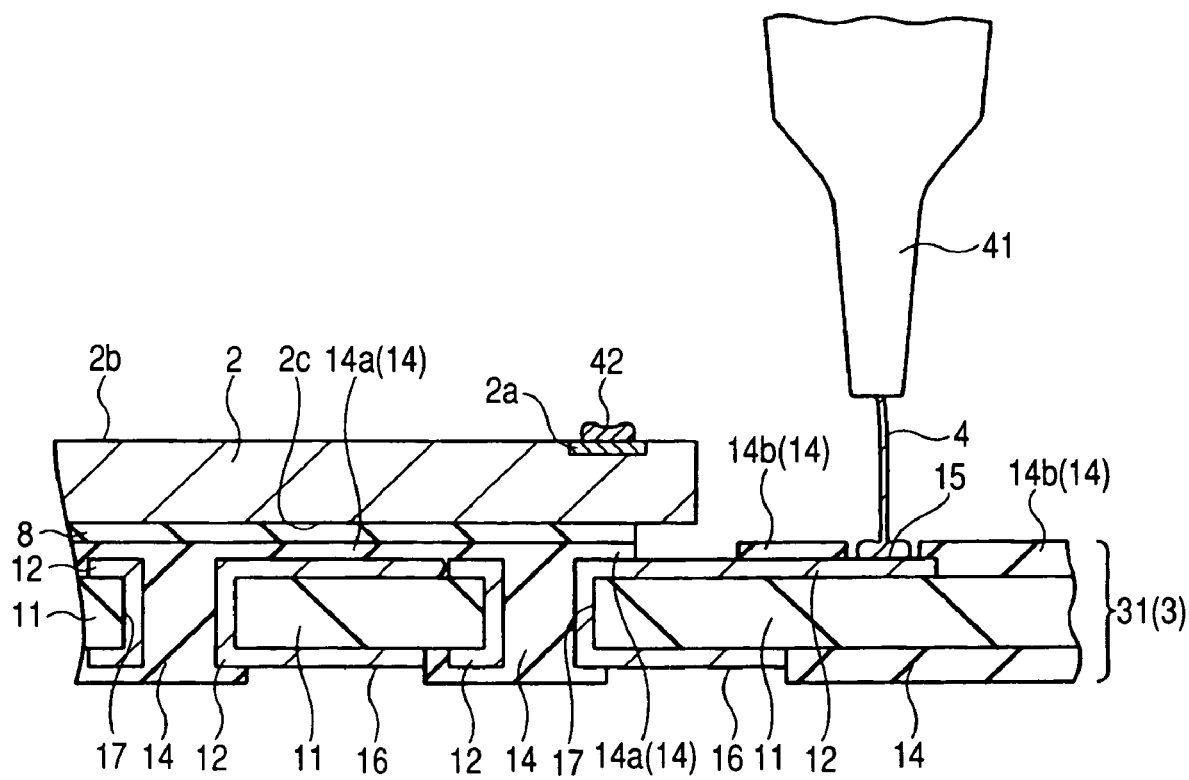
FIG. 32 is an explanatory view of the wire bonding process.

FIG. 30 is a fragmentary sectional view in the process of manufacturing a semiconductor device 1b showing a second embodiment of the present invention. An area substantially corresponding to FIG. 4 of the first embodiment is shown therein. FIGS. 31 and 32 are respectively explanatory views (fragmentary sectional views) of a wire bonding process employed in the present embodiment.

Since the process of manufacturing the semiconductor device 1b according to the present embodiment is substantially similar to the first embodiment except for the wire bonding process, its description will be omitted. The wire bonding process in the process of manufacturing the semiconductor device 1b according to the present embodiment will be described.

In the first embodiment, one ends of the bonding wires 4 are previously connected (first bonded) to their corresponding electrodes 2a of the semiconductor chip 2, and thereafter the other ends thereof are connected (second bonded) to their corresponding connecting terminals 15 of the wiring board 31. In the present embodiment, however, one ends of bonding wires 4 are first connected (first bonded) to their corresponding connecting terminals 15 of a wiring board 31, and thereafter the other ends thereof are connected (second bonded) to their corresponding electrodes 2a of a semiconductor chip 2.

That is, as shown in FIG. 31, the leading end or tip of each of the bonding wires 4 made up of gold (Au) held by a capillary 41 of a wire bonding apparatus for formation of the bonding wires 4 is first pressed against and connected to the surface of each of the connecting terminals 15 of the wiring board 31 while ultrasound is being applied thereto. Then, as shown in FIG. 32, the capillary 41 is pulled up and moved in the horizontal direction. The bonding wire 4 is connected to the front surface of the electrode 2a of the semiconductor chip 2 by being rubbed against each other while the ultrasound is being applied thereto, after which the bonding wire 4 is cut. Thus, the connecting terminals 15 of the wiring board 31 and the electrodes 2a of the semiconductor chip 2 can electrically be connected to one another via the bonding wires 4 respectively. The semiconductor device 1b shown in FIG. 30 can be manufactured by performing wire bonding in this way.

Figure 33:
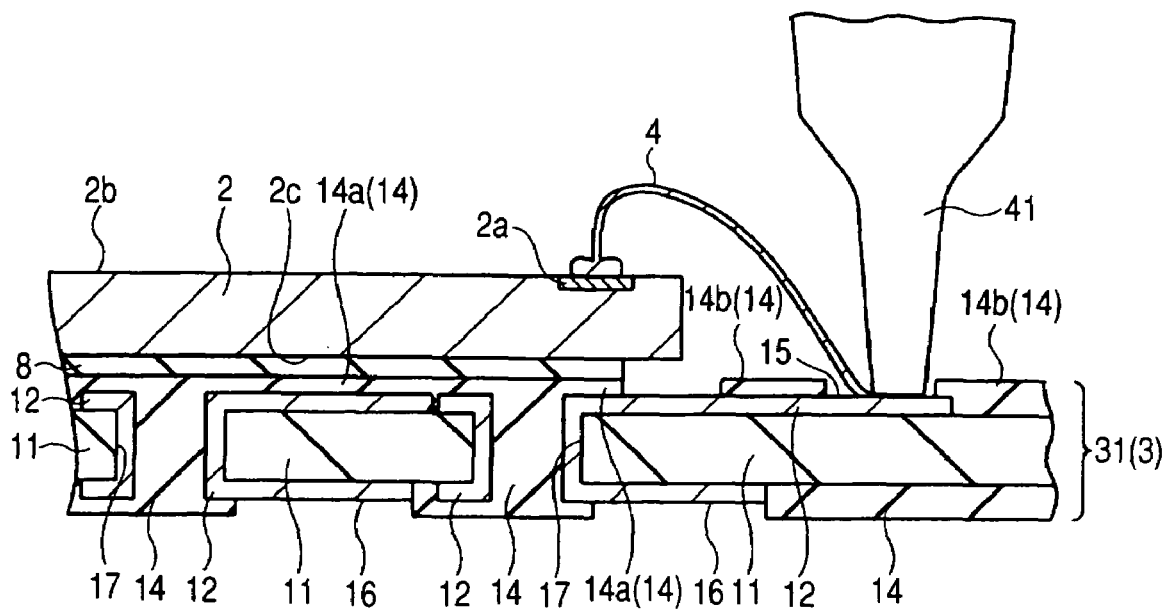
FIG. 33 is an explanatory view of the wire bonding process.

FIG. 33 is different from the present embodiment and is a fragmentary sectional view showing the manner in which one ends of bonding wires 4 are first connected (first bonded) to their corresponding electrodes 2a of a semiconductor chip 2 and thereafter the other ends thereof are connected (second bonded) to their corresponding connecting terminals 15 of the wiring board 31. When one end of the bonding wire 4 is firstly connected to the electrode 2a of the semiconductor chip 2 as shown in FIG. 33, the bonding wire 4 is positioned between a capillary 41 and the semiconductor chip 2 when the capillary 41 is moved onto the connecting terminal 15 to carry out the second bonding. Therefore, there is a possibility that when the connecting terminal 15 of the wiring board 31 is caused to excessively approach the semiconductor chip 2, the bonding wire 4 will be brought into contact with the semiconductor chip 2.

In contrast, in the present embodiment as shown in FIGS. 31 and 32, one ends of the bonding wires 4 are firstly connected (first bonded) to their corresponding connecting terminals 15 of the wiring board 31 and thereafter the other ends thereof are connected (second bonded) to their corresponding electrodes 2a of the semiconductor chip 2. That is, after the execution of the first bonding to the connecting terminals 15 of the wiring board 31, the capillary 41 is pulled up and moved in the horizontal direction, whereby the second bonding to the electrodes 2a of the semiconductor chip 2 can be carried out. Therefore, when the capillary 41 is moved onto the corresponding electrode 2a of the semiconductor chip 2 to perform the second bonding, the bonding wire 4 is not placed between the capillary 41 and the semiconductor chip 2. Accordingly, even though the connecting terminals 15 of the wiring board 31 are made close to the semiconductor chip 2, the bonding wires 4 can be prevented from contacting the semiconductor chip 2. It is thus possible to enhance the reliability of the semiconductor device. Since the connecting terminals 15 of the wiring board 31 can be made closer to the semiconductor chip 2, the semiconductor device can be reduced in size (reduced in area).

In the wire bonding process, the first bonding makes it possible to reduce each electrode area necessary for connection as compared with the second bonding. In the present embodiment, the area of each connecting terminal 15 can be reduced by firstly connecting (first bonding) one end of each of the bonding wires 4 to the corresponding connecting terminal 15 of the wiring board 31. Hence the openings 19 for exposure of the connecting terminals 15 of the second solder resist section 14b can be reduced. That is, the leading end or tip of the bonding wire 4 held by the capillary 41 is pressed against and connected (first bonded) to the surface of its corresponding connecting terminal 15 of the wiring board 31 while ultrasound is being applied thereto, and thereafter the capillary 41 is pulled up. It is therefore possible to reduce the connecting terminals 15 and reduce the openings 19 for exposure of the connecting terminals 15 of the second solder resist section 14b. For instance, the length (length in the direction in which each connecting terminal 15 extends) $L_1$ of the connecting terminal 15, that is, the length $L_1$ of the opening 19 for exposure of each connecting terminal 15 of the second solder resist section 14b can be set to preferably 120 µm or less ($L_1 \leqq 120 \mu m$), more preferably 100 µm or less ($L_1 \leqq 100 \mu m$). It is thus possible to reduce the semiconductor device in size (area).

As shown in the fragmentary sectional views of FIGS. 31 and 32, stud bumps (bump electrodes and bumps) 42 constituted of gold (Au) are formed over their corresponding electrodes 2a of the semiconductor chip 2. Upon the second bonding, the bonding wires 4 may more preferably be connected to their corresponding stud bumps 42 placed over the electrodes 2a of the semiconductor chip 2. Thus, the strength of connection between the bonding wires 4 and the electrodes 2a of the semiconductor chip 2 can be enhanced. It is also possible to reduce stress applied to the semiconductor chip 2 upon the second bonding to the electrodes 2a of the semiconductor chip 2.

Further, since the distance between each of the bonding wires 4 and the semiconductor chip 2 (the end 2f on the surface side of the semiconductor chip) can be taken long, flowability of the encapsulating resin 5 into the back surface 2c side of the semiconductor chip 2 can be enhanced as compared with the case in which the wire bonding is performed as shown in FIG. 33.

Third Preferred Embodiment

Figure 34:
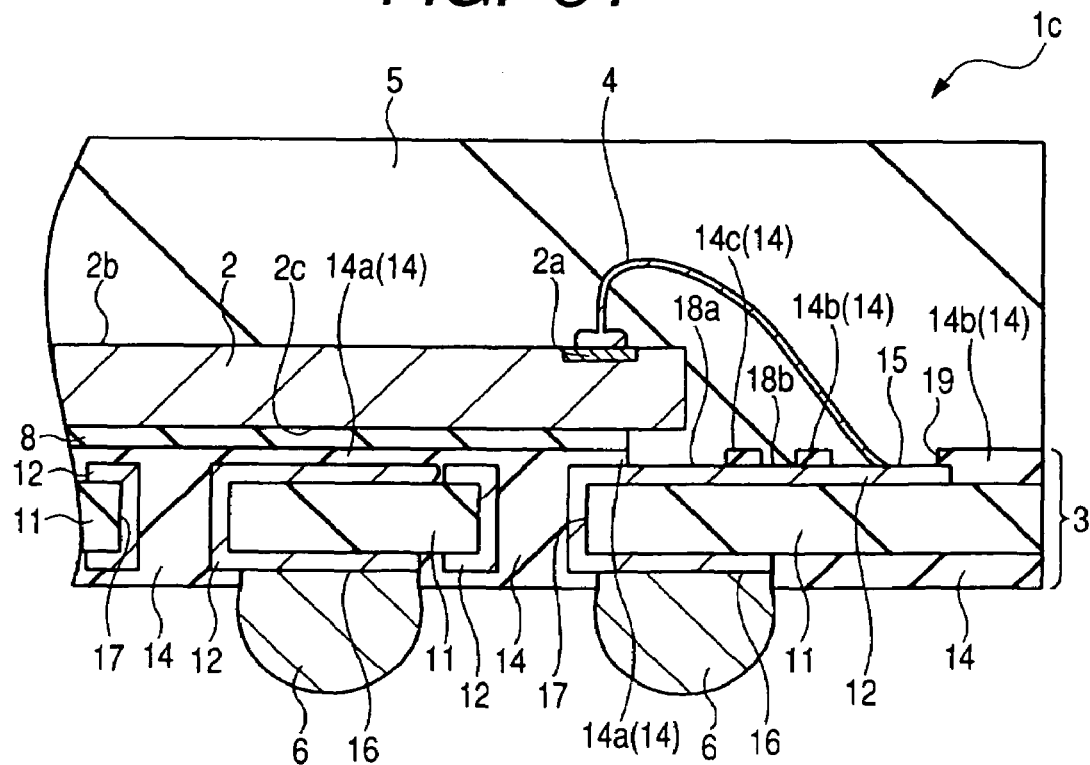
FIG. 34 is a fragmentary sectional view of a semiconductor device showing a third embodiment of the present invention.
Figure 35:
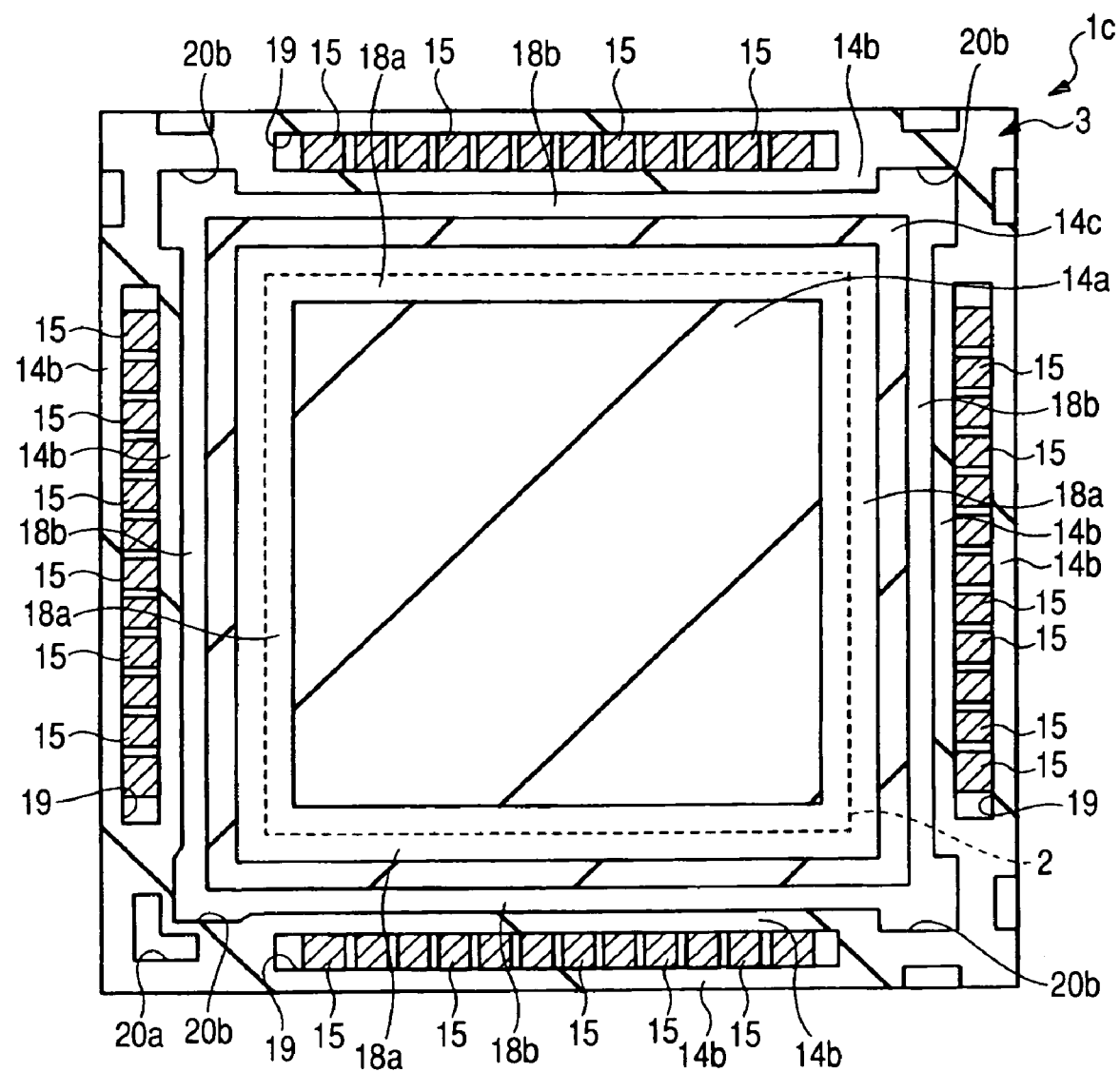
FIG. 35 is a plan perspective view of the semiconductor device shown in FIG. 34.

FIG. 34 is a fragmentary sectional view of a semiconductor device 1c showing a third embodiment of the present invention, and FIG. 35 is a plan perspective view (top view) thereof, respectively. FIG. 34 corresponds to FIG. 4 showing the first embodiment. FIG. 35 corresponds to FIG. 7 showing the first embodiment. A plan perspective view (top view) of the semiconductor device 1c as seen through an encapsulating resin 5, a semiconductor chip 2 and bonding wires 4, i.e., a top view of a wiring board 3 employed in the semiconductor chip 1c is shown in FIG. 35. Incidentally, the outer shape of the semiconductor chip 2 is indicated by a dotted line in FIG. 35. Although FIG. 35 is a plan view, hatching is applied to each of a first solder resist section 14a, a second solder resist section 14b, a third solder resist section 14c, and connecting terminals 15 exposed from aperture parts or openings 19 of the second solder resist section 14b in order to provide easy understanding.

Since the semiconductor device 1c according to the present embodiment is substantially similar to the semiconductor device 1 according to the first embodiment in terms of configurations other than a solder resist layer 14 formed in an upper surface 3a of the wiring board 3, their explanations will be omitted. A description will be made of the solder resist layer 14 formed in the upper surface 3a of the wiring board 3 employed in the semiconductor device 1c.

Although the solder resist layer 14 of the upper surface 3a of the wiring board 3 is constituted of the first solder resist section 14a placed below the semiconductor chip 2, and the second solder resist section 14b placed over the outer peripheral portion of the upper surface 3a of the wiring board 3 in the first embodiment, the solder resist layer 14 of the upper surface 3a of the wiring board 3 includes the first solder resist section 14a placed below the semiconductor chip 2, the second solder resist section 14b located over the outer peripheral portion of the upper surface 3a of the wiring board 3, and a third solder resist section 14c formed between the first solder resist section 14a and the second solder resist section 14b so as to surround the first solder resist section 14a as shown in FIGS. 34 and 35 in the semiconductor device 1c of the present embodiment. An area (dam area) 18a from which a base material layer 11 (and lead-out wires constituted of a conductor layer 12) are exposed, exists between the first solder resist section 14a and the third solder resist section 14c without the solder resist layer 14 being formed therebetween. An area (dam area) 18b from which the base material layer 11 (and lead-out wires constituted of the conductor layer 12) are exposed, exists between the third solder resist section 14c and the second solder resist section 14b without the solder resist layer 14 being formed therebetween. The semiconductor chip 2 is bonded (mounted, connected, fixed and placed) onto the first solder resist section 14a via an adhesive 8 interposed therebetween. The second solder resist section 14b has the aperture parts or openings 19 for exposing the connecting terminals 15. In a manner similar to the first embodiment, the plane dimension (area) of the first solder resist section 14a is smaller than that (area) of the semiconductor chip 2. Therefore, when the semiconductor chip 2 is mounted, the first solder resist section 14a does not extend (exist) below an outer peripheral portion 2d of a back surface 2c of the semiconductor chip 2.

Thus, in the present embodiment, the first solder resist section 14a that bonds the semiconductor chip 2 onto the upper surface 3a via the adhesive 8 interposed therebetween, the third solder resist section 14c provided around (on the outer periphery) of the first solder resist section 14a, and the second solder resist section 14b which is provided around the third solder resist section 14c (on the outer periphery thereof) and exposes the connecting terminals 15 from the openings 19, are formed over the upper surface 3a of the wiring board 3. The areas (dam areas) 18a and 18b from which the base material layer 11 is exposed, exist between the first solder resist section 14a and the third solder resist section 14c and between the third solder resist section 14c and the second solder resist section 14b without the solder resist layer 14 being formed therebetween. Therefore, since the solder resist layer 14 does not exist between the first solder resist section 14a and the third solder resist section 14c when the semiconductor chip 2 is die-bonded onto the wiring board 3, and the area (dam area) 18a from which the base material layer 11 is exposed is provided therebetween, the adhesive 8 constituted of a paste material or the like can be prevented from being spread up to over the third solder resist section 14c beyond the area 18a. Further, even if the adhesive 8 formed of the paste material or the like spreads up to over the third solder resist section 14c beyond the area 18a, the solder resist layer 14 does not exist between the third solder resist section 14c and the second solder resist section 14b, and the area (dam area) 18b from which the base material layer 11 is exposed, is provided therebetween. It is therefore possible to prevent the adhesive 8 formed of the paste material or the like from being spread up to over the second solder resist section 14b beyond the area 18b. It is thus possible to more reliably prevent the adhesive 8 from being spread up to over the connecting terminals 15 and more accurately enhance the reliability of electrical connection between the bonding wires 4 and the connecting terminals 15. Even though a paste adhesive (bonding material) relatively high in flowability is used as the adhesive 8, the adhesive 8 made up of the paste material can be prevented from being spread up to over the connecting terminals 15. Therefore, the paste adhesive relatively lower in cost than the die bond film can be used as the adhesive 8. Hence it is advantageous to a reduction in the manufacturing cost of the semiconductor device.

Fourth Preferred Embodiment

Figure 36:
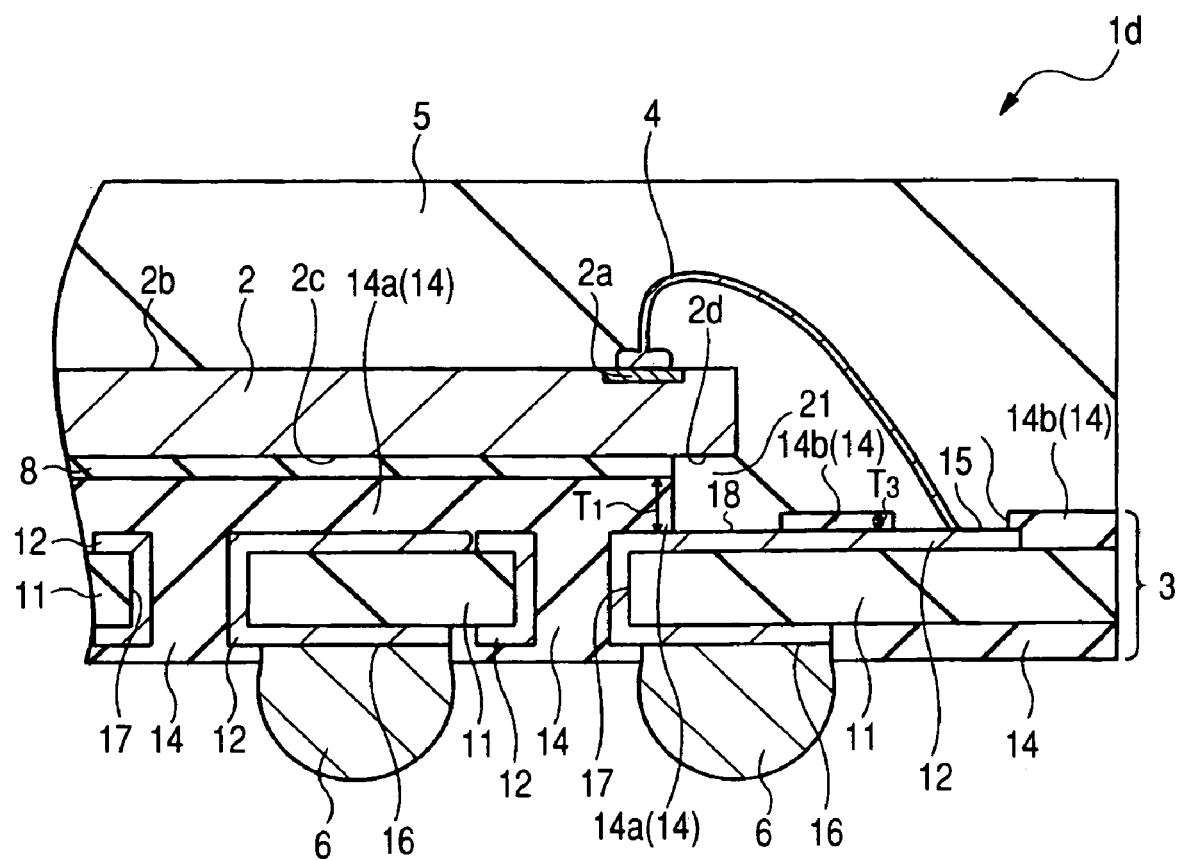
FIG. 36 is a fragmentary sectional view of a semiconductor device showing a fourth embodiment of the present invention.

FIG. 36 is a fragmentary sectional view of a semiconductor device 1d showing a fourth embodiment of the present invention and corresponds to FIG. 4 of the first embodiment.

The thickness of the first solder resist section 14a of the upper surface 3a of the wiring board 3 employed in the semiconductor device 1, and the thickness of the second solder resist section 14b thereof are substantially identical to each other in the first embodiment. In the semiconductor device 1d showing the present embodiment, the thickness $T_1$ of a first solder resist section 14a of an upper surface 3a of a wiring board 3 is thicker than the thickness $T_3$ of a second solder resist section 14b ($T_1 > T_3$). Since other configurations are substantially similar to the first embodiment, their explanations will be omitted here.

In the present embodiment as shown in FIG. 36, the thickness $T_1$ of the first solder resist section 14a which is smaller than a semiconductor chip 2 in plane size or dimension and bonds the semiconductor chip 2 thereon via an adhesive 8 interposed therebetween, is made thicker than the thickness $T_3$ of the second solder resist section 14b provided around (on the outer periphery) of the first solder resist section 14a ($T_1 > T_3$). Such a wiring board 3 can be prepared (manufactured) in the following manner, for example. When a solder resist layer 14 is formed in an upper surface 11a of a base material layer 11, a solder resist layer is applied twice (applied plural times and printed plural times). Thus, the second solder resist section 14b is made relatively thin by being formed by the solder resist corresponding to the first layer, and the first solder resist section 14a is made relatively thick by being formed by (a laminated film of) the solder resist layers corresponding to the first layer and the second layer.

Since the thickness $T_1$ of the first solder resist section 14a is made thicker than the thickness $T_3$ of the second solder resist section 14b ($T_1 > T_3$), the vertical size $H_1$ of space 21 defined between an outer peripheral portion 2d of a back surface 2c of the semiconductor chip 2 and the upper surface 3a of the wiring board 3 can be made larger as compared with the case in which the thickness $T_1$ of the first solder resist section 14a and the thickness $T_3$ of the second solder resist section 14b are identical to each other ($T_1 = T_3$). Therefore, when an encapsulating resin 5 is formed, a filler or the like contained in a material for forming the encapsulating resin 5 is apt to enter through the space 21 below the outer peripheral portion 2d of the back surface 2c of the semiconductor chip 2. Hence the ratio of components of the encapsulating resin 5 with which the space 21 is charged and the ratio of components of the encapsulating resin 5 in other area can be uniformized. Thus, the adhesion (adhesive strength) between the cured encapsulating resin 5 and the semiconductor chip 2 can further be improved, and the reliability of the semiconductor device 1d can further be enhanced.

Fifth Preferred Embodiment

Figure 37:
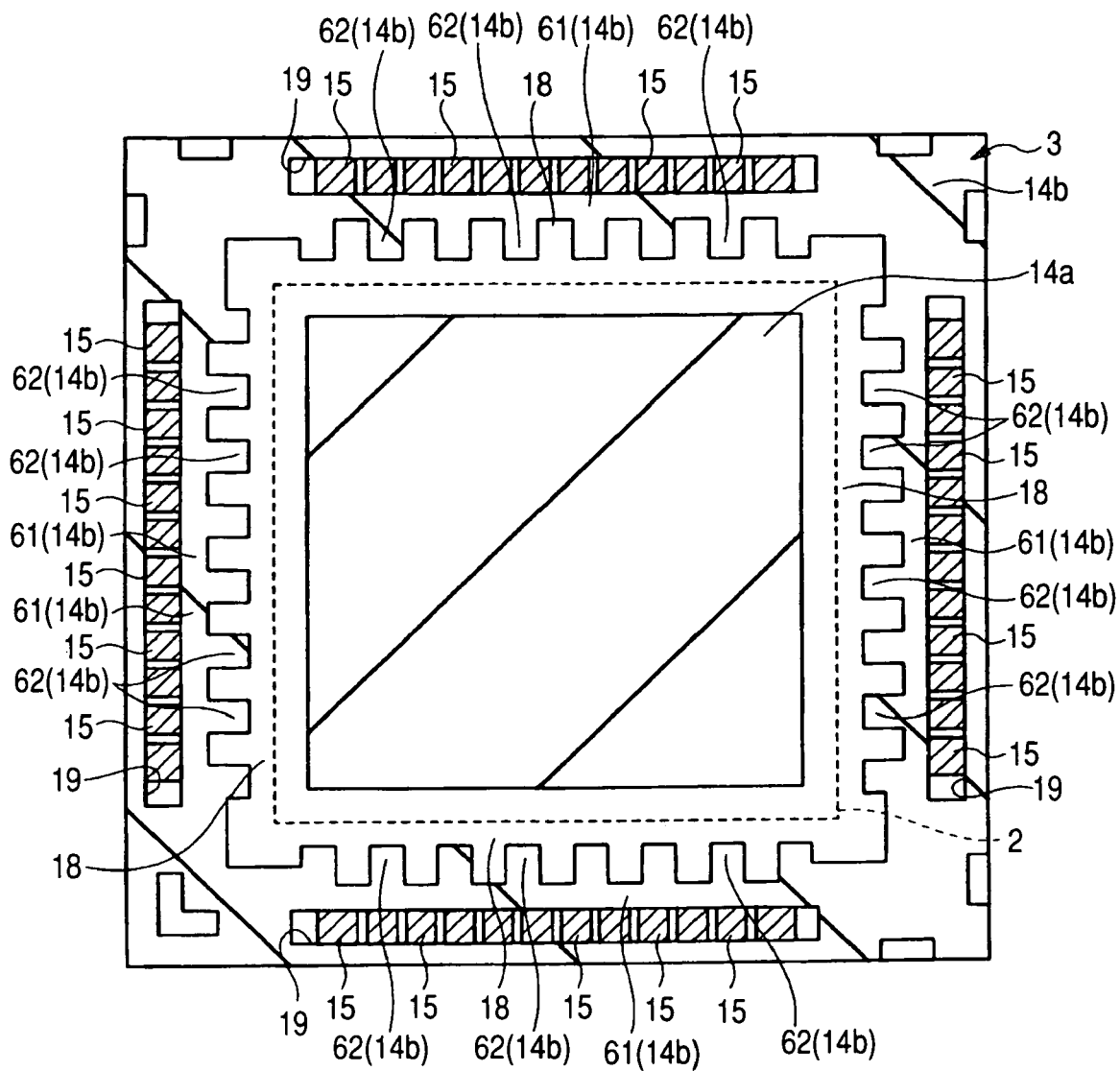
FIG. 37 is a plan perspective view of a semiconductor device illustrating a fifth embodiment of the present invention.
Figure 38:
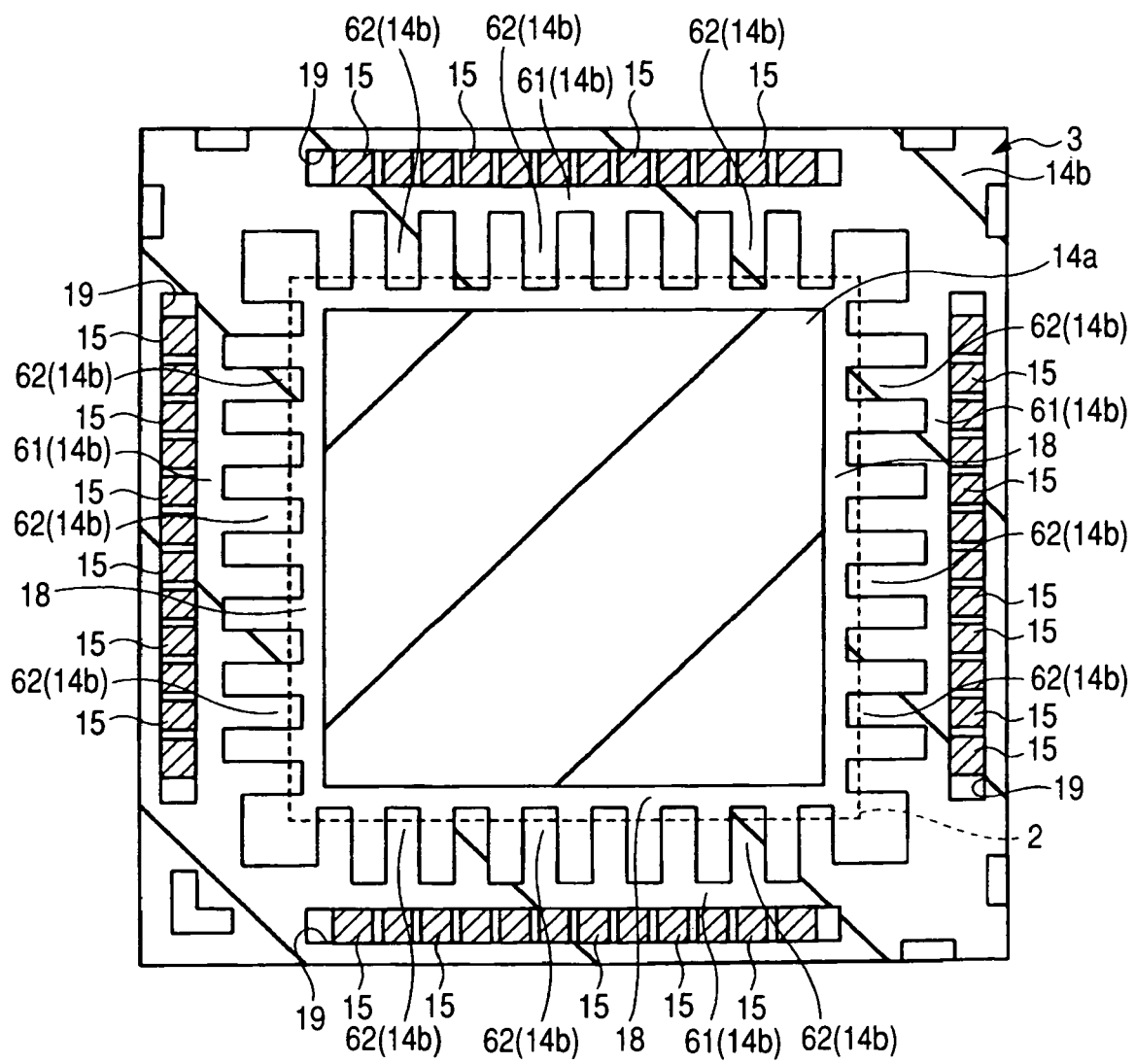
FIG. 38 is a plan perspective view of a semiconductor device showing another embodiment of the present invention.

FIG. 37 is a plan perspective view (top view) of a semiconductor device showing a fifth embodiment of the present invention, and FIG. 38 is a plan perspective view (top view) of another embodiment of the present invention. They correspond to FIG. 7 of the first embodiment. Thus, a plan perspective view (top view) of the semiconductor device as seen through an encapsulating resin 5, a semiconductor chip 2 and bonding wires 4, that is, a top view of a wiring board 3 employed in the semiconductor device of the present embodiment is shown in each of FIGS. 37 and 38. The shapes of the semiconductor chips 2 are respectively indicated by dotted lines in FIGS. 37 and 38. While FIGS. 37 and 38 are plan views, hatching is applied to each of a first solder resist section 14a, a second solder resist section 14b and connecting terminals 15 exposed from aperture parts or openings 19 of the second solder resist section 14b in order to provide easy understanding.

Since the semiconductor device according to the present embodiment is substantially similar to the semiconductor device 1 according to the first embodiment in terms of configurations other than a pattern shape of the second solder resist section 14b formed in an upper surface 3a of a wiring board 3, their explanations will be omitted here. A description will made of the pattern shape of the second solder resist section 14b formed in the upper surface 3a of the wiring board 3 employed in the semiconductor device according to the present embodiment.

In the present embodiment, comb-teeth shaped (concave and convex) patterns are formed at an inner peripheral portion (the four sides of the second solder resist section 14b opposite to the first solder resist section 14a, and the four sides of the second solder resist section 14b opposite to the four sides of the semiconductor chip 2). That is, the second solder resist section 14b has a first portion 61 formed over an outer peripheral portion of the upper surface 3a of the wiring board 3 and having openings 19 for exposing connecting terminals 15, and a plurality of second portions 62 which are connected to the first portion 61 and extend in the direction to approach the first solder resist portion 14a (semiconductor chip 2) from the first portion 61. The thickness of the entire second solder resist section 14b containing the comb-teeth shaped patterns is substantially uniform.

Since the second solder resist section 14b is formed of the first portion 61 and the plurality of second portions 62, and the comb-teeth shaped patterns (solder resist patterns) are provided at the four sides of the inner periphery of the second solder resist section 14b, air is easy to escape from space 21 defined between an outer peripheral portion 2d of a back surface 2c of the semiconductor chip 2 and the upper surface 3a of the wiring board 3 upon forming an encapsulating resin 5 in accordance with a transfer mold process or the like. Hence the flowability of a material for forming the encapsulating resin 5 is improved and the charging property of the encapsulating resin into the space 21 can be further improved. It is therefore possible to further improve the adhesion (adhesive strength) between the semiconductor chip 2 and the encapsulating resin 5 and further enhance the reliability of the semiconductor device.

If the second portions 62 of the second solder resist section 14b do not extend to below the semiconductor chip 2 as shown in FIG. 37, then the space 21 defined between the outer peripheral portion 2d of the back surface 2c of the semiconductor chip 2 and the upper surface 3a of the wiring board 3 can be made wider when the semiconductor chip 2 is die-bonded onto the upper surface 3a of the wiring board 3. It is also possible to make a filler or the like easy to intrude into the space 21 below the outer peripheral portion 2d of the back surface 2c of the semiconductor chip 2 when the encapsulating resin 5 is formed. Thus, the ratio of components of the encapsulating resin 5 with which the space 21 is filled, and the ratio of components of the encapsulating resin 5 in other area can be uniformized. As shown in FIG. 38, the second portions 62 of the second solder resist section 14b can be extended to below the semiconductor chip 2. In this case, connecting terminals 15 can be made closer to the semiconductor chip 2 side. This is advantageous to a reduction in size (area) of the semiconductor device.

Sixth Preferred Embodiment

Figure 39:
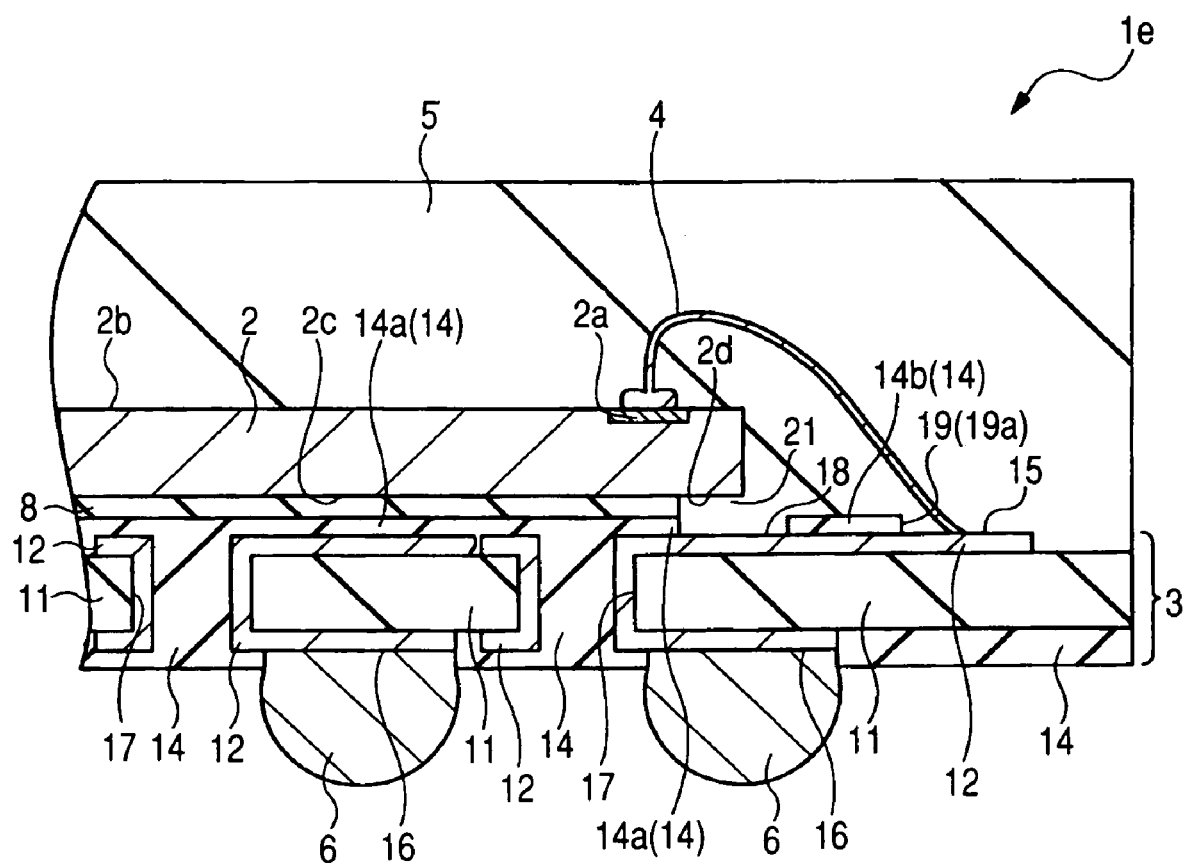
FIG. 39 is a fragmentary sectional view of a semiconductor device illustrating a sixth embodiment of the present invention.
Figure 40:
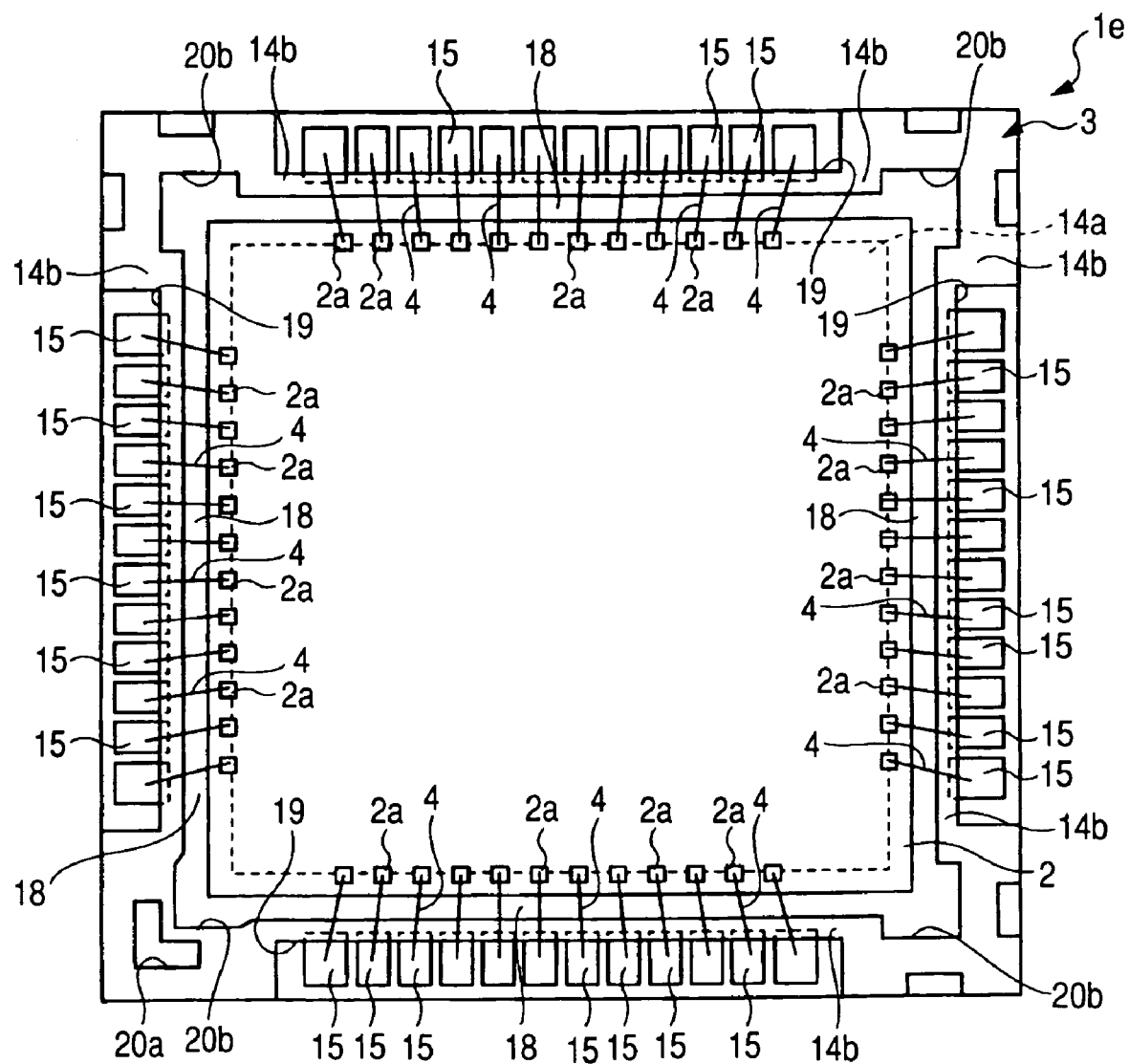
FIG. 40 is a plan perspective view of the semiconductor device shown in FIG. 39.
Figure 41:
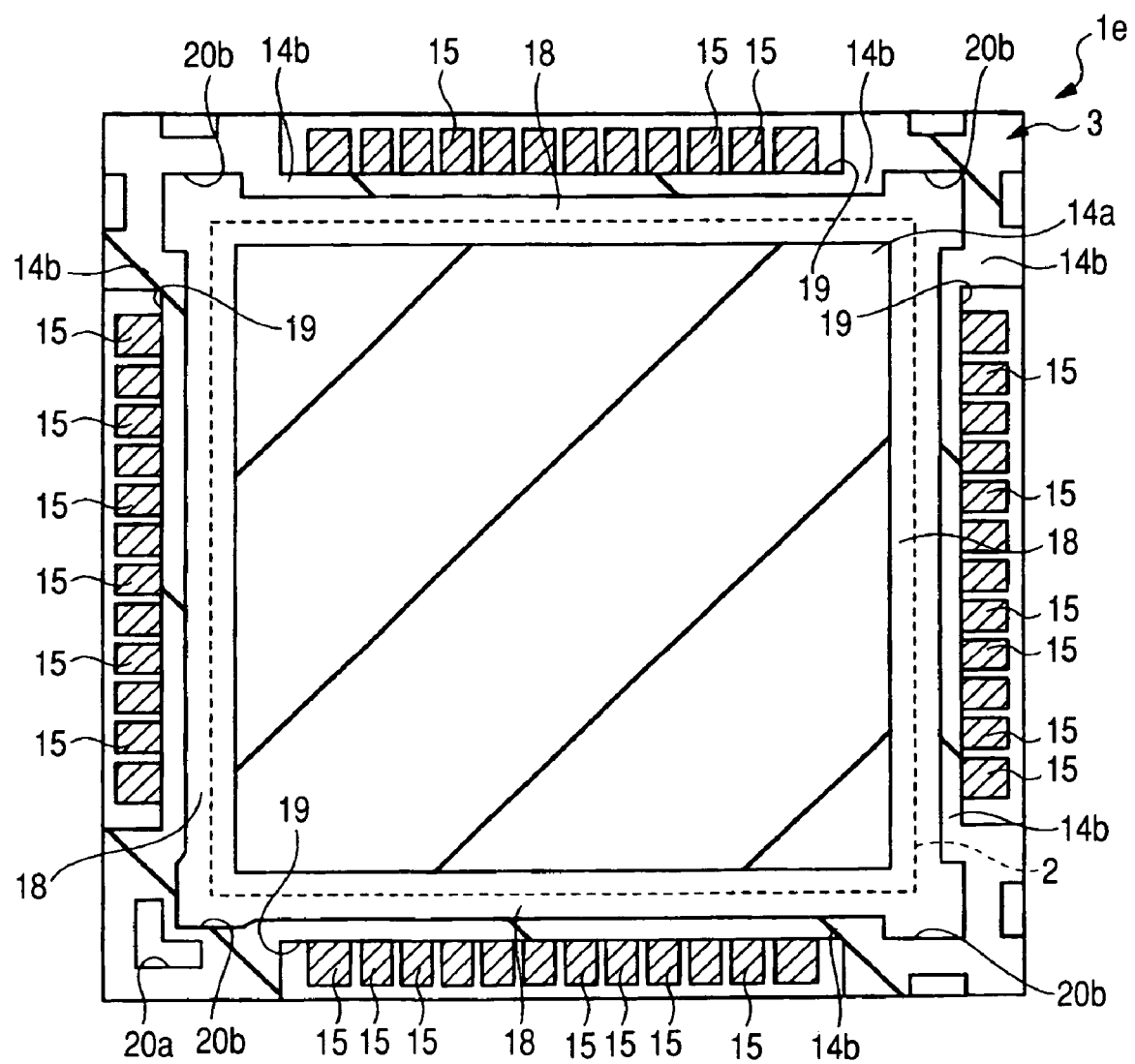
FIG. 41 is a plan perspective view of the semiconductor device shown in FIG. 39.
Figure 42:
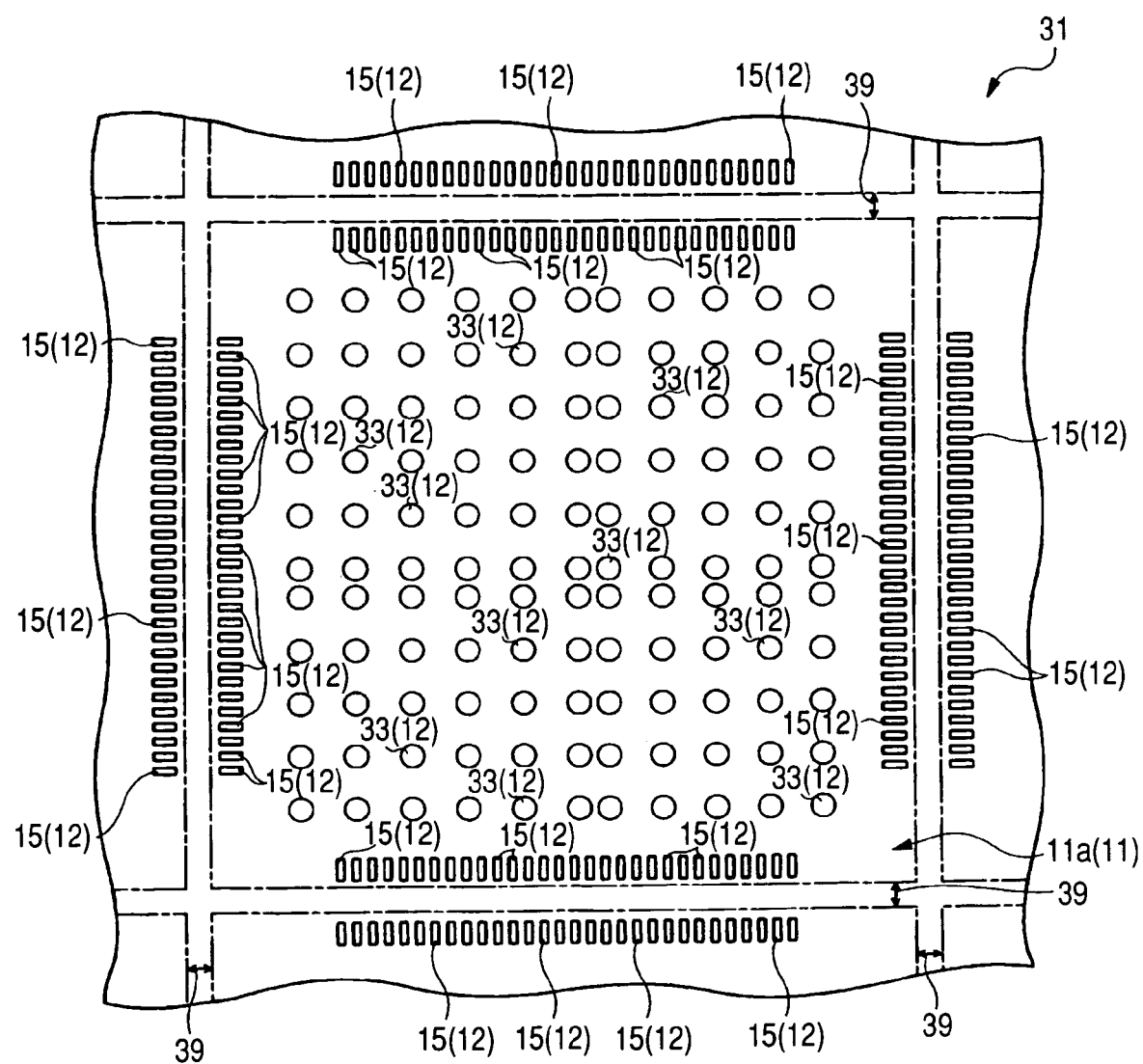
FIG. 42 is a plan view showing a process for manufacturing a wiring board employed in the manufacture of the semiconductor device shown in FIG. 39.
Figure 43:
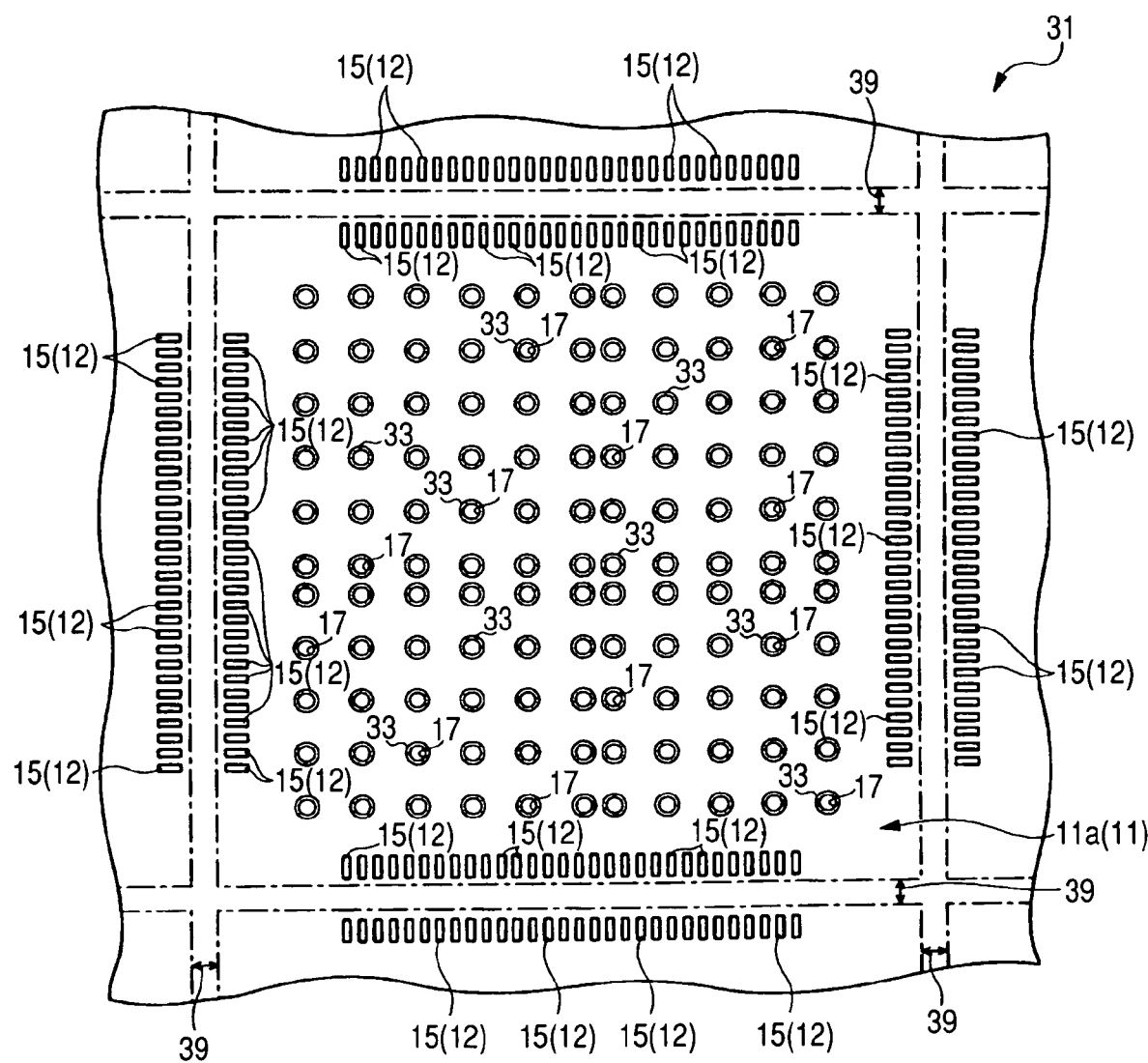
FIG. 43 is a plan view following FIG. 42 in the process of manufacturing the wiring board.
Figure 44:
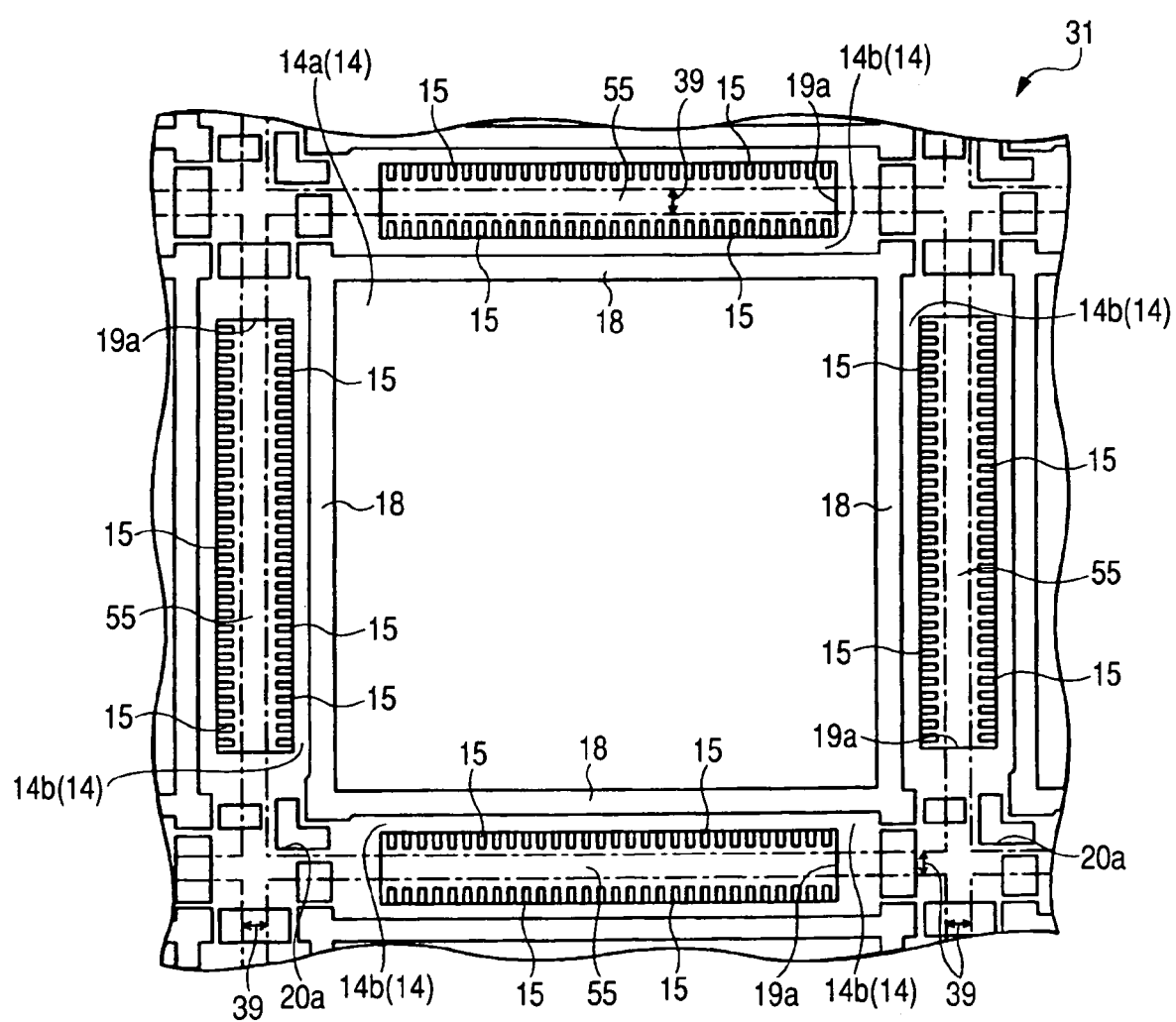
FIG. 44 is a plan view following FIG. 43 in the process of manufacturing the wiring board.

FIG. 39 is a fragmentary sectional view (partly enlarged sectional view) of an end nearby area of a semiconductor device 1e showing a sixth embodiment of the present invention and corresponds to FIG. 4 of the first embodiment. FIG. 40 is a plan perspective view (to view) of the semiconductor device 1e as seen through an encapsulating resin 5 and corresponds to FIG. 6 of the first embodiment. FIG. 41 is a plan perspective view (top view) of the semiconductor device 1e as seen through the encapsulating resin 5, a semiconductor chip 2 and bonding wires 4, i.e., the figure is a top view of a wiring board 3 employed in the semiconductor device 1e and corresponds to FIG. 7 of the first embodiment. FIGS. 42 through 44 are respectively plan views (top views) typically illustrating one example a process for manufacturing a wiring board 31 employed in the manufacture of the semiconductor device 1e of the present embodiment and correspond to FIGS. 21 through 23 of the first embodiment. Incidentally, the outer shape of the semiconductor chip 2 is indicated by a dotted line in FIG. 41. While FIG. 41 is a plan view, hatching is applied to each of a first solder resist section 14a, a second solder resist section 14b and connecting terminals 15 exposed from the second solder resist section 14b in order to provide easy understanding.

Although the conductor layer 12 for the upper surface 3a and lower surface 3b of the wiring board 3 of the semiconductor device 1 is mainly formed using the electrolytic plating method in the first embodiment, a conductor layer 12 for an upper surface 3a of the wiring board 3 of the semiconductor device 1e and a lower surface 3b thereof is formed using an electroless plating method without using the electrolytic plating method in the present embodiment. Although the second solder resist section 14b is formed over the outer peripheral end of the upper surface 3a of the wiring board 3 employed in the semiconductor device 1 in the first embodiment, the second solder resist section 14b (solder resist layer 14) is not formed in an area on the outer periphery side of the upper surface 3a of the wiring board 3 than connecting terminals 15, and a base material layer 11 of the wiring board 3 is firmly adhered (brought into contact with) to the encapsulating resin 5 at the outer peripheral end of the upper surface 3a of the wiring board 3, as shown in FIGS. 39 through 41 in the semiconductor device 1e according to the present embodiment. Other configurations are substantially similar to the first embodiment and their explanations will therefore be omitted.

The process of manufacturing the wiring board 31 employed in the manufacture of the semiconductor device 1e according to the present embodiment will first be explained. The wiring board 31 can be manufactured in the following manner, for example.

An electroless copper-plated layer is formed over an upper surface 11a and a lower surface of an insulative base material layer 11 used as a core material by an electroless plating method. The electroless copper-plated layer is patterned by etching or the like. While the electrolytic copper-plated layer is formed over the electroless copper-plated layer in the first embodiment, the electroless copper-plated layer is formed thick and no electrolytic copper-plated layer is formed in the present embodiment. A conductor layer 12 for the wiring board 31 (wiring board 3) can be formed by means of the electroless copper-plated layer (copper layer). FIG. 42 shows a state in which conductor patterns 33 for through holes and (conductor patterns for) connecting terminals 15 are formed in the upper surface of the base material layer 11 by the electroless copper-plated layer (conductor layer 12). The connecting terminals 15 and the conductor patterns 33 are respectively electrically connected to one another by means of drawing or lead-out wires (not shown) each formed of the electroless copper-plated layer (conductor layer 12) formed in the upper surface 11a of the base material layer 11. Although not shown in the figures, lands 16 are also formed in the lower surface of the base material layer 11 by means of the electroless copper-plated layer (conductor layer 12). Since the electrolytic plating method is not used in the present embodiment, such plated wires (power-feeding wires) 34 as described in the first embodiment are not formed in the upper surface 11a of the base material layer 11.

Next, as shown in FIG. 43, aperture parts or openings (through holes, vias and via or perforated holes) 17 are defined in the base material layer 11. The openings 17 are formed inside the conductor patterns 33 for the through holes.

Next, an electroless copper-plated layer is formed over each of sidewalls of the openings 17 by the electroless plating method. The conductor layer 12 placed over the sidewalls of the openings 17 are formed by the electroless copper-plated layer formed over each of the sidewalls of the openings 17 of the base material layer 11. Then, as shown in FIG. 44, a solder resist layer 14 is formed over the upper surface 11a and lower surface of the base material layer 11 so as to bury the interiors of the openings 17 by using a printing method or the like. Thus, a first solder resist section 14a and a second solder resist section 14b are formed in the upper surface 11a of the base material layer 11. At the upper surface 11a of the base material layer 11, the connecting terminals 15 are exposed from their corresponding openings 19a of the solder resist layer 14. At the lower surface of the base material layer 11, the lands 16 are exposed from their corresponding openings of the solder resist layer 14. The openings 19a for exposing the connecting terminals 15 are formed in the second solder resist section 14b, and dicing areas 39 are formed so as to cross the centers of the openings 19a of the second solder resist section 14b. Next, an electroless nickel plated layer, an electroless palladium plated layer and a gold plated layer are formed over the exposed portions (i.e., connecting terminals 15 and lands 16) of the electroless copper plated layer placed over the upper surface 11a and lower surface of the base material layer 11 in sequence by the electroless plating method. Thereafter, the base material layer 11 is outer-processed (cut) as needed to enable the formation of a wiring board 31.

The semiconductor device 1e according to the present embodiment can be manufactured using the wiring board 31 fabricated in this way. Since, however, its manufacturing process is substantially similar to the first embodiment, its description is omitted here.

In the present embodiment as described above, the conductor layer 12 for the wiring board 3 (wiring board 31) is formed using the electroless plating method without using the electrolytic plating method. That is, the connecting terminals 15 and the lands 16 for the wiring board 3 are formed using the electroless plating method without using the electrolytic plating method. Since the electrolytic plating method is not used for the formation of the conductor layer 12, such plated wires (power-feeding wires) 34 as described in the first embodiment are not formed in the upper surface 3a (upper surface 31a of wring board 31) of the wiring board 3. Since the dicing areas 39 are provided so as to cross the centers of the openings 19a for exposing the connecting terminals 15 as described above in the present embodiment, no second solder resist section 14b is formed in the area on the outer peripheral side of the upper surface 3a of the wiring board 3 than the connecting terminals 15. That is, the second solder resist section 14b (solder resist layer 14) does not extend from the connecting terminals 15 to the end of the wiring board 3 at the upper surface 3a of the wiring board 3. Therefore, the base material layer 11 of the wiring board 3 is exposed at the outer peripheral end of the upper surface 3a of the wiring board 3, and the exposed base material layer 11 can be closely adhered to the encapsulating resin 5. Since no plated wires exist at the outer peripheral end of the upper surface 3a of the wiring board 3, and the base material layer 11 and the encapsulating resin 5 are closely adhered to each other in the present embodiment, a boundary face low in adhesion is not formed at the side surface of the semiconductor device, and hence the reliability of the semiconductor device can be enhanced.

Since the second solder resist section 14b is not formed in the area on the outer peripheral side of the upper surface 3a of the wiring board 3 than the connecting terminals 15, a capillary (corresponding to the capillary 41) can be prevented from contacting the second solder resist section 14b upon execution of wire bonding to the connecting terminals 15. Therefore, the wire bonding to the connecting terminals 15 is stabilized and the reliability of electrical connection between the connecting terminals 15 and the bonding wires 4 can further be enhanced. It is also possible to reduce the area of each connecting terminal 15. This is advantageous to downsizing of the semiconductor device (reduction in its area). Such plural bonding (for example, double bonding and triple bonding) that a plurality of bonding wires 4 are connected to one connecting terminal 15 also becomes easy.

Seventh Preferred Embodiment

Figure 45:
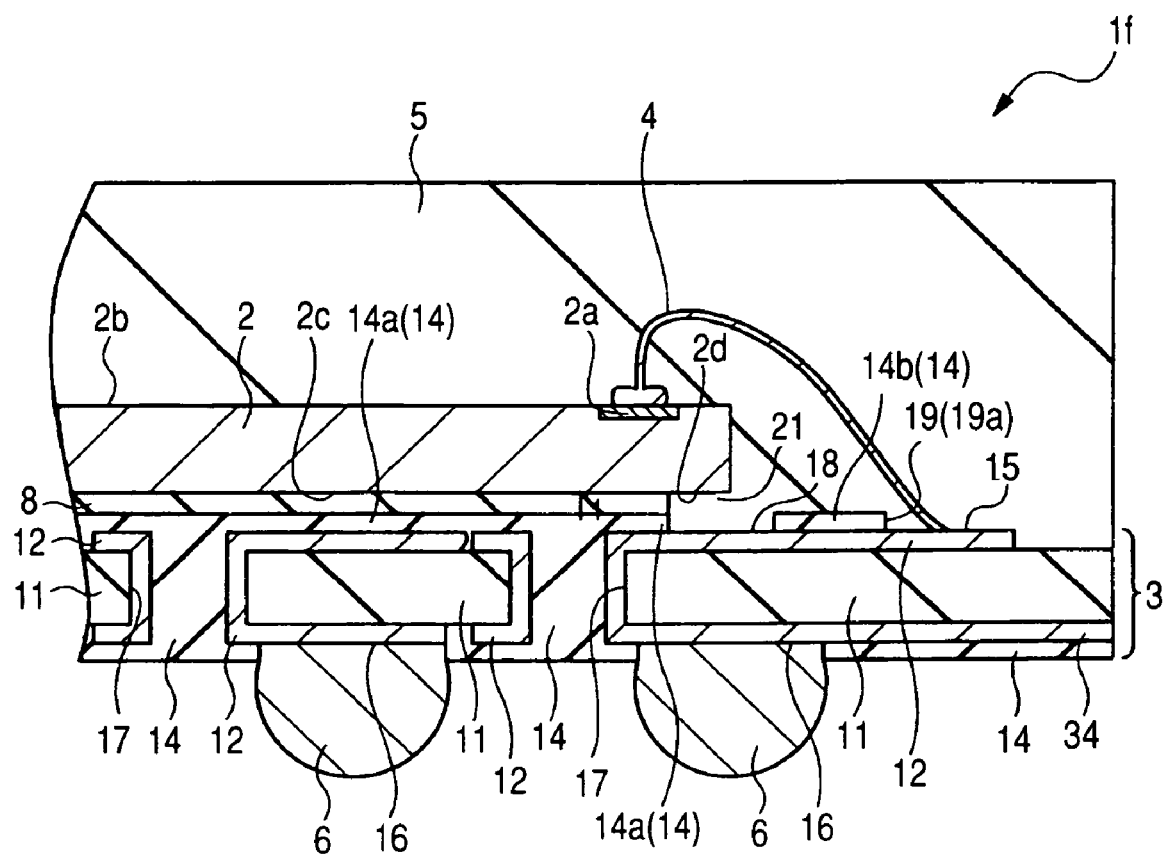
FIG. 45 is a fragmentary sectional view of a semiconductor device showing a seventh embodiment of the present invention.

FIG. 45 is a fragmentary sectional view of a semiconductor device 1f showing a seventh embodiment of the present invention and corresponds to FIG. 39 of the sixth embodiment.

In the semiconductor device 1e according to the sixth embodiment, the conductor layer 12 of each of the upper and lower surfaces 3a and 3b of the wiring board 3 employed in the semiconductor device 1e is formed using the electroless plating method without using the electrolytic plating method. In the semiconductor device 1f according to the present embodiment, however, the conductor layer 12 of each of the upper and lower surfaces 3a and 3b of the wiring board 3 employed in the semiconductor device 1 is mainly formed using the electrolytic plating method (or a combination of the electrolytic plating method and the electroless plating method) in a manner similar to the semiconductor device 1 according to the first embodiment. However, in the semiconductor device 1f according to the present embodiment, unlike the semiconductor device 1 according to the first embodiment, plated wires (power-feeding wires) 34 are formed over a lower surface 11b of a base material layer 11 without being formed over an upper surface 11a of the base material layer 11. The semiconductor device 1f according to the present embodiment is substantially similar to the semiconductor device 1e in other configuration and manufacturing process. Thus, a plan perspective view (top view) of the semiconductor device 1f as seen through the encapsulating resin 5 is similar to FIG. 40 of the sixth embodiment. A plan perspective view (top view) of the semiconductor device 1f as seen through the encapsulating resin 5, a semiconductor chip 2 and bonding wires 4, i.e., a top view of the wiring board 3 employed in the semiconductor device 1f is similar to FIG. 41 of the sixth embodiment. That is, even the semiconductor device 1f according to the present embodiment has a pattern shape of a solder resist layer 14 (first solder resist section 14a and second solder resist section 14b) similar to the semiconductor device 1e according to the sixth embodiment. Therefore, even in the semiconductor device 1f according to the present embodiment in a manner similar to the semiconductor device 1e according to the sixth embodiment, the second solder resist section 14b (solder resist layer 14) is not formed in an area on the outer peripheral side of the upper surface 3a of the wiring board 3 than connecting terminals 15, and the base material layer 11 of the wiring board 3 is closely adhered (brought into contact with) to the encapsulating resin 5 at the outer peripheral end of the upper surface 3a of the wiring board 3.

Even in the present embodiment in a manner similar to the sixth embodiment, the second solder resist section 14b is not formed in the area on the outer peripheral side of the upper surface 3a of the wiring board 3 than the connecting terminals 15. Therefore, when wire bonding to the connecting terminals 15 is performed, a capillary (corresponding to the capillary 41 referred to above) can be prevented from contacting the second solder resist section 14b. It is therefore possible to stabilize the wire bonding to the connecting terminals 15 and further enhance the reliability of electrical connection between the connecting terminals 15 and the bonding wires 4. Further, the area of each connecting terminal 15 can also be reduced. This is advantageous to downsizing of the semiconductor device (reduction in its area). Such plural bonding (for example, double bonding and triple bonding) that a plurality of bonding wires 4 are connected to one connecting terminal 15 also becomes easy.

In the present embodiment, the conductor layer 12 of each of the upper and lower surfaces 3a and 3b of the wiring board 3 is mainly formed by the electrolytic plating method, whereas the plated wires (power-feeding wires) 34 used upon electrolytic plating are formed over the lower surface 11b of the base material layer 11 without being formed over the upper surface 11a of the base material layer 11. Therefore, no plated wires (power-feeding wires) 34 are not formed at the upper surface 3a (upper surface 31a of wiring board 31) of the wiring board 3. Since dicing areas 39 are provided so as to cross the centers of openings 19a for exposing the connecting terminals 15 even in the present embodiment as in the sixth embodiment. Therefore, the second solder resist section 14b is not formed in the area on the outer peripheral side of the upper surface 3a of the wiring board 3 than the connecting terminals 15. That is, the second solder resist section 14b (solder resist layer 14) does not extend from the connecting terminals 15 to the end of the wiring board 3 at the upper surface 3a of the wiring board 3 of the semiconductor device 1f. Therefore, the base material layer 11 of the wiring board 3 is exposed at the outer peripheral end of the upper surface 3a of the wiring board 3, and the exposed base material 11 can be closely adhered to the encapsulating resin 5. Since no plated wires exist and the base material layer 11 and the encapsulating resin 5 are closely adhered to each other at the outer peripheral end of the upper surface 3a of the wiring board 3 in the present embodiment, the boundary face low in adhesion is not formed in the side surface of the semiconductor device, and the reliability of the semiconductor device can be enhanced.

Eighth Preferred Embodiment

Figure 46:
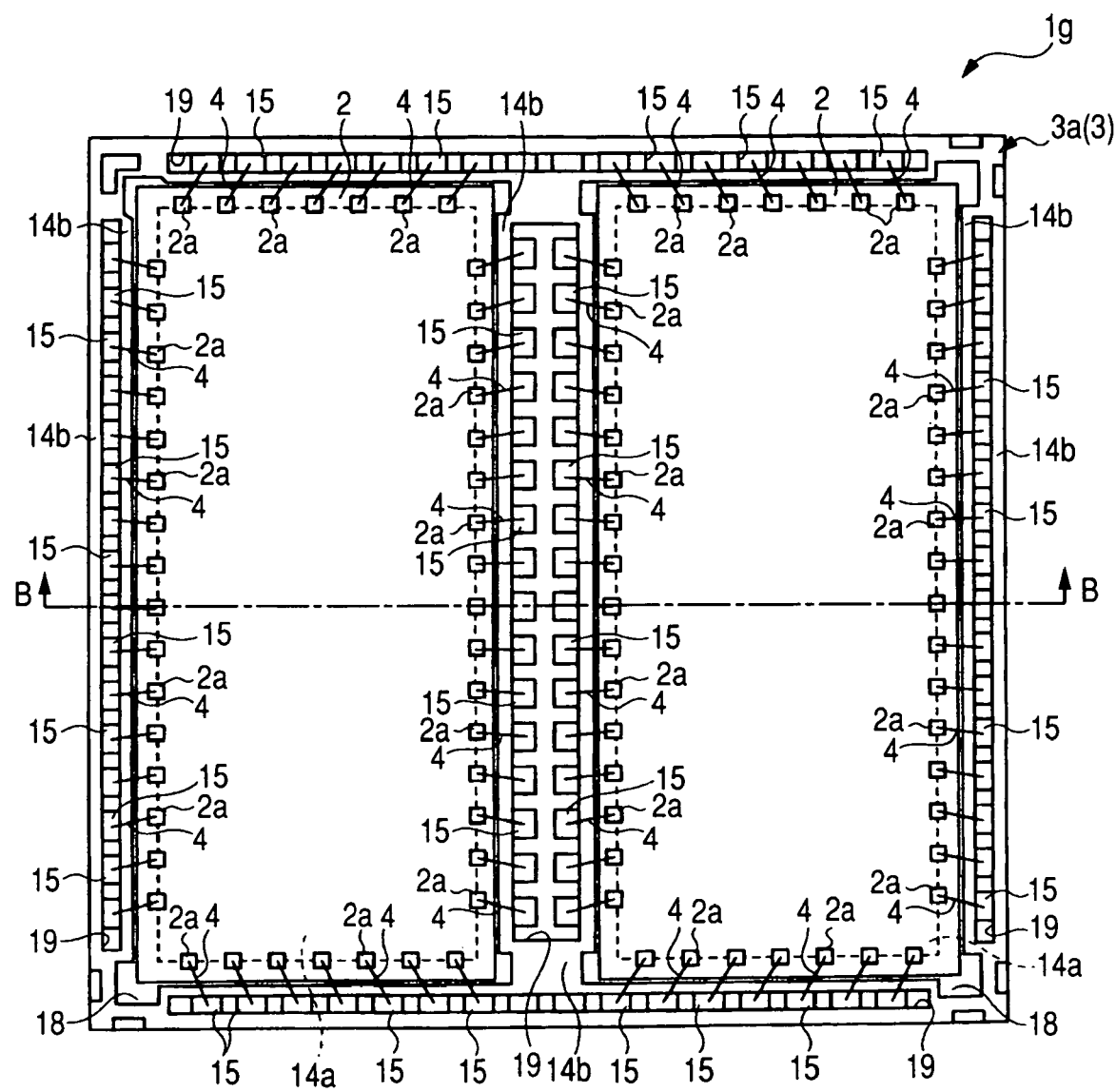
FIG. 46 is a plan perspective view of a semiconductor device illustrating an eighth embodiment of the present invention.
Figure 47:
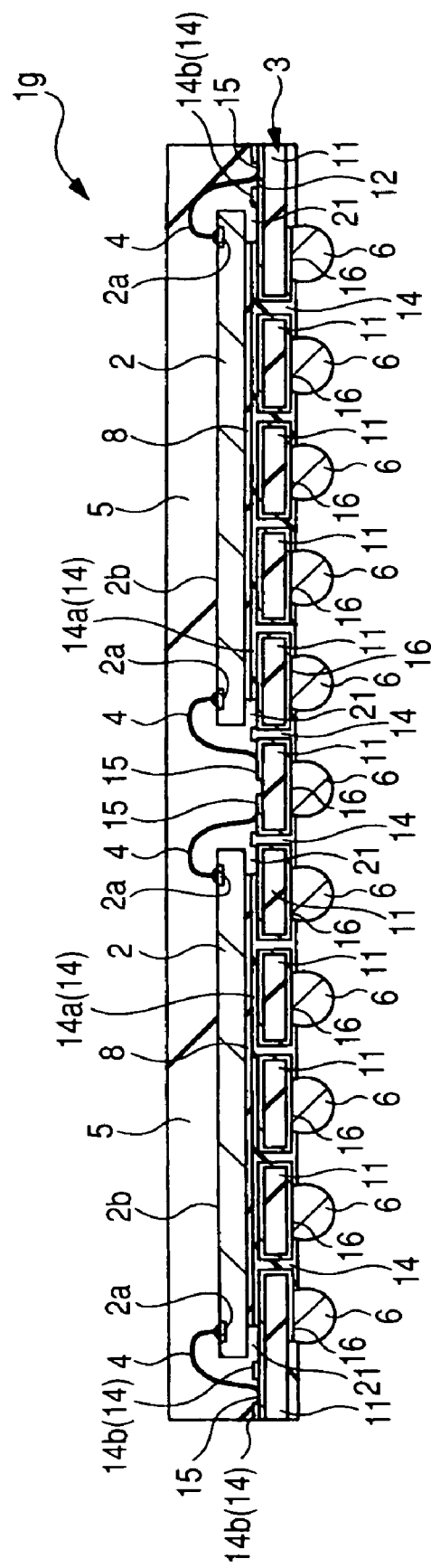
FIG. 47 is a sectional view of the semiconductor device shown in FIG. 46.

FIG. 46 is a plan perspective view (top view) of a semiconductor device 1g showing an eighth embodiment of the present invention, and FIG. 47 is a sectional view thereof. FIG. 46 corresponds to FIG. 6 of the first embodiment. A plan perspective view (top view) of the semiconductor device 1g as seen through an encapsulating resin 5 is shown in FIG. 46. FIG. 47 corresponds to FIG. 3 of the first embodiment. A cross section taken along line B-B of FIG. 46 substantially corresponds to FIG. 47.

Although one semiconductor chip 2 has been mounted over the wiring board 3 in the semiconductor device 1 showing the first embodiment, a plurality of semiconductor chips 2 are mounted over a wiring board 3 in the semiconductor device 1g according to the present embodiment. A description will be made here of an example in which two semiconductor chips 2 are mounted. The present invention is not limited to it. The semiconductor device 1g can be manufactured with the two or more semiconductor chips 2 being mounted over the wiring board 3.

In the present embodiment, first solder resist sections 14a that bond semiconductor chips 2 onto an upper surface 3a of a wiring board 3 via adhesives 8 interposed therebetween, and a second solder resist section 14b which is provided around (on the outer peripheries) of the first solder resist sections 14a and exposes connecting terminals 15 through their corresponding openings 19, are formed at the upper surface 3a of the wiring board 3. On the other hand, the first solder resist sections 14a identical to the same number of the semiconductor chips 2 mounted over the wiring board 3 are formed in the upper surface 3a of the wiring board 3. When two semiconductor chips 2 are mounted over the wiring board 3 as shown in FIGS. 46 and 47, for example, two first solder resist sections 14a are formed in an upper surface 3a of a wiring board 3, and the semiconductor chips 2 are bonded onto their corresponding first solder resist sections 14a via adhesives 8 interposed therebetween. A plurality of electrodes 2a of plural semiconductor chips 2 are electrically connected to a plurality of connecting terminals 15 of a wiring board 3 via a plurality of bonding wires 4, respectively. Other configurations are substantially similar to the first embodiment.

Even in the present embodiment, an area (dam area) 18 from which a base material layer 11 is exposed, exists between each of the first solder resist sections 14a, which bonds the semiconductor chip 2, and the second solder resist section 14b without a solder resist layer 14 being formed therebetween. Therefore, when the semiconductor chip 2 is die-bonded onto the wiring board 3, the adhesive 8 constituted of a paste material or the like can be prevented from being spread up to over the second solder resist section 14b beyond the area 18. It is thus possible to prevent the adhesive 8 from being spread up to the connecting terminals 15 and enhance the reliability of electrical connection between the bonding wires 4 and the connecting terminals 15.

Even in the present embodiment as well, the respective semiconductor chips 2 are bonded onto the first solder resist sections 14a smaller in plane dimension (area) than the semiconductor chip 2 via the adhesives 8 interposed therebetween. Therefore, when the respective semiconductor chips 2 are die-bonded onto the upper surface 3a of the wiring board 3, the first solder resist sections 14a and the adhesives 8 do not extend (exist) below outer peripheral portions 2d of back surfaces 2c of the semiconductor chips 2, and spaces 21 are respectively defined between the outer peripheral portions 2d of the back surfaces 2c of the semiconductor chips 2 and the upper surface 3a of the wiring board 3. Therefore, when an encapsulating resin 5 is formed, a material for forming the encapsulating resin 5 is charged even into the spaces 21 respectively defined between the outer peripheral portions 2d of the back surfaces 2c of the semiconductor chips 2 and the upper surface 3a of the wiring board 3. Further, the cured encapsulating resin 5 covers the front surfaces 2b and side surfaces 2e of the semiconductor chips 2, and the outer peripheral portions 2d of the back surfaces 2c thereof. It is therefore possible to enhance the adhesion (adhesive strength) between each of the semiconductor chips 2 and the encapsulating resin 5 and improve reliability of the semiconductor device 1g. When the encapsulating resin 5 is formed, a filler or the like contained in the material for forming the encapsulating resin 5 is easy to intrude into the space 21 defined below the outer peripheral portion 2d of the back surface 2c of each semiconductor chip 2, and the ratio of components of the encapsulating resin 5 with which each space 21 is charged and the ratio of components of the encapsulating resin 5 in other area are uniformized. It is thus possible to further improve the adhesion (adhesive strength) between the cured encapsulating resin 5 and each of the semiconductor chips 2 and further enhance reliability of the semiconductor device 1g.

Ninth Preferred Embodiment

Figure 48:
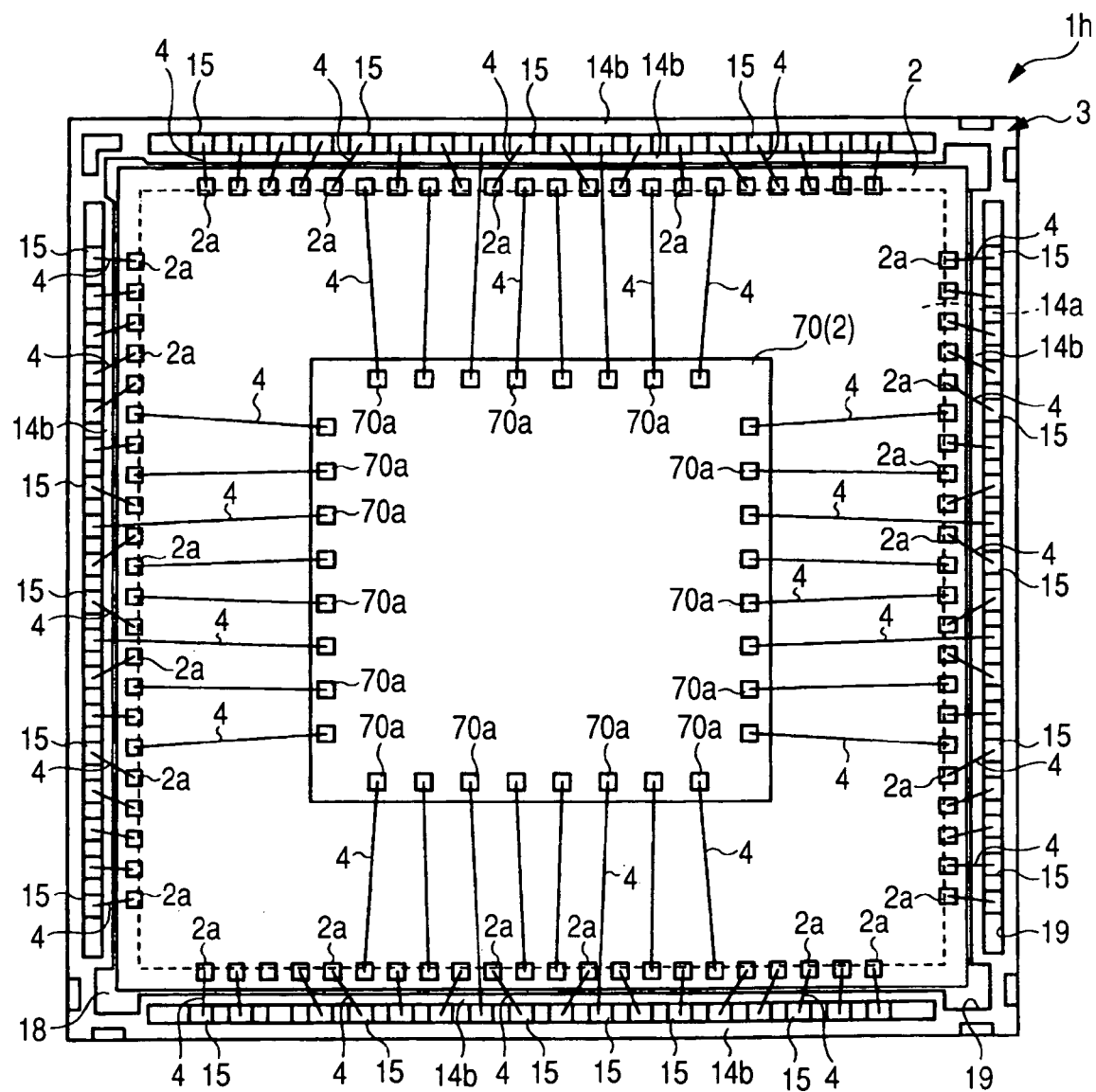
FIG. 48 is a plan perspective view of the semiconductor device showing a ninth embodiment of the present invention.
Figure 49:
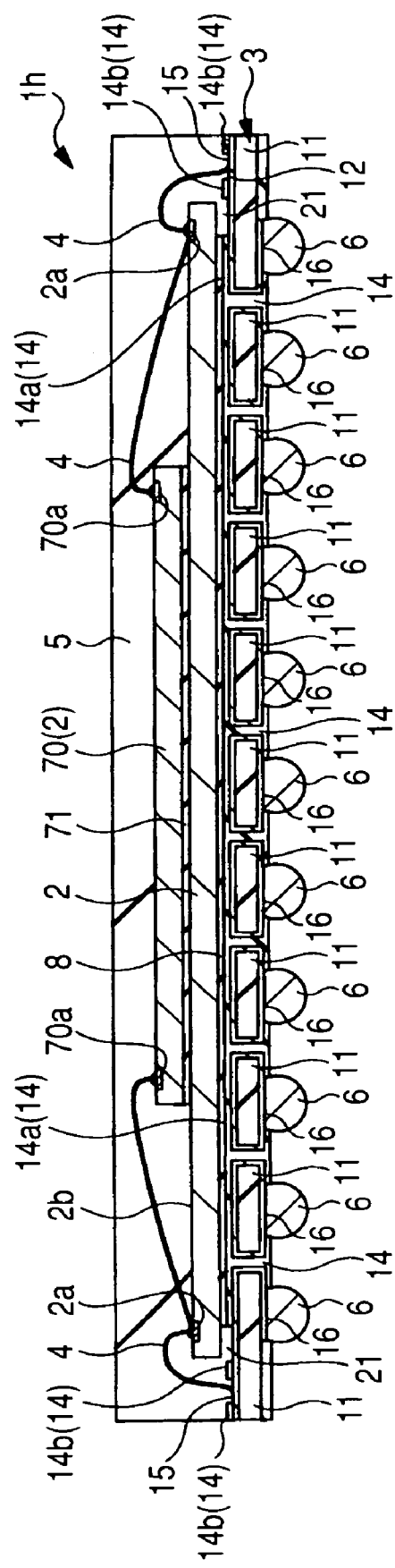
FIG. 49 is a sectional view of the semiconductor device shown in FIG. 48.
Figure 50:
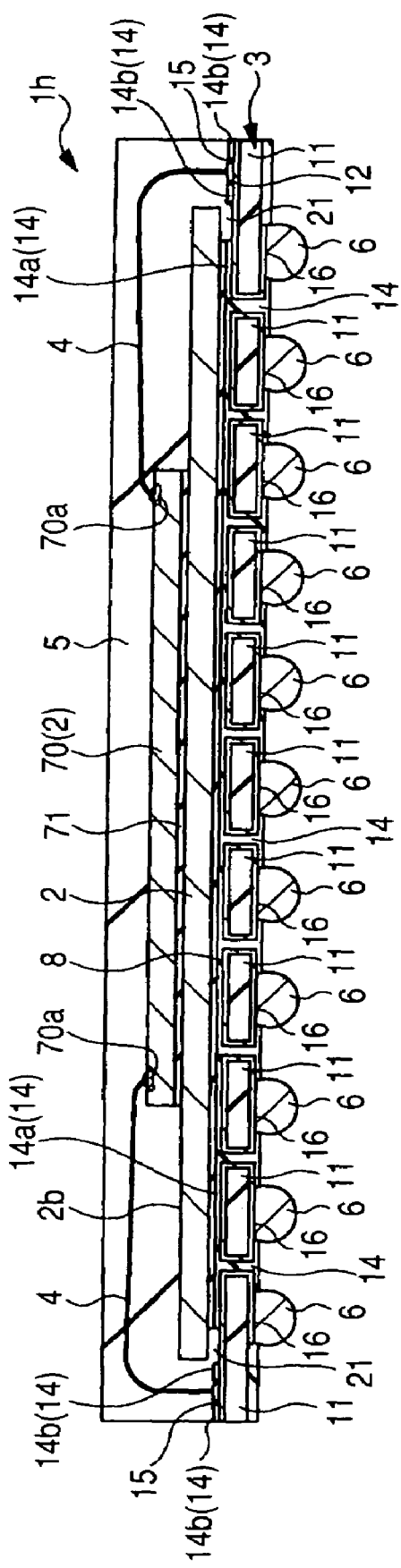
FIG. 50 is another sectional view of the semiconductor device shown in FIG. 48.

FIG. 48 is a plan perspective view (top view) of a semiconductor device 1h showing a ninth embodiment of the present invention, and FIGS. 49 and 50 are sectional views thereof. FIG. 48 corresponds to FIG. 6 of the first embodiment. A plan perspective view (top view) of the semiconductor device 1h as seen through an encapsulating resin 5 is shown in FIG. 48. FIGS. 49 and 50 are different from each other in section.

While one semiconductor chip 2 is mounted over the wiring board 3 in the semiconductor device 1 according to the first embodiment, a plurality of semiconductor chips 2 are laminated and mounted over a wiring board 3 in the semiconductor device 1h according to the present embodiment. A description will be made here of an example in which two semiconductor chips 2 are laminated on each other and mounted over a wiring board 3. The present invention is not limited to it. The semiconductor device 1h can be manufactured by laminating two or more semiconductor chips 2 on one another and mounting them over a wiring board 3.

In the present embodiment, as shown in FIGS. 48 through 50, one semiconductor chip 2 is mounted (bonded) onto a first solder resist section 14a of an upper surface 3a of the wiring board 3 via an adhesive 8 interposed therebetween. Further, the other semiconductor chip 2, i.e., a semiconductor chip 70 is mounted (bonded) onto a front surface 2b of the semiconductor chip 2 via an adhesive 71 interposed therebetween. That is, the semiconductor chip 2 and the semiconductor chip 70 are laminated over the upper surface 3a of the wiring board 3. A plane dimension (area) of the semiconductor chip 70 on the upper layer side is smaller than that (area) of the semiconductor chip 2 on the lower layer side. A plurality of electrodes 2a of the semiconductor chip 2 on the lower layer side are respectively electrically connected to a plurality of connecting terminals 15 of the wiring board 3 via a plurality of bonding wires 4. A plurality of electrodes 70a of the semiconductor chip 70 on the upper layer side are respectively electrically connected to a plurality of electrodes 2a of the semiconductor chip 2 and/or a plurality of connecting terminals 15 of the wiring board 3 via a plurality of bonding wires 4. Other configurations are substantially similar to the first embodiment.

Even in the present embodiment, an area (dam area) 18 from which a base material layer 11 is exposed, exists between the first solder resist section 14a that bonds the semiconductor chip 2 on the lower layer side, and the second solder resist section 14b without a solder resist layer 14 being formed therebetween. Therefore, when the semiconductor chip 2 is die-bonded onto the wiring board 3, the adhesive 8 formed of a paste material or the like can be prevented from being spread up to over the second solder resist section 14b beyond the area 18. Thus, the adhesive 8 can be prevented from being spread up to over the connecting terminals 15, and the reliability of electrical connection between the bonding wires 4 and the connecting terminals 15 can be enhanced.

Even in the present embodiment as well, the semiconductor chip 2 on the lower layer side is bonded onto the first solder resist section 14a smaller in plane dimension (area) than the semiconductor chip 2 via the adhesive 8 interposed therebetween. Therefore, when the semiconductor chip 2 on the lower layer side is die-bonded onto the upper surface 3a of the wiring board 3, the first solder resist section 14a and the adhesive 8 do not extend (exist) below an outer peripheral portion 2d of a back surface 2c of the semiconductor chip 2 on the lower layer side, and space 21 is defined between the outer peripheral portion 2d of the back surface 2c of the semiconductor chip 2 on the lower layer side and the upper surface 3a of the wiring board 3. Therefore, when an encapsulating resin 5 is formed, a material for forming the encapsulating resin 5 is charged even into the space 21 defined between the outer peripheral portion 2d of the back surface 2c of the semiconductor chip 2 on the lower layer side and the upper surface 3a of the wiring board 3. Further, the cured encapsulating resin 5 covers the front surface 2b and side surface 2e of the semiconductor chip 2 on the lower layer side, the outer peripheral portion 2d of the back surface 2c thereof, and the surface and side surface of the semiconductor chip 70 on the upper layer side. It is therefore possible to enhance the adhesion (adhesive strength) between each of the semiconductor chips 2 and 70 and the encapsulating resin 5 and improve reliability of the semiconductor device 1h. When the encapsulating resin 5 is formed, a filler or the like contained in the material for forming the encapsulating resin 5 is easy to intrude into the space 21 defined below the outer peripheral portion 2d of the back surface 2c of the semiconductor chip 2 on the lower layer side, and the ratio of components of the encapsulating resin 5 with which the space 21 is charged and the ratio of components of the encapsulating resin 5 in other area are uniformized. It is thus possible to further improve the adhesion (adhesive strength) between the cured encapsulating resin 5 and each of the semiconductor chips 2 and further enhance reliability of the semiconductor device 1h.

In the present embodiment, miniaturization of a semiconductor device (reduction in its area) is enabled by laminating a plurality of semiconductor chips 2, i.e., laminating another semiconductor chip 70 over the semiconductor chip 2 in the present embodiment.

While the invention made above by the present inventors has been described specifically on the basis of the preferred embodiments, the present invention is not limited to the embodiments referred to above. It is needless to say that various changes can be made thereto without the scope not departing from the gist thereof.

The present invention can be applied to semiconductor devices of various semiconductor package forms in which semiconductor chips are mounted over a wiring board. However, if the present invention is applied to a semiconductor device of a small-sized semiconductor package form like a CSP (Chip Size Package), then a greater effect is brought about.

In each of the first through ninth embodiments, the area 18 (dam area) from which the base material layer 11 is exposed is provided between the first solder resist section 14a and the second solder resist section 14b of the solder resist layer 14 of the upper surface 3a of the wiring board 3 without forming the solder resist layer 14 therebetween. However, a concave portion (trench part) defined in the solder resist layer 14 can also be provided in place of the area 18 from which the base material layer 11 is exposed. That is, it is also possible to allow the solder resist layer 14 to remain (exist) even in the area 18 with being thinner than the first and second solder resist sections 14a and 14b. Such a case is also included in the present invention. Thus, even when the solder resist layer 14 is caused to thinly remain even in the area 18, and the first solder resist section 14a (convex portion) and the second solder resist section 14b (convex portion), and a concave portion (concave portion at a position corresponding to the area 18) are provided in the solder resist layer 14 of the upper surface 3a of the wiring board 3 according to concavity and convexity, advantageous effects substantially similar to the first through ninth embodiments can be obtained. However, when the base material layer 11 is exposed in the area 18 defined between the first solder resist section 14a and the second solder resist section 14b as in each of the first through ninth embodiments, the depth of the concave portion (trench part) formed between the first solder resist section 14a and the second solder resist section 14b can be more deepened as compared with the case in which the solder resist layer 14 is caused to thinly remain in the area 18. It is therefore possible to more reliably prevent the adhesive 8 from being spread up to over the second solder resist section 14b and the connecting terminals 15 when the semiconductor chip 2 is die-bonded onto the wiring board 3. Hence the effect of enhancing the reliability of electrical connection between the bonding wires 4 and the connecting terminals 15 is large.

The present invention can be applied to a semiconductor device wherein at least one semiconductor chip is mounted over a wiring board, and a manufacturing technique thereof.

What is claimed is:

1. A semiconductor device comprising:
(a) a wiring board having a base material layer, a plurality of wirings formed on an upper surface of the base material layer, a plurality of connecting terminals arranged along sides of the base material layer, an insulating film covering the plurality of wirings such that the plurality of connecting terminals are exposed from the insulating film, and a concaved portion formed in the insulating film,
wherein a planar shape of the base material layer is a rectangular shape,
wherein the plurality of connecting terminals are integrated with the plurality of wirings, respectively,
wherein the concaved portion is arranged closer to a center of the semiconductor device than the plurality of connecting terminals in a plane view, and
wherein the insulating film between the concaved portion and the connecting terminals protrudes from the upper surface of the wiring board;
(b) an adhesive supplied on the insulating film,
wherein the adhesive is supplied closer to the center of the semiconductor device than the concaved portion in a plane view, and
wherein the adhesive includes a paste material;
(c) a semiconductor chip mounted over the upper surface of the wiring board via the adhesive such that a peripheral portion of the semiconductor chip overlaps with the concaved portion in a plane view,
wherein the semiconductor chip has a main surface, a back surface opposing to the main surface, and a plurality of bonding pads formed on the main surface,
wherein a part of the back surface of the semiconductor chip contacts with the adhesive, and wherein a part of the concaved portion is arranged outside of the semiconductor chip in a plane view;

(d) a plurality of bonding wires electrically connected the plurality of bonding pads of the semiconductor chip with the plurality of connecting terminals of the wiring board; and (e) an encapsulating resin for sealing the semiconductor chip, the plurality of bonding wires, and the upper surface of the wiring board, wherein a part of the encapsulating resin contacts with the back surface of the semiconductor chip exposed from the adhesive.

2. The semiconductor device according to claim 1, wherein the insulating film covers the plurality of wirings such that both peripheral portions of the base material layer and the plurality of connecting terminals are exposed from the insulating film.

3. The semiconductor device according to claim 1, wherein the concaved portion exposes a part of each of the plurality of wirings and a part of the base material layer.

4. The semiconductor device according to claim 1, wherein an adhesive strength between the semiconductor chip and the encapsulating resin is higher than that between the adhesive and the encapsulating resin.

5. The semiconductor device according to claim 1, wherein the main surface of the semiconductor chip, side surfaces of the semiconductor chip, and the back surface of the semiconductor chip exposed from the adhesive are sealed with the encapsulating resin.

6. The semiconductor device according to claim 1, wherein the concaved portion is formed along the edge of the semiconductor chip.

7. The semiconductor device according to claim 1, wherein a planar shape of the concaved portion is ring-shaped.

8. The semiconductor device according to claim 1, wherein a planar shape of the semiconductor chip is a rectangular shape, wherein the semiconductor chip is mounted over the upper surface of the wiring board such that sides of the semiconductor chip are adjacent to sides of the wiring board respectively;

wherein the concaved portion is formed along the sides of the semiconductor chip; and wherein corner portions of the concaved portion are receded to corner portions of the wiring board respectively.

9. The semiconductor device according to claim 1, wherein a part of each of sides of the concaved portion is receded to each of sides of the wiring board.

* * * * *